United States Patent
Seo et al.

(10) Patent No.: US 10,833,279 B2
(45) Date of Patent: Nov. 10, 2020

(54) LIGHT-EMITTING ELEMENT, LIGHT-EMITTING DEVICE, DISPLAY DEVICE, ELECTRONIC DEVICE, AND LIGHTING DEVICE

(71) Applicant: Semiconductor Energy Laboratory Co., Ltd., Kanagawa-ken (JP)

(72) Inventors: Hiromi Seo, Kanagawa (JP); Tatsuyoshi Takahashi, Kanagawa (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 127 days.

(21) Appl. No.: 16/047,475

(22) Filed: Jul. 27, 2018

(65) Prior Publication Data

US 2018/0351110 A1     Dec. 6, 2018

Related U.S. Application Data

(63) Continuation of application No. 14/260,836, filed on Apr. 24, 2014, now Pat. No. 10,043,982.

(30) Foreign Application Priority Data

Apr. 26, 2013    (JP) .................. 2013-093322

(51) Int. Cl.
   *H01L 51/00*        (2006.01)
   *H01L 51/50*        (2006.01)

(52) U.S. Cl.
   CPC ...... *H01L 51/0067* (2013.01); *H01L 51/0059* (2013.01); *H01L 51/0072* (2013.01);
   (Continued)

(58) Field of Classification Search
   CPC ......... H01L 2251/5384; H01L 51/0059; H01L 51/0067; H01L 51/0072; H01L 51/0074; H01L 51/5012
   See application file for complete search history.

(56) References Cited

U.S. PATENT DOCUMENTS 5,281,489 A     1/1994   Mori et al.
5,639,914 A     6/1997   Tomiyama et al.
(Continued)

FOREIGN PATENT DOCUMENTS

EP     0 532 798 A1    3/1993
EP     0 650 955 A1    5/1995
(Continued)

OTHER PUBLICATIONS

Su et al., Chem. Materials, (2011), vol. 23(2), pp. 274-284. (Year: 2011).*

(Continued)

*Primary Examiner* — Dawn L Garrett
(74) *Attorney, Agent, or Firm* — Husch Blackwell LLP

(57) ABSTRACT

Provided is a light-emitting element with high emission efficiency. The light-emitting element including a first electrode, a second electrode, and a layer containing an organic compound between the first electrode and the second electrode. The layer containing the organic compound includes a light-emitting layer at least containing a first organic compound, a second organic compound, and a fluorescent substance. The first organic compound has an electron-transport property. The second organic compound has a hole-transport property. The second organic compound has a triarylamine skeleton. At least one of three aryl groups in the triarylamine skeleton is a group including a p-biphenyl skeleton.

16 Claims, 24 Drawing Sheets

(52) U.S. Cl.
CPC ...... *H01L 51/0074* (2013.01); *H01L 51/5012* (2013.01); *H01L 2251/5384* (2013.01)

(56) References Cited

U.S. PATENT DOCUMENTS

| | | | |
|---|---|---|---|
| 5,707,747 | A | 1/1998 | Tomiyama et al. |
| 6,517,957 | B1 | 2/2003 | Senoo et al. |
| 7,175,922 | B2 | 2/2007 | Jarikov et al. |
| 7,183,010 | B2 | 2/2007 | Jarikov |
| 7,332,857 | B2 | 2/2008 | Seo et al. |
| 7,572,522 | B2 | 8/2009 | Seo et al. |
| 7,597,967 | B2 | 10/2009 | Kondakova et al. |
| 7,943,925 | B2 | 5/2011 | Yamazaki |
| 7,993,760 | B2 | 8/2011 | Komori et al. |
| 8,034,465 | B2 | 10/2011 | Liao et al. |
| 8,247,086 | B2 | 8/2012 | Inoue et al. |
| 8,274,214 | B2 | 9/2012 | Ikeda et al. |
| 8,367,222 | B2 | 2/2013 | Arakane et al. |
| 8,394,510 | B2 | 3/2013 | Mizuki et al. |
| 8,426,849 | B2 | 4/2013 | Lee et al. |
| 8,476,823 | B2 | 7/2013 | Kuma et al. |
| 8,643,268 | B2 | 2/2014 | Ogiwara et al. |
| 8,729,310 | B2 | 5/2014 | Osaka et al. |
| 8,766,249 | B2 | 7/2014 | Sawada et al. |
| 8,853,680 | B2 | 10/2014 | Yamazaki et al. |
| 8,895,159 | B2 | 11/2014 | Mizuki et al. |
| 8,963,127 | B2 | 2/2015 | Pieh et al. |
| 8,981,355 | B2 | 3/2015 | Seo |
| 8,993,129 | B2 | 3/2015 | Endo et al. |
| 8,994,263 | B2 | 3/2015 | Shitagaki et al. |
| 9,054,317 | B2 | 6/2015 | Monkman et al. |
| 9,159,942 | B2 | 10/2015 | Seo et al. |
| 9,175,213 | B2 | 11/2015 | Seo et al. |
| 9,269,920 | B2 | 2/2016 | Yamazaki et al. |
| 9,356,250 | B2 | 5/2016 | Ohsawa et al. |
| 9,604,928 | B2 | 3/2017 | Shitagaki et al. |
| 9,634,279 | B2 | 4/2017 | Seo et al. |
| 9,876,175 | B2 | 1/2018 | Takaku et al. |
| 10,043,982 | B2* | 8/2018 | Seo ................... H01L 51/0067 |
| 10,367,160 | B2 | 7/2019 | Seo et al. |
| 2003/0175553 | A1 | 9/2003 | Thompson et al. |
| 2004/0076853 | A1* | 4/2004 | Jarikov ............... C09K 11/06 428/690 |
| 2005/0048310 | A1 | 3/2005 | Cocchi et al. |
| 2005/0221116 | A1 | 10/2005 | Cocchi et al. |
| 2006/0134464 | A1 | 6/2006 | Nariyuki |
| 2006/0228577 | A1 | 10/2006 | Nagara |
| 2007/0090756 | A1 | 4/2007 | Okada et al. |
| 2007/0244320 | A1 | 10/2007 | Inoue et al. |
| 2008/0160345 | A1 | 7/2008 | Inoue et al. |
| 2008/0286604 | A1 | 11/2008 | Inoue et al. |
| 2009/0166563 | A1 | 7/2009 | Yokoyama et al. |
| 2010/0052527 | A1 | 3/2010 | Ikeda et al. |
| 2010/0090209 | A1* | 4/2010 | Ikari ................... H01L 27/3211 257/40 |
| 2010/0145044 | A1 | 6/2010 | Inoue et al. |
| 2010/0301318 | A1 | 12/2010 | Kuma et al. |
| 2011/0001146 | A1 | 1/2011 | Yamazaki et al. |
| 2011/0210316 | A1 | 9/2011 | Kadoma et al. |
| 2011/0215714 | A1 | 9/2011 | Seo et al. |
| 2012/0098417 | A1 | 4/2012 | Inoue et al. |
| 2012/0205632 | A1 | 8/2012 | Shitagaki et al. |
| 2012/0205687 | A1 | 8/2012 | Yamazaki et al. |
| 2012/0206035 | A1 | 8/2012 | Shitagaki et al. |
| 2012/0217486 | A1 | 8/2012 | Takemura et al. |
| 2012/0217487 | A1 | 8/2012 | Yamazaki et al. |
| 2012/0242219 | A1 | 9/2012 | Seo et al. |
| 2012/0248421 | A1 | 10/2012 | Yamazaki et al. |
| 2012/0248968 | A1 | 10/2012 | Ogiwara et al. |
| 2012/0256535 | A1 | 10/2012 | Seo et al. |
| 2012/0326141 | A1* | 12/2012 | Pflumm ............... C09B 57/008 257/40 |
| 2013/0048964 | A1 | 2/2013 | Takeda et al. |
| 2013/0056720 | A1 | 3/2013 | Kim et al. |
| 2013/0207088 | A1 | 8/2013 | Seo |
| 2013/0270531 | A1 | 10/2013 | Seo et al. |
| 2013/0277653 | A1 | 10/2013 | Osaka et al. |
| 2013/0277655 | A1 | 10/2013 | Seo et al. |
| 2013/0277656 | A1 | 10/2013 | Seo et al. |
| 2013/0292656 | A1 | 11/2013 | Seo et al. |
| 2013/0306945 | A1 | 11/2013 | Seo |
| 2014/0014930 | A1 | 1/2014 | Hirose et al. |
| 2014/0034925 | A1 | 2/2014 | Osakah et al. |
| 2014/0034926 | A1 | 2/2014 | Matsubarat et al. |
| 2014/0034927 | A1 | 2/2014 | Seo et al. |
| 2014/0034930 | A1 | 2/2014 | Seo et al. |
| 2014/0034931 | A1 | 2/2014 | Inoueh et al. |
| 2014/0034932 | A1 | 2/2014 | Seo et al. |
| 2014/0061604 | A1 | 3/2014 | Seo et al. |
| 2014/0103329 | A1 | 4/2014 | Ogiwara et al. |
| 2014/0217378 | A1 | 8/2014 | Nishimura et al. |
| 2015/0069352 | A1 | 3/2015 | Kim et al. |
| 2019/0173038 | A1 | 6/2019 | Seo et al. |

FOREIGN PATENT DOCUMENTS

| | | |
|---|---|---|
| EP | 1 202 608 A2 | 5/2002 |
| EP | 2 085 382 A1 | 8/2009 |
| EP | 2 363 398 A1 | 9/2011 |
| EP | 2 366 753 A1 | 9/2011 |
| EP | 2 518 045 A1 | 10/2012 |
| EP | 2 568 030 A2 | 3/2013 |
| EP | 2 628 743 A1 | 8/2013 |
| EP | 2 690 681 A1 | 1/2014 |
| JP | 04-212286 A | 8/1992 |
| JP | 07-085972 A | 3/1995 |
| JP | 07-126615 A | 5/1995 |
| JP | 2000-133453 A | 5/2000 |
| JP | 2004-241374 A | 8/2004 |
| JP | 2006-024830 A | 1/2006 |
| JP | 2006-203172 A | 8/2006 |
| JP | 2008-288344 A | 11/2008 |
| JP | 2010-086952 A | 4/2010 |
| JP | 2011-088887 A | 5/2011 |
| JP | 2011-201869 A | 10/2011 |
| JP | 2011-204673 A | 10/2011 |
| JP | 2011-213643 A | 10/2011 |
| JP | 2012-004526 A | 1/2012 |
| JP | 2012-044125 A | 3/2012 |
| JP | 2012-212879 A | 11/2012 |
| JP | 2012-216829 A | 11/2012 |
| JP | 2013-045812 A | 3/2013 |
| JP | 2013-116975 A | 6/2013 |
| JP | 2013-533604 | 8/2013 |
| JP | 2014-022666 A | 2/2014 |
| KR | 2011-0099645 A | 9/2011 |
| TW | 200838850 | 10/2008 |
| TW | 201242125 | 10/2012 |
| TW | 201248956 | 12/2012 |
| WO | WO 2000/070655 A2 | 11/2000 |
| WO | WO 2010/026859 A1 | 3/2010 |
| WO | WO 2010/098458 A1 | 9/2010 |
| WO | WO 2011/139055 A2 | 11/2011 |
| WO | WO 2012/050002 A1 | 4/2012 |
| WO | WO 2012/127990 A1 | 9/2012 |
| WO | WO 2012/132809 A1 | 10/2012 |
| WO | WO 2012/133188 A1 | 10/2012 |
| WO | WO 2012/176818 A1 | 12/2012 |
| WO | WO 2013/081088 A1 | 6/2013 |

OTHER PUBLICATIONS

Baldo, M.A. et al., "Highly Efficient Phosphorescent Emission from Organic Electroluminescent Devices," Nature, vol. 395, Sep. 10, 1998, pp. 151-154.

Baldo, M.A. et al, "Very High-Efficiency Green Organic Light-Emitting Devices Based on Electrophosphorescence," Applied Physics Letters, vol. 75, No. 1, Jul. 5, 1999, pp. 4-6.

Gu, G. et al., "Transparent Organic Light Emitting Devices," Applied Physics Letters, vol. 68, No. 19, May 6, 1996, pp. 2606-2608.

(56) References Cited

OTHER PUBLICATIONS

Choong, V.-E. et al, "Organic Light-Emitting Diodes With a Bipolar Transport Layer," Applied Physics Letters, vol. 75, No. 2, Jul. 12, 1999, pp. 172-174.

Adachi, C. et al., "Nearly 100% Internal Phosphorescence Efficiency in an Organic Light Emitting Device," Journal of Applied Physics, vol. 90, No. 10, Nov. 15, 2001, pp. 5048-5051.

Baldo, M.A. et al., "Prospects for Electrically Pumped Organic Lasers," Physical Review B, vol. 66, Jul. 1, 2002, pp. 035321-1-035321-16.

Markham, J.P.J. et al., "High-Efficiency Green Phosphorescence from Spin-Coated Single-Layer Dendrimer Light-Emitting Diodes," Applied Physics Letters, vol. 80, No. 15, Apr. 15, 2002, pp. 2645-2647.

Itano, K. et al, "Exciplex Formation at the Organic Solid-State Interface: Yellow Emission in Organic Light-Emitting Diodes Using Green-Fluorescent tris(8-quinolinolato)aluminum and Hole-Transporting Molecular Materials with Low Ionization Potentials," Applied Physics Letters, vol. 72, No. 6, Feb. 9, 1998, pp. 636-638.

Kondakova, M.E. et al., "High-Efficiency, Low-Voltage Phosphorescent Organic Light-Emitting Diode Devices with Mixed Host," Journal of Applied Physics, vol. 104, 2008, pp. 094501-1-094501-17.

Seo, J.H., et al., "Efficient Blue-Green Organic Light-Emitting Diodes Based on Heteroleptic tris-Cyclometalated Indium(III) Complexes," Thin Solid Films, vol. 517, No. 5, 2009, pp. 1807-1810.

Fujita, M. et al., Reduction of Operating Voltage in Organic Light-Emitting Diode by Corrugated Photonic Crystal Structure, Applied Physics Letters, vol. 85, No. 23, Dec. 6, 2004, pp. 5769-5771.

Goushi, K. et al., "Efficient organic light-emitting diodes through up-conversion from triplet to singlet excited states of exciplexes," Applied Physics Letters, Jul. 12, 2012, vol. 101, No. 2, pp. 023306-1-023306-4.

Yoshida, K. et al., "High Efficiency Reverse Intersystem Crossing of Exciplex States," The 71st Autumn Meeting of the Japan Society of Applied Physics and Related Societies, 2010, p. 319, The Japan Society of Applied Physics.

Goushi, K. et al., "Delayed Fluorescence Organic Light-Emitting Diodes Based on Exciplex," The 59th Spring Meeting of the Japan Society of Applied Physics and Related Societies Preliminary Drafts, 2012, p. 251.

Nakagawa, T. et al., "Electroluminescence Based on Thermally Activated Delayed Fluorescence Generated by a Spirobifluorene Donor-Acceptor Structure," Chemical Communications, Apr. 17, 2012, vol. 48, No. 77, pp. 9580-9582, RSC Publishing.

Yokoyama, D. et al., "Dual Efficiency Enhancement by Delayed Fluorescence and Dipole Orientation in High-Efficiency Fluorescent Organic Light-Emitting Diodes," Applied Physics Letters, Sep. 22, 2011, vol. 99, No. 12, pp. 1-4, AIP Publishing.

Mehes, G. et al., "Thermally Activated Delayed Fluorescence and its Application for OLED," Mar. 5, 2012.

Yang, C-C. et al., "Excited State Luminescence of Multi-(5-phenyl-1,3,4-oxadiazo-2-yl)benzenes in an Electron-Donating Matrix: Exciplex or Electroplex?," Journal of Physical Chemistry B, Dec. 29, 2009, vol. 114, No. 2, pp. 756-768.

Yersin, H. et al., *Highly Efficient OLEDs with Phosphorescent Materials*, 2008, pp. 1-97,283-309, Wiley-VCH Verlag GmbH & Co.

Tokito, S. et al., "Improvement in Performance by Doping," Organic EL Display, Aug. 20, 2004, pp. 67-99, Ohmsha.

Jeon, W.S. et al., "Ideal Host and Guest System in Phosphorescent OLEDs," Organic Electronics, 2009, vol. 10, pp. 240-246, Elsevier.

Su, S-J et al., "RGB Phosphorescent Organic Light-Emitting Diodes by Using Host Materials with Heterocyclic Cores:Effect of Nitrogen Atom Orientations," Chemistry of Materials, 2011, vol. 23, No. 2, pp. 274-284.

Rausch, A.F. et al., "Matrix Effects on the Triplet State of the OLED Emitter Ir(4,6-dFppy)2(pic)(Flrpic): Investigations by High-Resolution Optical Spectroscopy," Inorganic Chemistry, 2009, vol. 48, No. 5, pp. 1928-1937.

Gong, X. et al., "Phosphorescence from Iridium Complexes Doped into Polymer Blends," Journal of Applied Physics, Feb. 1, 2004, vol. 95, No. 3, pp. 948-953.

Zhao, Q. et al., "Synthesis and Photophysical, Electrochemical, and Electrophosphorescent Properties of a Series of Iridium(III) Complexes Based on Quinoline Derivatives and Different β-Diketonate Ligands," Organometallics, Jun. 14, 2006, vol. 25, No. 15, pp. 3631-3638.

Hino, Y. et al., "Red Phosphorescent Organic Light-Emitting Diodes Using Mixture System of Small-Molecule and Polymer Host," Japanese Journal of Applied Physics, Apr. 21, 2005, vol. 44, No. 4B, pp. 2790-2794.

Tsuboyama, A. et al., "Homoleptic Cyclometalated Iridium Complexes with Highly Efficient Red Phosphorescence and Application to Organic Light-Emitting Diode," Journal of the American Chemical Society, 2003, vol. 125, No. 42, pp. 12971-12979.

Chen, F-C. et al., "Triplet Exciton Confinement in Phosphorescent Polymer Light-Emitting Diodes," Applied Physics Letters, Feb. 17, 2003, vol. 82, No. 7, pp. 1006-1008.

Lee, J.Y. et al., "Stabilizing the Efficiency of Phosphorescent Organic Light-Emitting Diodes," SPIE Newsroom, Apr. 21, 2008, pp. 1-3.

Tokito, S. et al., "Confinement of Triplet Energy on Phosphorescent Molecules for Highly-Efficient Organic Blue-Light-Emitting Devices," Applied Physics Letters, Jul. 21, 2003, vol. 83, No. 3, pp. 569-571.

Endo, A. et al., "Efficient Up-Conversion of Triplet Excitons Into a Singlet State and Its Application for Organic Light Emitting Diodes," Applied Physics Letters, Feb. 24, 2011, vol. 98, No. 8, pp. 083302-1-083302-3.

Park, Y-S. et al., "Efficient Triplet Harvesting by Fluorescent Molecules Through Exciplexes for High Efficiency Organic Light-Emitting Diodes," Applied Physics Letters, Apr. 18, 2013, vol. 102, No. 15, pp. 153306-1-153306-5.

Taiwanese Office Action re Application No. TW 103115047, dated Aug. 28, 2017.

Taiwanese Office Action re Application No. TW 107117260, dated Sep. 5, 2018.

\* cited by examiner

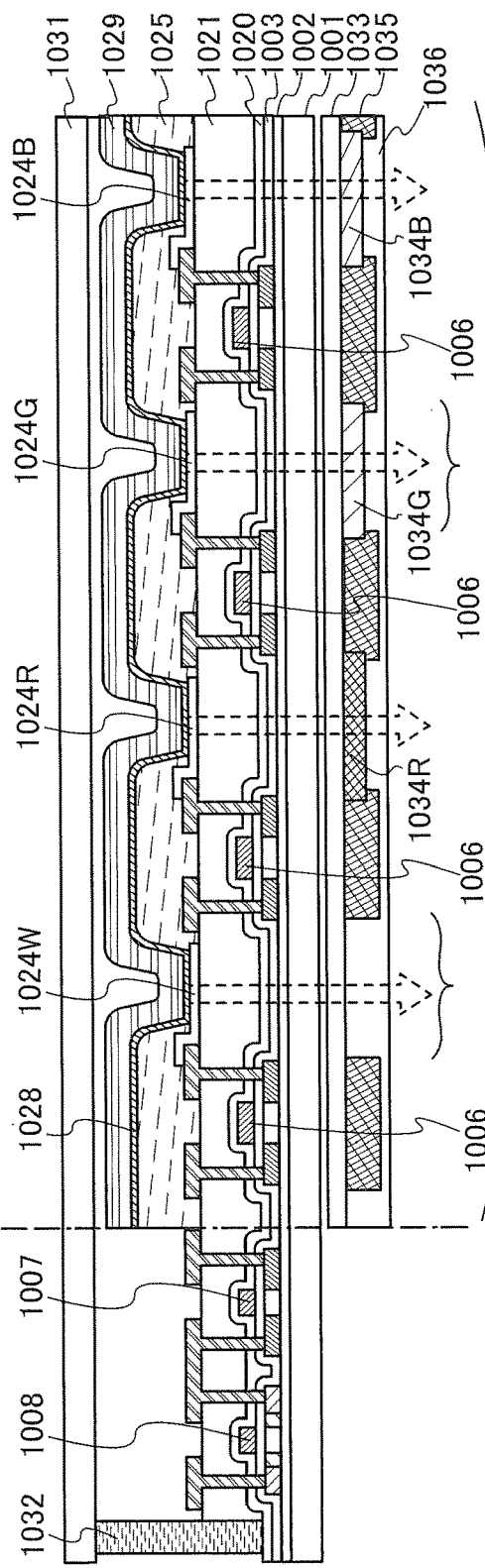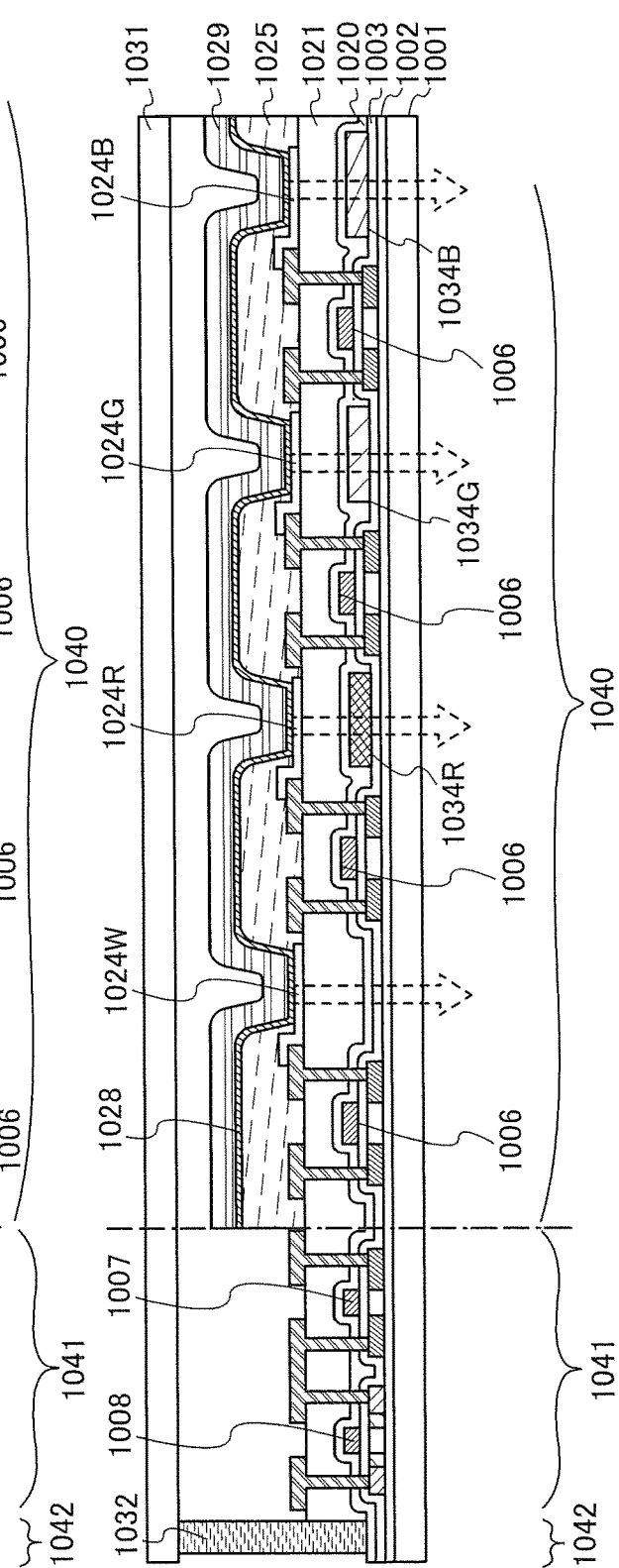

FIG. 7A
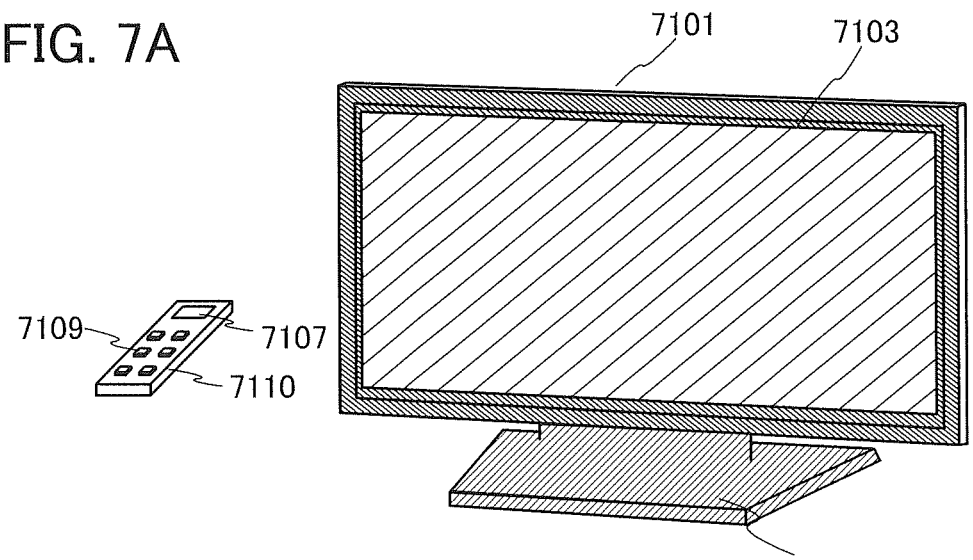
FIG. 7B1
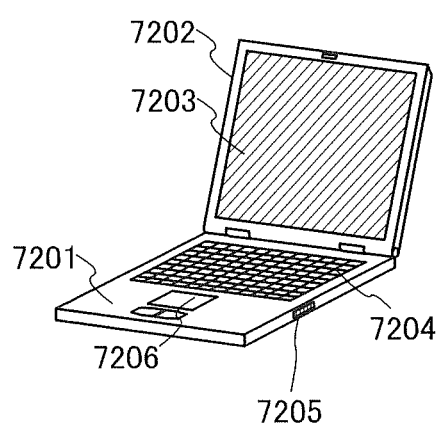
FIG. 7B2
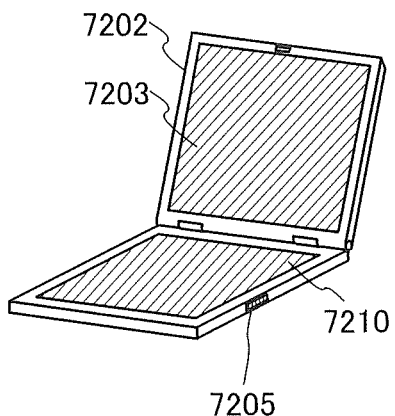
FIG. 7C
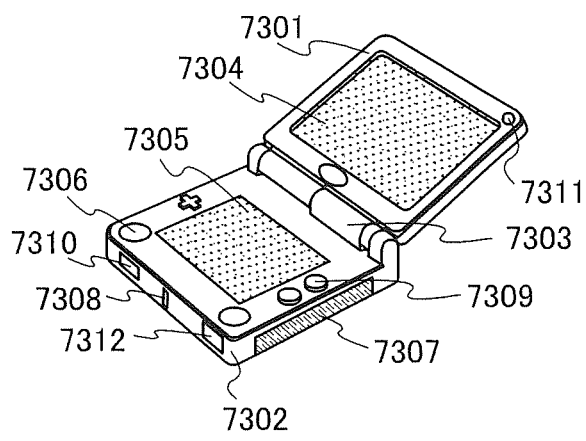
FIG. 7D
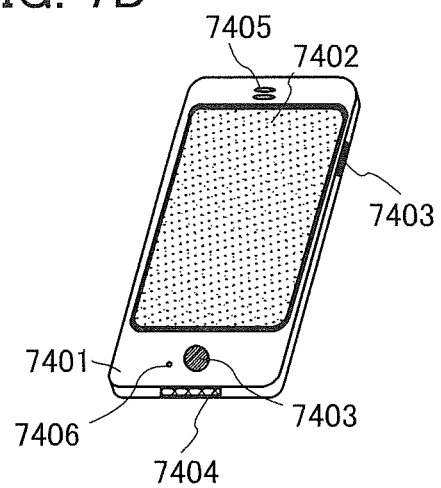

LIGHT-EMITTING ELEMENT, LIGHT-EMITTING DEVICE, DISPLAY DEVICE, ELECTRONIC DEVICE, AND LIGHTING DEVICE

This application is a continuation of copending U.S. application Ser. No. 14/260,836, filed on Apr. 24, 2014 which is incorporated herein by reference.

BACKGROUND OF THE INVENTION

1. Field of the Invention

The present invention relates to a light-emitting element, a display device, a light-emitting device, an electronic device, and a lighting device each of which includes an organic compound as a light-emitting substance.

2. Description of the Related Art

Advances are being made in application of a current excitation type light-emitting element in which an organic compound is used as a light-emitting substance, i.e., an organic EL element, to light sources, lighting, displays, and the like.

As is known, in an organic EL element, the generation ratio of excitons in a singlet excited state to excitons in a triplet excited state is 1:3. Thus, the limit value of internal quantum efficiency of fluorescence, which is emitted by conversion of singlet excitation energy into light emission, is 25%, while phosphorescence, which is emitted by conversion of triplet excitation energy into light emission, can have an internal quantum efficiency of 100% when energy transfer via intersystem crossing from a singlet excited level is taken into account. In view of the above, an organic EL element (a phosphorescent light-emitting element) in which a phosphorescent material is used as a light-emitting substance is selected in many cases so that light is emitted efficiently.

Most of substances capable of efficiently converting triplet excitation energy into light emission are organometallic complexes, and in most cases, central metals of the organometallic complexes are rare metals whose production is small. The price of rare metals is high and greatly fluctuates, and supply thereof might be unstable depending on the global situation. For this reason, there are some concerns about cost and supply regarding phosphorescent light-emitting elements.

To cause conversion of triplet excitation energy into light emission, delayed fluorescence can also be utilized. In this case, not phosphorescence but fluorescence is obtained because reverse intersystem crossing from a triplet excited level of the triplet excitation energy to a singlet excited level of the triplet excitation energy is utilized and the light emission occurs from a singlet excited level. This is readily caused when an energy difference between a singlet excited level and a triplet excited level is small. Emission efficiency exceeding the theoretical limit of emission efficiency of fluorescence has been actually reported.

It has been also reported that a high-efficiency light-emitting element was obtained in such a manner that an exciplex (excited complex) was formed by two kinds of substances to produce a state where an energy difference between a singlet excited level and a triplet excited level is small, and delayed fluorescence of the exciplex was utilized.

REFERENCE

Non-Patent Document

[Non-Patent Document 1] K. Goushi et al., *Applied Physics Letters*, 101, pp. 023306/1-023306/4 (2012).

SUMMARY OF THE INVENTION

However, efficient light emission cannot be obtained from such a light-emitting element utilizing an exciplex in many cases. Actually, in the history of development of organic EL elements, an exciplex has been considered to decrease efficiency and organic EL elements have been generally designed such that an exciplex is not formed.

In addition, the light-emitting element using an exciplex as emission center greatly decreases its luminance relative to driving time; in other words, the light-emitting element using an exciplex has a short lifetime in many cases.

In view of the above, an object of one embodiment of the present invention is to provide a light-emitting element which has high emission efficiency. Another object of one embodiment of the present invention is to provide a light-emitting element which has high emission efficiency without using a rare metal as a light-emitting material. Another object of one embodiment of the present invention is to provide a light-emitting element which utilizes an exciplex and has high emission efficiency. Another object of one embodiment of the present invention is to provide a light-emitting element which emits light from a fluorescent substance and has high emission efficiency. Another object of one embodiment of the present invention is to provide a fluorescent light-emitting element which emits light by making use of energy transfer from an exciplex and has high emission efficiency. Another object of one embodiment of the present invention is to provide a light-emitting element which achieves any of the above objects and has a long lifetime.

Another object of one embodiment of the present invention is to provide a light-emitting device, a display device, an electronic device, and a lighting device each of which has high emission efficiency by using any of the above light-emitting elements. Another object of one embodiment of the present invention is to provide a light-emitting device, a display device, an electronic device, and a lighting device each of which has a long lifetime and solves any of the above objects.

Note that the description of these objects do not disturb the existence of other objects. All the objects do not necessarily need to be achieved simultaneously in one embodiment of the present invention. Other objects may be apparent from the description of the specification, the drawings, the claims, and the like.

In order to solve the above-mentioned objects, an embodiment of the present invention is a light-emitting element including a first electrode, a second electrode, and a layer containing an organic compound between the first electrode and the second electrode. The layer containing the organic compound includes at least a light-emitting layer containing a first organic compound, a second organic compound, and a fluorescent substance. The first organic compound has an electron-transport property. The second organic compound has a hole-transport property. The second organic compound has a triarylamine skeleton. At least one of three aryl groups in the triarylamine skeleton is a group including a p-biphenyl skeleton.

Another embodiment of the present invention is the light-emitting element with the above structure, in which at least two of the three aryl groups in the triarylamine skeleton are each a group including a p-biphenyl skeleton.

Another embodiment of the present invention is a light-emitting element including a first electrode, a second electrode, and a layer containing an organic compound between the first electrode and the second electrode. The layer containing the organic compound includes a light-emitting layer at least containing a first organic compound, a second organic compound, and a fluorescent substance. The first organic compound has an electron-transport property. The second organic compound has a hole-transport property. The second organic compound has a triarylamine skeleton. At least one of three aryl groups in the triarylamine skeleton is a group including a fluorene skeleton.

Another embodiment of the present invention is a light-emitting element including a first electrode, a second electrode, and a layer containing an organic compound between the first electrode and the second electrode. The layer containing the organic compound includes a light-emitting layer at least containing a first organic compound, a second organic compound, and a fluorescent substance. The first organic compound has an electron-transport property. The second organic compound has a hole-transport property. The second organic compound has a triarylamine skeleton. At least one of three aryl groups in the triarylamine skeleton is a substituted or unsubstituted p-biphenyl group.

Another embodiment of the present invention is the light-emitting element with the above structure, in which at least two of the three aryl groups in the triarylamine skeleton are each a substituted or unsubstituted p-biphenyl group.

Another embodiment of the present invention is a light-emitting element including a first electrode, a second electrode, and a layer containing an organic compound between the first electrode and the second electrode. The layer containing the organic compound includes a light-emitting layer at least containing a first organic compound, a second organic compound, and a fluorescent substance. The first organic compound has an electron-transport property. The second organic compound has a hole-transport property. The second organic compound has a triarylamine skeleton. At least one of three aryl groups in the triarylamine skeleton is a substituted or unsubstituted fluoren-2-yl group.

Another embodiment of the present invention is any of the light-emitting elements with the above structures, in which at least one of the other aryl groups in the triarylamine skeleton in the second organic compound is a group including a p-biphenyl skeleton.

Another embodiment of the present invention is the light-emitting element with the above structure, in which the group including the p-biphenyl skeleton is a substituted or unsubstituted p-biphenyl group, a substituted or unsubstituted fluoren-2-yl group, a substituted or unsubstituted spirofluorenyl group, or a substituted or unsubstituted 4-(9-phenyl-9H-carbazol-3-yl)phenyl group.

Another embodiment of the present invention is any of the light-emitting elements with the above structures, in which at least one of the three aryl groups in the triarylamine skeleton in the second organic compound is a substituted or unsubstituted 4-(9-phenyl-9H-carbazol-3-yl)phenyl group.

Another embodiment of the present invention is any of the light-emitting elements with the above structures, in which the second organic compound does not have a naphthalene skeleton.

Another embodiment of the present invention is any of the light-emitting elements with the above structures, in which the first organic compound and the second organic compound form an exciplex.

Another embodiment of the present invention is any of the light-emitting elements with the above structures, in which triplet excitation energy of each of the first organic compound and the second organic compound is higher than energy corresponding to an emission wavelength of the exciplex formed by the first organic compound and the second organic compound.

Another embodiment of the present invention is any of the light-emitting elements with the above structures, in which a maximum emission wavelength of the fluorescent substance is longer than a maximum emission wavelength of the exciplex formed by the first organic compound and the second organic compound.

Another embodiment of the present invention is any of the light-emitting elements with the above structures, in which light emission includes a delayed fluorescence.

Another embodiment of the present invention is a lighting device including the light-emitting element having any of the above-described structures.

Another embodiment of the present invention is a light-emitting device which includes the light-emitting element having any of the above-described structures and a unit that controls the light-emitting element.

Another embodiment of the present invention is a display device which includes the light-emitting element having any of the above-described structures in a display portion and a unit that controls the light-emitting element.

Another embodiment of the present invention is an electronic device including the light-emitting element having any of the above-described structures.

Note that the light-emitting device in this specification includes, in its category, an image display device using a light-emitting element. The category of the light-emitting device in this specification includes a module in which a light-emitting element is provided with a connector such as an anisotropic conductive film or a tape carrier package (TCP); a module having a TCP at the tip of which a printed wiring board is provided; and a module in which an IC (integrated circuit) is directly mounted on a light-emitting element by a COG (chip on glass) method.

One embodiment of the present invention can provide a light-emitting element which has high emission efficiency. One embodiment of the present invention can provide a light-emitting element which has high emission efficiency without using a rare metal as a light-emitting material. One embodiment of the present invention can provide a light-emitting element which utilizes an exciplex and has high efficiency. One embodiment of the present invention can provide a light-emitting element which emits light from an exciplex and has high efficiency. One embodiment of the present invention can provide a fluorescent light-emitting element which emits light via energy transfer from an exciplex and has high efficiency can be provided. One embodiment of the present invention can provide a light-emitting element which achieves any of the above objects and has a long lifetime.

One embodiment of the present invention can provide a light-emitting device, a display device, an electronic device, and a lighting device each of which has high emission efficiency. One embodiment of the present invention can provide a light-emitting device, a display device, an electronic device, and a lighting device each of which has high emission efficiency, a long lifetime and solves any of the above problems.

BRIEF DESCRIPTION OF THE DRAWINGS

FIGS. 3A and 3B are conceptual diagrams of passive matrix light-emitting devices.

FIGS. 7A, 7B1, 7B2, 7C, and 7D illustrate electronic devices.

DETAILED DESCRIPTION OF THE INVENTION

Figure 1A:
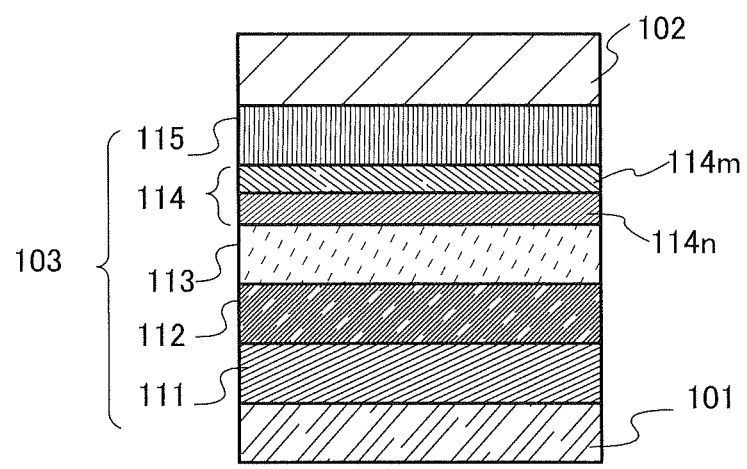
FIGS. 1A and 1B are conceptual diagrams of light-emitting elements.

Embodiments of the present invention will be explained below with reference to the drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below.

Embodiment 1

As a typical method for converting triplet excitation energy into light emission, there are a method utilizing phosphorescence, which is direct emission from a triplet excited level, and a method utilizing delayed fluorescence, which is light emitted from a singlet excited level after a triplet excitation energy is turned into a singlet excitation energy via reverse intersystem crossing from the triplet excited level to the singlet excited level.

A structure of a light-emitting element that uses a phosphorescent substance and emits light with extremely high efficiency has been actually reported, which proves advantages of the utilization of a triplet excited level for light emission. However, central metals of phosphorescent substances are mostly rare metals, and there are concerns about cost and supply in mass production.

Some degree of success in a light-emitting element using a delayed fluorescence material has been achieved in recent years. However, a substance emitting delayed fluorescence with relatively high efficiency has an extremely rare state where a singlet excited level and a triplet excited level are close to each other and accordingly has a unique molecular structure; thus, the kind of such a substance is still limited.

An exciplex is a complex in an excited state which is formed by two kinds of molecules due to charge-transfer interaction and the singlet excited level and the triplet excited level of an exciplex are close to each other in many cases.

Therefore, an exciplex readily emits delayed fluorescence even at room temperature and might allow a fluorescent light-emitting element to have high emission efficiency. Light emitted by an exciplex has a wavelength equivalent to a difference between a shallower HOMO level and a deeper LUMO level of the two kinds of substances that form the complex. Thus, light with a desired wavelength can be obtained relatively easily by selection of substances forming an exciplex.

However, positive use of light emission from an exciplex is still under investigation. There are few guidelines for selecting substances to cause reverse intersystem crossing from the triplet excited level to the singlet excited level with high efficiency, and without any guideline, a desirable result will never be provided.

When reverse intersystem crossing can be performed with high efficiency from the triplet excited level to the singlet excited level, excitation energy can be efficiently transferred to a fluorescent substance from an exciplex capable of converting the triplet excitation energy into the singlet excitation energy. Consequently, light emission can be obtained from a fluorescent substance with higher efficiency than that of a light-emitting element with a conventional mechanism. In view of the above, described in this embodiment is a light-emitting element that emits light with high efficiency and has a structure in which an exciplex is used as a substance having a function of transferring energy to a fluorescent substance and the fluorescent substance is used as emission center.

A light-emitting element in this embodiment includes a layer containing an organic compound (the layer may also contain an inorganic compound) between a pair of electrodes, and the layer containing an organic compound includes at least a light-emitting layer. The light-emitting layer contains a first organic compound with an electron-transport property, a second organic compound with a hole-transport property, and a fluorescent substance.

A combination of the first organic compound and the second organic compound forms an exciplex. To form an exciplex, the HOMO level and LUMO level of the first organic compound are preferably deeper than the HOMO level and LUMO level of the second organic compound, respectively.

The formation process of the exciplex is considered to be roughly classified into the following two processes.

One formation process is the process in which an exciplex is formed by the first organic compound with an electron-transport property and the second organic compound with a hole-transport property which are in the state of having carriers (cation or anion).

The other formation process is an elementary process in which one of the first organic compound with an electron-transport property and the second organic compound with a hole-transport property forms a singlet exciton and then the singlet exciton interacts with the other in the ground state to form an exciplex.

The exciplex in this embodiment may be formed by either process.

In the case where the second organic compound with a hole-transport property has a triarylamine skeleton and at least one of the three aryl groups in the triarylamine skeleton is a group including a p-biphenyl skeleton, efficient light emission can be obtained. The group including a p-biphenyl skeleton preferably has a fluorene skeleton, in which case a light-emitting element with more favorable characteristics can be obtained.

Examples of the group including a p-biphenyl skeleton are a substituted or unsubstituted p-biphenyl group, a substituted or unsubstituted fluorenyl group, a substituted or unsubstituted spirofluorenyl group, and a substituted or unsubstituted 4-(9-phenyl-9H-carbazol-3-yl)phenyl group.

In particular, it is preferable that the group including a p-biphenyl skeleton be a substituted or unsubstituted fluorenyl group (a fluoren-2-yl group because it has a p-biphenyl skeleton), in which case more preferable light-emitting characteristics (emission efficiency such as current efficiency or external quantum efficiency) can be obtained.

In the triarylamine skeleton, three aryl groups are bonded with one another. It is more preferable that two or more aryl groups among the three aryl groups be any of the aforementioned groups.

Furthermore, in the case where one of the three aryl groups in the triarylamine skeleton is a substituted or unsubstituted p-biphenyl group, at least one of the other aryl groups is preferably a substituted or unsubstituted 4-(9-phenyl-9H-carbazol-3-yl) phenyl group or a 9-phenyl-9H-carbazol-3-yl group, in which case a light-emitting element with high emission efficiency can be provided.

When any of these groups includes a substituent, an alkyl group having 1 to 4 carbon atoms and a phenyl group are given as examples of the substituent.

In addition to the above-mentioned groups, an aryl group having 6 to 50 carbon atoms, a heteroaryl group having 1 to 50 carbon atoms, or the like can be used as an aryl group in the second organic compound in this embodiment. Note that a group including a naphthalene skeleton decreases the triplet excited level of the formed exciplex and light emission with high emission efficiency cannot be obtained depending on the exciplex. For this reason, it is preferable to avoid using a group including a naphthalene skeleton.

Moreover, a substance in which a diarylamino group is bonded to any of the aryl groups in the triarylamine can be used as the second organic compound. In that case, it is preferable that the two aryl groups in the diarylamino group be each independently the group including a p-biphenyl skeleton, the aryl group having 6 to 50 carbon atoms, or the heteroaryl group having 1 to 50 carbon atoms.

The second organic compound can be represented by General Formula (G1).

In General Formula (G1), $Ar^1$ represents a group including a p-biphenyl skeleton, $Ar^2$ and $Ar^3$ each independently represent an aryl group having 6 to 50 carbon atoms or a heteroaryl group having 1 to 50 carbon atoms.

It is further preferable, in General Formula (G1), that $Ar^1$ and $Ar^2$ each independently represent a group including a p-biphenyl skeleton, and $Ar^3$ represent an aryl group having 6 to 50 carbon atoms or a heteroaryl group having 1 to 50 carbon atoms.

Alternatively, $Ar^1$ to $Ar^3$ in General Formula (G1) can each independently represent a group including a p-biphenyl skeleton.

The second organic compound can be represented by General Formula (G2).

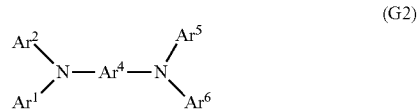

In General Formula (G2), at least one of $Ar^1$, $Ar^2$, $Ar^5$, and $Ar^6$ represents a group including a p-biphenyl skeleton, and the rest of $Ar^1$, $Ar^2$, $Ar^5$, and $Ar^6$ each independently represent an aryl group having 6 to 50 carbon atoms or a heteroaryl group having 1 to 50 carbon atoms; and $Ar^4$ represents a substituted or unsubstituted phenylene group, a substituted or unsubstituted biphenyldiyl group, a substituted or unsubstituted fluorenediyl group, or a substituted or unsubstituted spirofluorenediyl group. Note that it is preferable that the second organic compound represented by General Formula (G2) do not have a naphthalene skeleton.

It is further preferable, in General Formula (G2), that $Ar^1$ and $Ar^2$ each independently represent a group including a p-biphenyl skeleton, and $Ar^5$ and $Ar^6$ each independently represent an aryl group having 6 to 50 carbon atoms or a heteroaryl group having 1 to 50 carbon atoms. Note that it is preferable that these groups do not have a naphthalene skeleton.

Alternatively, $Ar^1$, $Ar^2$, $Ar^5$, and $Ar^6$ in General Formula (G2) can each independently represent a group including a p-biphenyl skeleton.

Note that in description on the second organic compound, the group including a p-biphenyl skeleton is preferably a substituted or unsubstituted p-biphenyl group, a substituted or unsubstituted fluoren-2-yl group, a substituted or unsubstituted spirofluorenyl group, or a substituted or unsubstituted 4-(9-phenyl-9H-carbazol-3-yl)phenyl group.

To achieve high triplet excitation energy, it is preferable that the aryl group having 6 to 50 carbon atoms and the heteroaryl group having 1 to 50 carbon atoms do not have a naphthalene skeleton. Specifically, a substituted or unsubstituted phenyl group, a substituted or unsubstituted biphenyl group, a substituted or unsubstituted fluorenyl group, a substituted or unsubstituted spirofluorenyl group, a substituted or unsubstituted phenyl group to which a dibenzofuranyl group is bonded, a substituted or unsubstituted phenyl group to which a dibenzothiophenyl group is bonded, a substituted or unsubstituted 9-phenyl-9H-carbazol-3-yl group, or the like is preferable.

In description on the second organic compound, when any of these groups includes a substituent, an alkyl group having 1 to 6 carbon atoms, a phenyl group, or a biphenyl group are given as examples of the substituent.

Specific examples of the second organic compound can be represented by Structural Formulae (100) to (109). Note that the second organic compound that can be used in this embodiment is not limited to the following examples.

(101)

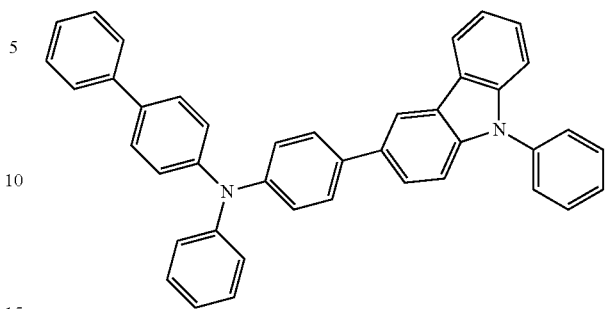

(102)

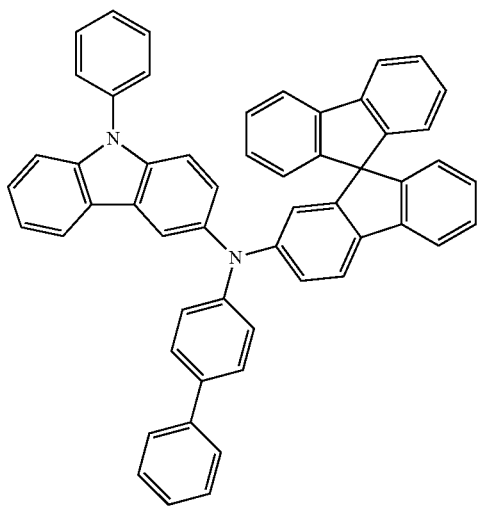

(100)

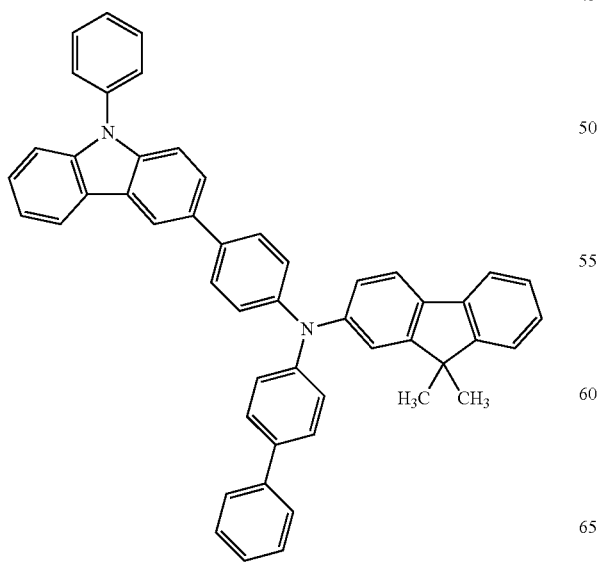

(103)

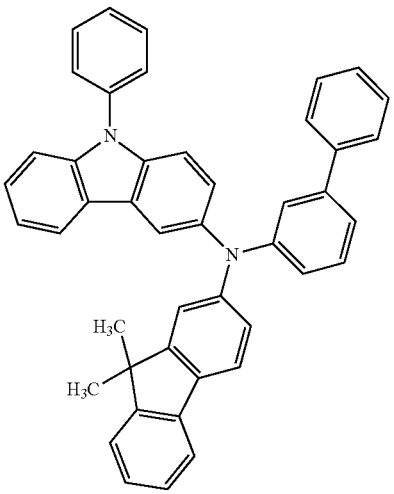

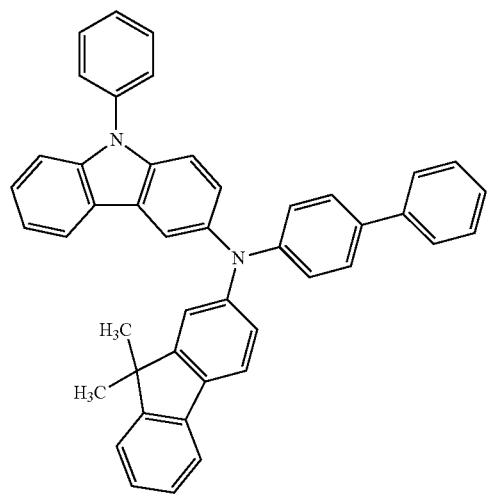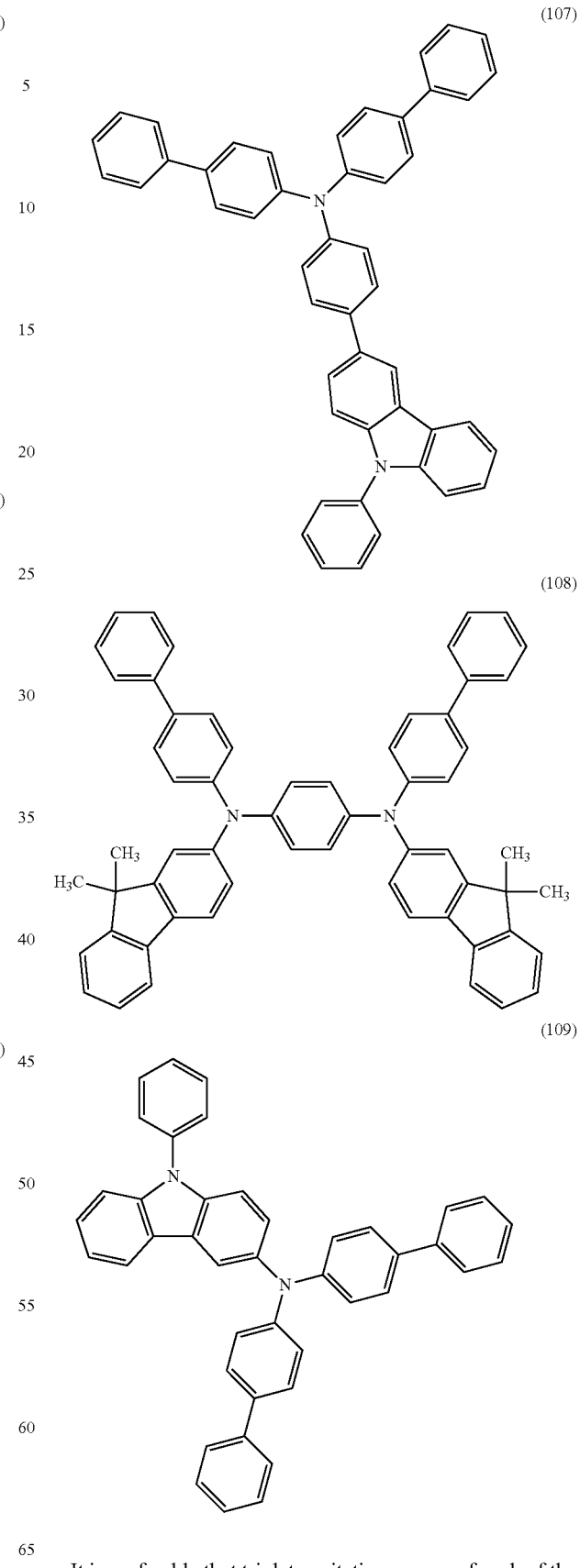
It is preferable that triplet excitation energy of each of the first organic compound and the second organic compound (energy equivalent to a difference between a triplet excited level and a singlet ground level) be higher than triplet excitation energy of the exciplex. This is because when the triplet excitation energy of each of the first organic compound and the second organic compound is lower than that of the exciplex, the triplet excitation energy of the exciplex is transferred, which inhibits efficient light emission.

To avoid such a disadvantage, it is preferable that the first organic compound and the second organic compound do not have a naphthalene skeleton.

Note that triplet excitation energy of an exciplex, whose singlet excited level and triplet excited level have a small energy difference, can be regarded as energy corresponding to the emission wavelength of the exciplex.

As the first organic compound with an electron-transport property, an electron-transport material having an electron mobility of $10^{-6}$ cm$^2$/Vs or higher can be used mainly. Specifically, a π-electron deficient heteroaromatic compound such as a nitrogen-containing heteroaromatic compound is preferable, and for example, any of the following compounds can be used: heterocyclic compounds having polyazole skeletons, such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2''-(1,3,5-benzenetriyl)tris(1-phenyl-1H-benzimidazole) (abbreviation: TPBI), and 2-[3-(dibenzothiophen-4-yl)phenyl]-1-phenyl-1H-benzimidazole (abbreviation: mDBTBIm-II); heterocyclic compounds having quinoxaline skeletons or dibenzoquinoxaline skeletons, such as 2-[3-(dibenzothiophen-4-yl)phenyl]dibenzo[f,h]quinoxaline (abbreviation: 2mDBTPDBq-II), 7-[3-(dibenzothiophen-4-yl)phenyl]dibenzo[f,h]quinoxaline (abbreviation: 7mDBTPDBq-II), 6-[3-(dibenzothiophen-4-yl)phenyl]dibenzo[f,h]quinoxaline (abbreviation: 6mDBTPDBq-II), 2-[3'-(dibenzothiophen-4-yl)biphenyl-3-yl]dibenzo[f,h]quinoxaline (abbreviation: 2mDBTBPDBq-II), and 2-[3'-(9H-carbazol-9-yl)biphenyl-3-yl]dibenzo[f,h]quinoxaline (abbreviation: 2mCzBPDBq); heterocyclic compounds having diazine skeletons (pyrimidine skeletons or pyrazine skeletons), such as 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), 4,6-bis[3-(9H-carbazol-9-yl)phenyl]pyrimidine (abbreviation: 4,6mCzP2Pm), and 4-[3'-(dibenzothiophen-4-yl)biphenyl-3-yl]benzofuro[3,2-d]pyrimidine (abbreviation: 4mDBTBPBfpm-II); and heterocyclic compounds having pyridine skeletons, such as 3,5-bis[3-(9H-carbazol-9-yl)phenyl]pyridine (abbreviation: 35DCzPPy), 1,3,5-tri[3-(3-pyridyl)phenyl]benzene (abbreviation: TmPyPB), and 3,3',5,5'-tetra-[(m-pyridyl)-phen-3-yl]biphenyl (abbreviation: BP4mPy). Among the above-described compounds, the heterocyclic compounds having quinoxaline skeletons or dibenzoquinoxaline skeletons, the heterocyclic compounds having diazine skeletons, and the heterocyclic compounds having pyridine skeletons have high reliability and can be preferably used. The following can also be given as the first organic compound: triaryl phosphine oxides such as phenyl-di(1-pyrenyl)phosphine oxide (abbreviation: POPy$_2$), spiro-9,9'-bifluoren-2-yl-diphenylphosphine oxide (abbreviation: SPPO1), 2,8-bis(diphenylphosphoryl)dibenzo[b,d]thiophene (abbreviation: PPT), and 3-(diphenylphosphoryl)-9-[4-(diphenylphosphoryl)phenyl]-9H-carbazole (abbreviation: PPO21); and triaryl borane such as tris[2,4,6-trimethyl-3-(3-pyridyl)phenyl]borane (abbreviation: 3TPYMB). Note that a heterocyclic compound with a diazine skeleton, specifically a heterocyclic compound with a pyrimidine skeleton, is preferably used, in which case light can be emitted with higher efficiency. Among these substances, a substance having a diazine skeleton, and more particularly, a substance having a pyrimidine skeleton is preferably used for forming an exciplex that emits light with high efficiency.

There is no particular limitation on the fluorescent substance in the light-emitting layer as long as the emission spectrum of the fluorescent substance peaks at a longer wavelength than the emission spectrum of the exciplex, and any of various materials can be used as the fluorescent substance. Specific examples of the fluorescent substance are 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N-bis[4-(9-phenyl-9H-fluoren-9-yl)phenyl]-N,N-diphenyl-pyrene-1,6-diamine (abbreviation: 1,6FLPAPrn), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra-tert-butylperylene (abbreviation: TBP), 4-(10-phenyl-9-anthryl)-4'-(9-phenyl-9H-carbazol-3-yl)triphenylamine (abbreviation: PCBAPA), N,N''-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryephenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N'',N'',N''',N'''-octaphenyldibenzo[g,p]chhrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N, 9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinit rile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-d iamine (abbreviation: p-mPhAFD), 2-{2-isopropyl-6-[2-(1,1,7,7-tetramethyl-2,3,6,7-tetrahydro-1H,5H-benzo[if]quinolizin-9-yl)ethenyl]-4H-pyran-4-ylidene}propanedinitrile (abbreviation: DCJTI), {2-tert-butyl-6-[2-(1,1,7,7-tetramethyl-2,3,6,7-tetrahydro-1H,5H-benzo[ ]quinolizin-9-yl)ethenyl]-4H-pyran-4-ylidene}propanedinitrile (abbreviation: DCJTB), 2-(2,6-bis {2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM), and the like.

The concentration of the fluorescent substance in the light-emitting layer is preferably 5 wt % or lower, more preferably 1 wt % or lower.

Materials are selected such that an emission spectrum of an exciplex formed by the first and second organic compounds overlaps with an absorption band on the longest wavelength side of the fluorescent substance, in which case the efficiency of the energy transfer can be improved and a light-emitting element with higher external quantum efficiency can be obtained.

The absorption band on the longest wavelength side of the fluorescent substance is the band of absorption corresponding to transition of the fluorescent substance from a singlet ground level to a singlet excited level. When the absorption band overlaps with the emission spectrum of an exciplex, energy transfer from the exciplex to the fluorescent substance can be performed efficiently. As a result, a light-emitting element with high external quantum efficiency can be obtained.

Since energy corresponding to the emission wavelength of an exciplex is equivalent to an energy difference between a shallower HOMO level and a deeper LUMO level of the first and second organic compounds, the emission wavelength of an exciplex can largely overlap with the absorption band of a desired fluorescent substance by selecting a combination of substances with appropriate levels; as a result, the efficiency of the energy transfer can be increased easily.

It is highly probable that light from the exciplex formed by the first and second organic compounds has extremely high external quantum efficiency and includes a large amount of delayed fluorescence. For this reason, a fluorescent light-emitting element that emits light via energy transfer from the exciplex can have an external quantum efficiency exceeding "a conventional theoretical limit of external quantum efficiency without intersystem crossing of a host material in an excited state". Although the theoretical limit of external quantum efficiency of a fluorescent light-emitting element is generally considered to be 5% to 7% when it is not designed to enhance extraction efficiency, a light-emitting element having external quantum efficiency higher than the theoretical limit can be easily provided with the use of the structure of the light-emitting element in this embodiment.

Thus, by employing the structure of this embodiment, a light-emitting element in which a triplet excitation energy can be converted into fluorescence via reverse intersystem crossing from the triplet excited level to the singlet excited level and which can emit light with high emission efficiency can be easily provided without using a rare metal the supply of which is unstable. Besides, a long-lifetime light-emitting element with the above characteristics can be provided.

Embodiment 2

In this embodiment, a detailed example of the structure of the light-emitting element described in Embodiment 1 will be described below with reference to FIGS. 1A and 1B.

In FIG. 1A, the light-emitting element includes a first electrode 101, a second electrode 102, and a layer 103 containing an organic compound and provided between the first electrode 101 and the second electrode 102. Note that in this embodiment, the first electrode 101 functions as an anode and the second electrode 102 functions as a cathode.

In other words, when voltage is applied between the first electrode 101 and the second electrode 102 so that the potential of the first electrode 101 is higher than that of the second electrode 102, light emission can be obtained. The layer 103 containing an organic compound includes at least a light-emitting layer 113. A hole-injection layer 111, a hole-transport layer 112, an electron-transport layer 114, and an electron-injection layer 115 which are illustrated in FIG. 1A are merely examples and not necessarily provided. A layer having any other function may also be provided.

The first electrode 101 functions as the anode and is preferably formed using any of metals, alloys, electrically conductive compounds with a high work function (specifically, a work function of 4.0 eV or larger), mixtures thereof, and the like. Specific examples are indium oxide-tin oxide (ITO: indium tin oxide), indium oxide-tin oxide containing silicon or silicon oxide, indium oxide-zinc oxide, indium oxide containing tungsten oxide and zinc oxide (IWZO), and the like. Such conductive metal oxide films are usually formed by a sputtering method, but may also be formed by application of a sol-gel method or the like. In an example of the formation method, indium oxide-zinc oxide is deposited by a sputtering method using a target obtained by adding 1 wt % to 20 wt % of zinc oxide to indium oxide. Further, a film of indium oxide containing tungsten oxide and zinc oxide (IWZO) can be formed by a sputtering method using a target in which tungsten oxide and zinc oxide are added to indium oxide at 0.5 wt % to 5 wt % and 0.1 wt % to 1 wt %, respectively. In addition, gold (Au), platinum (Pt), nickel (Ni), tungsten (W), chromium (Cr), molybdenum (Mo), iron (Fe), cobalt (Co), copper (Cu), palladium (Pd), a nitride of a metal material (such as titanium nitride), or the like can be used. Graphene can also be used. Note that when a composite material described later is used for a layer which is in contact with the first electrode 101 in the layer 103 containing an organic compound, an electrode material can be selected regardless of its work function.

There is no particular limitation on the stacked structure of the layer 103 containing an organic compound as long as the light-emitting layer 113 has the structure described in Embodiment 1. For example, in FIG. 1A, the layer 103 containing an organic compound can be formed by combining a hole-injection layer, a hole-transport layer, the light-emitting layer, an electron-transport layer, an electron-injection layer, a carrier-blocking layer, a charge-generation layer, and the like as appropriate. In this embodiment, the layer 103 containing an organic compound has a structure in which the hole-injection layer 111, the hole-transport layer 112, the light-emitting layer 113, the electron-transport layer 114, and the electron-injection layer 115 are stacked in this order over the first electrode 101. Materials for the layers are specifically given below.

The hole-injection layer 111 is a layer containing a substance having a high hole-injection property. Molybdenum oxide, vanadium oxide, ruthenium oxide, tungsten oxide, manganese oxide, or the like can be used. Alternatively, the hole-injection layer 111 can be formed using a phthalocyanine-based compound such as phthalocyanine (abbreviation: H$_2$Pc) or copper phthalocyanine (abbreviation: CuPc), an aromatic amine compound such as 4,4'-bis[N-(4-diphenylaminophenyl)-N-phenylamino]biphenyl (abbreviation: DPAB) or N,N'-bis{4-[bis(3-methylphenyl)amino]phenyl}-N,N'-diphenyl-(1,1'-biphenyl)-4,4'-diamine (abbreviation: DNTPD), a high molecular compound such as poly(3,4-ethylenedioxythiophene)/poly(styrenesulfonic acid) (PEDOT/PSS), or the like.

Alternatively, a composite material in which a material with a hole-transport property contains an acceptor substance can be used for the hole-injection layer 111. Note that the use of such a material with a hole-transport property which contains an acceptor substance enables selection of a material used to form an electrode regardless of its work function. In other words, besides a material having a high work function, a material having a low work function can also be used for the first electrode 101. As the acceptor substance, 7,7,8,8-tetracyano-2,3,5,6-tetrafluoroquinodimethane (abbreviation: $F_4$-TCNQ), chloranil, and the like can be given. In addition, a transition metal oxide can be given. In addition, oxides of metals belonging to Group 4 to Group 8 of the periodic table can be given. Specifically, vanadium oxide, niobium oxide, tantalum oxide, chromium oxide, molybdenum oxide, tungsten oxide, manganese oxide, and rhenium oxide are preferable because of their high electron-accepting properties. Among these, molybdenum oxide is especially preferable because it is stable in the air, has a low hygroscopic property, and is easily handled.

As the material with a hole-transport property used for the composite material, any of a variety of organic compounds such as aromatic amine compounds, carbazole derivatives, aromatic hydrocarbons, and high molecular compounds (e.g., oligomers, dendrimers, or polymers) can be used. Note that the organic compound used for the composite material is preferably an organic compound having a high hole-transport property. Specifically, a substance having a hole mobility of $10^{-6}$ cm$^2$/Vs or higher is preferably used. Organic compounds which can be used as the material having a hole-transport property in the composite material are specifically given below.

Examples of the aromatic amine compound include N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis{4-[bis(3-methylphenyl)amino]phenyl}-N,N'-diphenyl-(1,1'-biphenyl)-4,4'-dia mine (abbreviation: DNTPD), 1,3,5-tris[N-(4-diphenylaminophenyl)-N-phenylamino]benzene (abbreviation: DPA3B), and the like.

As carbazole derivatives which can be used for the composite material, the following can be given specifically: 3-[N-(9-phenylcarbazol-3-yl)-N-phenylamino]-9-phenylcarbazole (abbreviation: PCzPCA1); 3,6-bis[N-(9-phenylcarbazol-3-ye-N-phenylamino]-9-phenylcarbazole (abbreviation: PCzPCA2); 3-[N-(1-naphthyl)-N-(9-phenylcarbazol-3-yl)amino]-9-phenylcarbazole (abbreviation: PCzPCN1); and the like.

In addition, examples of the carbazole derivatives which can be used for the composite material include 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 1,4-bis[4-(N-carbazolyl)phenyl]-2,3,5,6-tetraphenylbenzene, and the like.

Examples of the aromatic hydrocarbon which can be used for the composite material include 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, and 2,5,8,11-tetra (tert-butyl)perylene. Besides, pentacene, coronene, or the like can also be used. The aromatic hydrocarbon which has a hole mobility of $1 \times 10^{-6}$ cm$^2$/Vs or higher and which has 14 to 42 carbon atoms is particularly preferable.

The aromatic hydrocarbon which can be used for the composite material may have a vinyl skeleton. Examples of the aromatic hydrocarbon having a vinyl group include 4,4'-bis(2,2-diphenylvinyl)biphenyl (abbreviation: DPVBi), 9,10-bis[4-(2,2-diphenylvinyl)phenyl]anthracene (abbreviation: DPVPA), and the like.

Moreover, a high molecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl) methacryla mide] (abbreviation: PTPDMA), or poly[N,N'-bis(4-butylphenyl)-N,N'-bis(phenyl)benzidine (abbreviation: poly-TPD) can also be used.

By providing a hole-injection layer, a high hole-injection property can be achieved to allow a light-emitting element to be driven at a low voltage.

The hole-transport layer is a layer containing a material having a hole-transport property. Examples of the material having a hole-transport property include aromatic amine compounds such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), and the like. The substances given here have high hole-transport properties and are mainly ones having a hole mobility of $10^{-6}$ cm$^2$/Vs or higher. An organic compound given as an example of the material with a hole-transport property in the composite material described above can also be used for the hole-transport layer. Moreover, a high molecular compound such as poly(N-vinylcarbazole) (abbreviation: PVK) or poly(4-vinyltriphenylamine) (abbreviation: PVTPA) can also be used. Note that the layer containing a material with a hole-transport property is not limited to a single layer, and may be a stack of two or more layers containing any of the above substances.

The light-emitting layer 113 contains the first organic compound with an electron-transport property, the second organic compound with a hole-transport property, and a fluorescent substance. Materials and structures of the compounds are as described in Embodiment 1. By having such a structure, the light-emitting element of this embodiment has extremely high external quantum efficiency though it is a fluorescent light-emitting element that does not use a rare metal. Furthermore, by having such a structure, the light-emitting element can have a long lifetime.

The electron-transport layer 114 is a layer containing a material having an electron-transport property. For example, the electron-transport layer 114 is formed using a metal complex having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]quinolinato)beryllium (abbreviation: BeBq$_2$), or bis(2-methyl-8- quinolinolato)(4-phenylphenolato)aluminum (abbreviation: BAlq), or the like. A metal complex having an oxazole-based or thiazole-based ligand, such as bis[2-(2-hydroxyphenyl)benzoxazolato]zinc (abbreviation: $Zn(BOX)_2$) or bis[2-(2-hydroxyphenyl)benzothiazolato]zinc (abbreviation: $Zn(BTZ)_2$), or the like can also be used. Other than the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can also be used. The substances mentioned here have high electron-transport properties and are mainly ones that have an electron mobility of $10^{-6}$ cm$^2$/Vs or higher. Note that the above-described first organic compound with an electron-transport property may be used for the electron-transport layer 114.

The electron-transport layer 114 is not limited to a single layer, and may be a stack including two or more layers containing any of the above substances. For example, FIG. 1A shows the structure in which a first electron-transport layer 114m and a second electron-transport layer 114n are stacked.

Between the electron-transport layer and the light-emitting layer, a layer that controls transport of electron carriers may be provided. This is a layer formed by addition of a small amount of a substance having a high electron-trapping property to the aforementioned materials having a high electron-transport property, and the layer is capable of adjusting carrier balance by retarding transport of electron carriers. Such a structure is very effective in preventing a problem (such as a reduction in element lifetime) caused when electrons pass through the light-emitting layer.

In addition, an electron-injection layer 115 may be provided in contact with the second electrode 102 between the electron-transport layer 114 and the second electrode 102. For the electron-injection layer 115, an alkali metal, an alkaline earth metal, or a compound thereof, such as lithium fluoride (LiF), cesium fluoride (CsF), or calcium fluoride ($CaF_2$), can be used. For example, a layer that is formed using a substance having an electron-transport property and contains an alkali metal, an alkaline earth metal, or a compound thereof can be used. Note that a layer that is forming using a substance having an electron-transport property and contains an alkali metal or an alkaline earth metal is preferably used as the electron-injection layer 115, in which case electron injection from the second electrode 102 is efficiently performed.

For the second electrode 102, any of metals, alloys, electrically conductive compounds, and mixtures thereof which have a low work function (specifically, a work function of 3.8 eV or less) or the like can be used. Specific examples of such a cathode material are elements belonging to Groups 1 and 2 of the periodic table, such as alkali metals (e.g., lithium (Li) and cesium (Cs)), magnesium (Mg), calcium (Ca), and strontium (Sr), alloys thereof (e.g., MgAg and AlLi), rare earth metals such as europium (Eu) and ytterbium (Yb), alloys thereof, and the like. However, when the electron-injection layer is provided between the second electrode 102 and the electron-transport layer, for the second electrode 102, any of a variety of conductive materials such as Al, Ag, ITO, or indium oxide-tin oxide containing silicon or silicon oxide can be used regardless of the work function. Films of these electrically conductive materials can be formed by a sputtering method, an inkjet method, a spin coating method, or the like.

Any of a variety of methods can be used to form the layer 103 containing an organic compound regardless whether it is a dry process or a wet process. For example, a vacuum evaporation method, an inkjet method, a spin coating method, or the like may be used. Different formation methods may be used for the electrodes or the layers.

In addition, the electrode may be formed by a wet method using a sol-gel method, or by a wet method using paste of a metal material. Alternatively, the electrode may be formed by a dry method such as a sputtering method or a vacuum evaporation method.

In the light-emitting element having the above-described structure, current flows due to a potential difference between the first electrode 101 and the second electrode 102, and holes and electrons recombine in the light-emitting layer 113 which contains a substance having a high light-emitting property, so that light is emitted. In other words, a light-emitting region is formed in the light-emitting layer 113.

Light emission is extracted out through one or both of the first electrode 101 and the second electrode 102. Therefore, one or both of the first electrode 101 and the second electrode 102 are light-transmitting electrodes. In the case where only the first electrode 101 is a light-transmitting electrode, light emission is extracted through the first electrode 101. In the case where only the second electrode 102 is a light-transmitting electrode, light emission is extracted through the second electrode 102. In the case where both the first electrode 101 and the second electrode 102 are light-transmitting electrodes, light emission is extracted through the first electrode 101 and the second electrode 102.

The structure of the layers provided between the first electrode 101 and the second electrode 102 is not limited to the above-described structure. Preferably, a light-emitting region where holes and electrons recombine is positioned away from the first electrode 101 and the second electrode 102 so that quenching due to the proximity of the light-emitting region and a metal used for electrodes and carrier-injection layers can be prevented.

Further, to inhibit transfer of energy from an exciton generated in the light-emitting layer, preferably, the hole-transport layer and the electron-transport layer which are in contact with the light-emitting layer 113, particularly a carrier-transport layer in contact with a side closer to the light-emitting region in the light-emitting layer 113, are formed using a substance having a wider band gap than the exciplex included in the light-emitting layer.

Figure 1B:
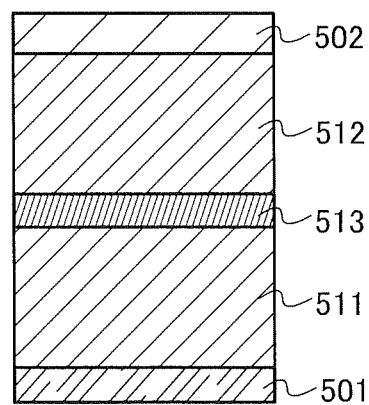

FIG. 1B shows a light-emitting element having different structure from FIG. 1A. One embodiment of a light-emitting element in which a plurality of light-emitting units are stacked (hereinafter, also referred to as a stacked-layer element) will be described with reference to FIG. 1B. This light-emitting element is a light-emitting element including a plurality of light-emitting units between a first electrode and a second electrode. One light-emitting unit has a structure similar to that of the layer 103 containing an organic compound, which is illustrated in FIG. 1A. In other words, the light-emitting element illustrated in FIG. 1A includes a single light-emitting unit; the light-emitting element illustrated in FIG. 1B includes a plurality of light-emitting units.

In FIG. 1B, a first light-emitting unit 511 and a second light-emitting unit 512 are stacked between a first electrode 501 and a second electrode 502, and a charge-generation layer 513 is provided between the first light-emitting unit 511 and the second light-emitting unit 512. The first electrode 501 and the second electrode 502 correspond, respectively, to the first electrode 101 and the second electrode 102 illustrated in FIG. 1A, and the materials given in the description for FIG. 1A can be used. Further, the first light-emitting unit 511 and the second light-emitting unit 512 may have the same structure or different structures.

The charge-generation layer 513 includes a composite material of an organic compound and a metal oxide. As this composite material of an organic compound and a metal oxide, the composite material that can be used for the hole-injection layer and shown in FIG. 1A can be used. As the organic compound, a variety of compounds such as an aromatic amine compound, a carbazole compound, an aromatic hydrocarbon, and a high molecular compound (such as an oligomer, a dendrimer, or a polymer) can be used. An organic compound having a hole mobility of $1\times10^{-6}$ cm$^2$/Vs or higher is preferably used. Note that any other substance may be used as long as the substance has a hole-transport property higher than an electron-transport property. The composite material of the organic compound and the metal oxide can achieve low-voltage driving and low-current driving because of the superior carrier-injection property and carrier-transport property. Note that in the light-emitting unit whose anode side surface is in contact with the charge-generation layer, a hole-transport layer is not necessarily provided because the charge-generation layer can also function as the hole-transport layer.

The charge-generation layer 513 may have a stacked-layer structure of a layer containing the composite material of an organic compound and a metal oxide and a layer containing another material. For example, a stacked-layer structure of a layer containing the composite material of an organic compound and a metal oxide and a layer containing a compound selected from electron-donating substances and a compound having a high electron-transport property may be formed. Moreover, a layer containing the composite material of an organic compound and a metal oxide may be stacked with a transparent conductive film.

The charge-generation layer 513 interposed between the first light-emitting unit 511 and the second light-emitting unit 512 may have any structure as long as electrons can be injected to a light-emitting unit on one side and holes can be injected to a light-emitting unit on the other side when a voltage is applied between the first electrode 501 and the second electrode 502. For example, in FIG. 1B, any layer can be used as the charge-generation layer 513 as long as the layer injects electrons into the first light-emitting unit 511 and holes into the second light-emitting unit 512 when a voltage is applied such that the potential of the first electrode is higher than that of the second electrode.

In FIG. 1B, the light-emitting element having two light-emitting units is described; however, one embodiment of the present invention can be similarly applied to a light-emitting element in which three or more light-emitting units are stacked. With a plurality of light-emitting units partitioned by the charge-generation layer between a pair of electrodes as in the light-emitting element illustrated in FIG. 1B, it is possible to provide a light-emitting element which can emit light with high luminance with the current density kept low and has a long lifetime. In addition, a low-power-consumption light-emitting device which can be driven at low voltage can be achieved.

The light-emitting units emit light having different colors from each other, thereby obtaining light emission of a desired color in the whole light-emitting element. For example, in a light-emitting element having two light-emitting units, the first light-emitting unit gives red and green emissions and the second light-emitting unit gives blue emission, so that the light-emitting element can emit white light as the whole element.

The above-described structure can be combined with any of the structures in this embodiment and the other embodiments.

Embodiment 3

In this embodiment, a light-emitting device including the light-emitting element described in Embodiment 1 is described.

Figure 2A:
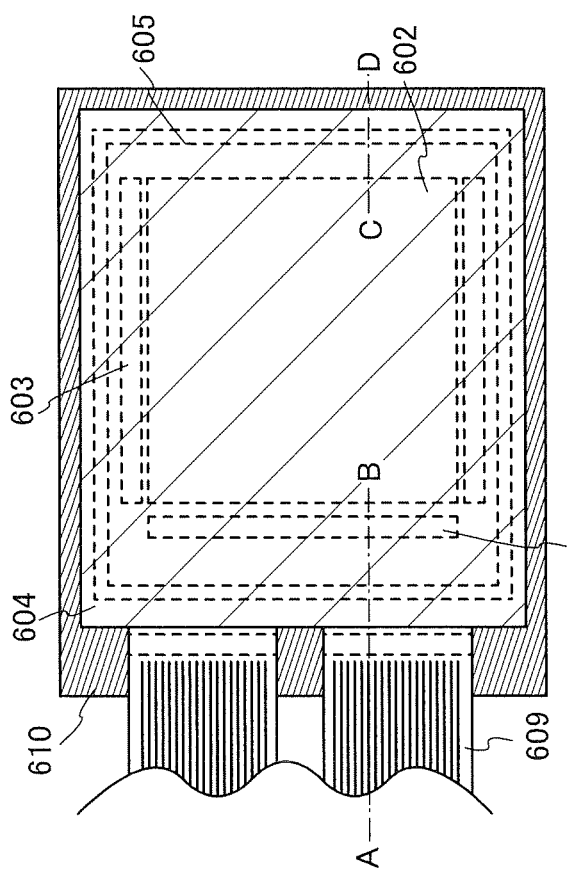
FIGS. 2A and 2B are conceptual diagrams of an active matrix light-emitting device.
Figure 2B:
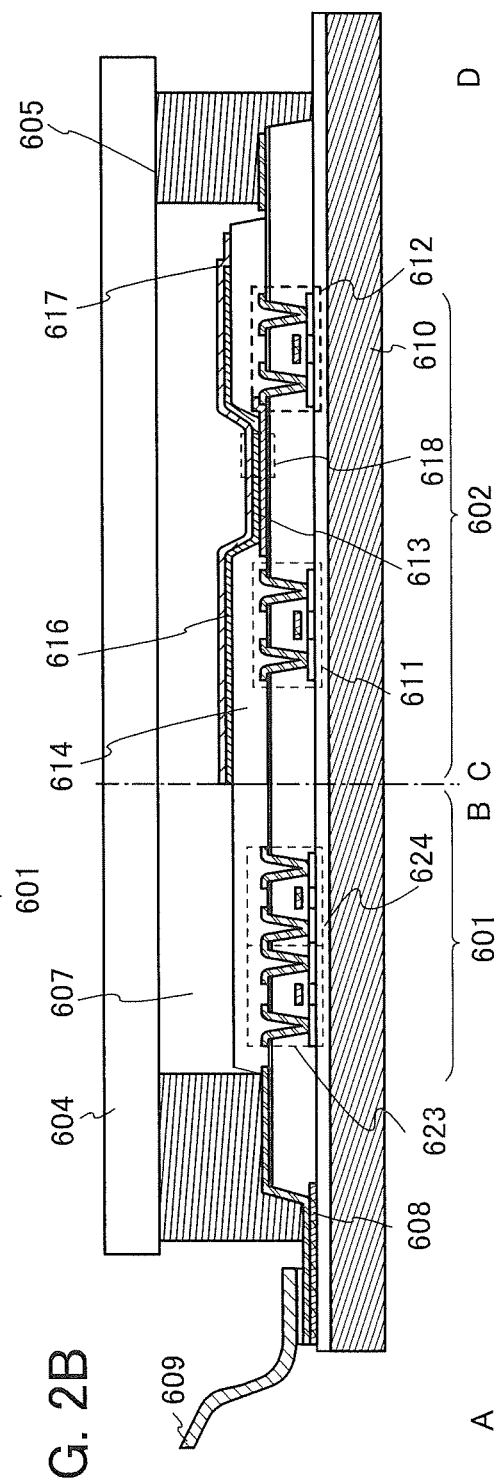

In this embodiment, the light-emitting device manufactured using the light-emitting element described in Embodiment 1 is described with reference to FIGS. 2A and 2B. Note that FIG. 2A is a top view illustrating the light-emitting device and FIG. 2B is a cross-sectional view of FIG. 2A taken along lines A-B and C-D. This light-emitting device includes a driver circuit portion (source line driver circuit) 601, a pixel portion 602, and a driver circuit portion (gate line driver circuit) 603, which control light emission of the light-emitting element and denoted by dotted lines. Moreover, a reference numeral 604 denotes a sealing substrate; 605, a sealing material; and 607, a space surrounded by the sealing material 605.

Note that a lead wiring 608 is a wiring for transmitting signals to be input to the source line driver circuit 601 and the gate line driver circuit 603 and for receiving a video signal, a clock signal, a start signal, a reset signal, and the like from an FPC (flexible printed circuit) 609 serving as an external input terminal. Although only the FPC is illustrated here, a printed wiring board (PWB) may be attached to the FPC. The light-emitting device in the present specification includes, in its category, not only the light-emitting device itself but also the light-emitting device provided with the FPC or the PWB.

Next, a cross-sectional structure is described with reference to FIG. 2B. The driver circuit portion and the pixel portion are formed over an element substrate 610; the source line driver circuit 601, which is a driver circuit portion, and one of the pixels in the pixel portion 602 are illustrated here.

In the source line driver circuit 601, a CMOS circuit is formed in which an n-channel TFT 623 and a p-channel TFT 624 are combined. In addition, the driver circuit may be formed with any of a variety of circuits such as a CMOS circuit, a PMOS circuit, or an NMOS circuit. Although a driver-integrated type in which the driver circuit is formed over the substrate is described in this embodiment, the present invention is not limited to this type and the driver circuit can be formed outside the substrate.

The pixel portion 602 is formed with a plurality of pixels including a switching TFT 611, a current controlling TFT 612, and a first electrode 613 connected electrically with a drain of the current controlling TFT. An insulator 614 is formed to cover the end portions of the first electrode 613. Here, the insulator 614 is formed using a positive type photosensitive acrylic resin film.

In order to improve the coverage, the insulator 614 is formed to have a curved surface with curvature at its upper or lower end portion. For example, in the case where positive photosensitive acrylic is used for a material of the insulator 614, only the upper end portion of the insulator 614 preferably has a curved surface with a curvature radius (0.2 μm to 3 μm). As the insulator 614, either a negative photosensitive resin or a positive photosensitive resin can be used.

A layer 616 containing an organic compound and a second electrode 617 are formed over the first electrode 613. As a material used for the first electrode 613 functioning as an anode, a material having a high work function is preferably used. For example, a single-layer film of an ITO film, an indium tin oxide film containing silicon, an indium oxide film containing zinc oxide at 2 wt % to 20 wt %, a titanium nitride film, a chromium film, a tungsten film, a Zn film, a Pt film, or the like, a stack including a titanium nitride film and a film containing aluminum as its main component, a stack including three layers of a titanium nitride film, a film containing aluminum as its main component, and a titanium nitride film, or the like can be used. The stacked-layer structure enables low wiring resistance, favorable ohmic contact, and a function as an anode.

In addition, the layer 616 containing an organic compound is formed by any of a variety of methods such as an evaporation method using an evaporation mask, an inkjet method, and a spin coating method. The layer 616 containing an organic compound has the structure described in Embodiment 1. Further, for another material included in the layer 616 containing an organic compound, any of low molecular-weight compounds and polymeric compounds (including oligomers and dendrimers) may be used.

As a material used for the second electrode 617, which is formed over the layer 616 containing an organic compound and functions as a cathode, a material having a low work function (e.g., Al, Mg, Li, Ca, or an alloy or a compound thereof, such as MgAg, MgIn, or AlLi) is preferably used. In the case where light generated in the layer 616 containing an organic compound is transmitted through the second electrode 617, a stack including a thin metal film and a transparent conductive film (e.g., ITO, indium oxide containing zinc oxide at 2 wt % to 20 wt %, indium tin oxide containing silicon, or zinc oxide (ZnO)) is preferably used for the second electrode 617.

Note that the light-emitting element is formed with the first electrode 613, the layer 616 containing an organic compound, and the second electrode 617. The light-emitting element has the structure described in Embodiment 1. In the light-emitting device in this embodiment, the pixel portion, which includes a plurality of light-emitting elements, may include both the light-emitting element described in Embodiment 1 and a light-emitting element having a different structure.

Further, the sealing substrate 604 is attached to the element substrate 610 with the sealing material 605, so that the light-emitting element 618 is provided in the space 607 surrounded by the element substrate 610, the sealing substrate 604, and the sealing material 605. The space 607 may be filled with filler such as an inert gas (such as nitrogen or argon) or the sealing material 605. It is preferable that the sealing substrate be provided with a recessed portion and the desiccant be provided in the recessed portion, in which case deterioration due to influence of moisture can be inhibited.

An epoxy-based resin or low-melting-point glass is preferably used for the sealing material 605. It is preferable that such a material do not transmit moisture or oxygen as much as possible. As the sealing substrate 604, a glass substrate, a quartz substrate, or a plastic substrate formed of fiber reinforced plastic (FRP), polyvinyl fluoride) (PVF), polyester, acrylic, or the like can be used.

As described above, the light-emitting device which uses the light-emitting element described in Embodiment 1 can be obtained.

The light-emitting device in this embodiment is fabricated using the light-emitting element described in Embodiment 1 and thus can have favorable characteristics. Specifically, since the light-emitting element described in Embodiment 1 has favorable emission efficiency, the light-emitting device can have reduced power consumption.

FIGS. 3A and 3B each illustrate an example of a light-emitting device in which full color display is achieved by formation of a light-emitting element exhibiting white light emission and with the use of coloring layers (color filters) and the like. In FIG. 3A, a substrate 1001, a base insulating film 1002, a gate insulating film 1003, a gate electrode 1006, 1007, and 1008, a first interlayer insulating film 1020, a second interlayer insulating film 1021, a peripheral portion 1042, a pixel portion 1040, a driver circuit portion 1041, first electrodes 1024W, 1024R, 1024G, and 1024B of light-emitting elements, a partition 1025, a layer 1028 containing an organic compound, a second electrode 1029 of the light-emitting elements, a sealing substrate 1031, a sealing material 1032 and the like are illustrated.

In FIG. 3A, coloring layers (a red coloring layer 1034R, a green coloring layer 1034G, and a blue coloring layer 1034B) are provided on a transparent base material 1033. A black layer (a black matrix) 1035 may be additionally provided. The transparent base material 1033 provided with the coloring layers and the black layer is positioned and fixed to the substrate 1001. Note that the coloring layers and the black layer are covered with an overcoat layer 1036. In FIG. 3A, light emitted from part of the light-emitting layer does not pass through the coloring layers, while light emitted from the other part of the light-emitting layer passes through the coloring layers. Since light which does not pass through the coloring layers is white and light which passes through any one of the coloring layers is red, blue, or green, an image can be displayed using pixels of the four colors.

FIG. 3B illustrates an example in which the coloring layers (the red coloring layer 1034R, the green coloring layer 1034G and the blue coloring layer 1034B) are provided between the gate insulating film 1003 and the first interlayer insulating film 1020. As in the structure, the coloring layers may be provided between the substrate 1001 and the sealing substrate 1031.

Figure 4:
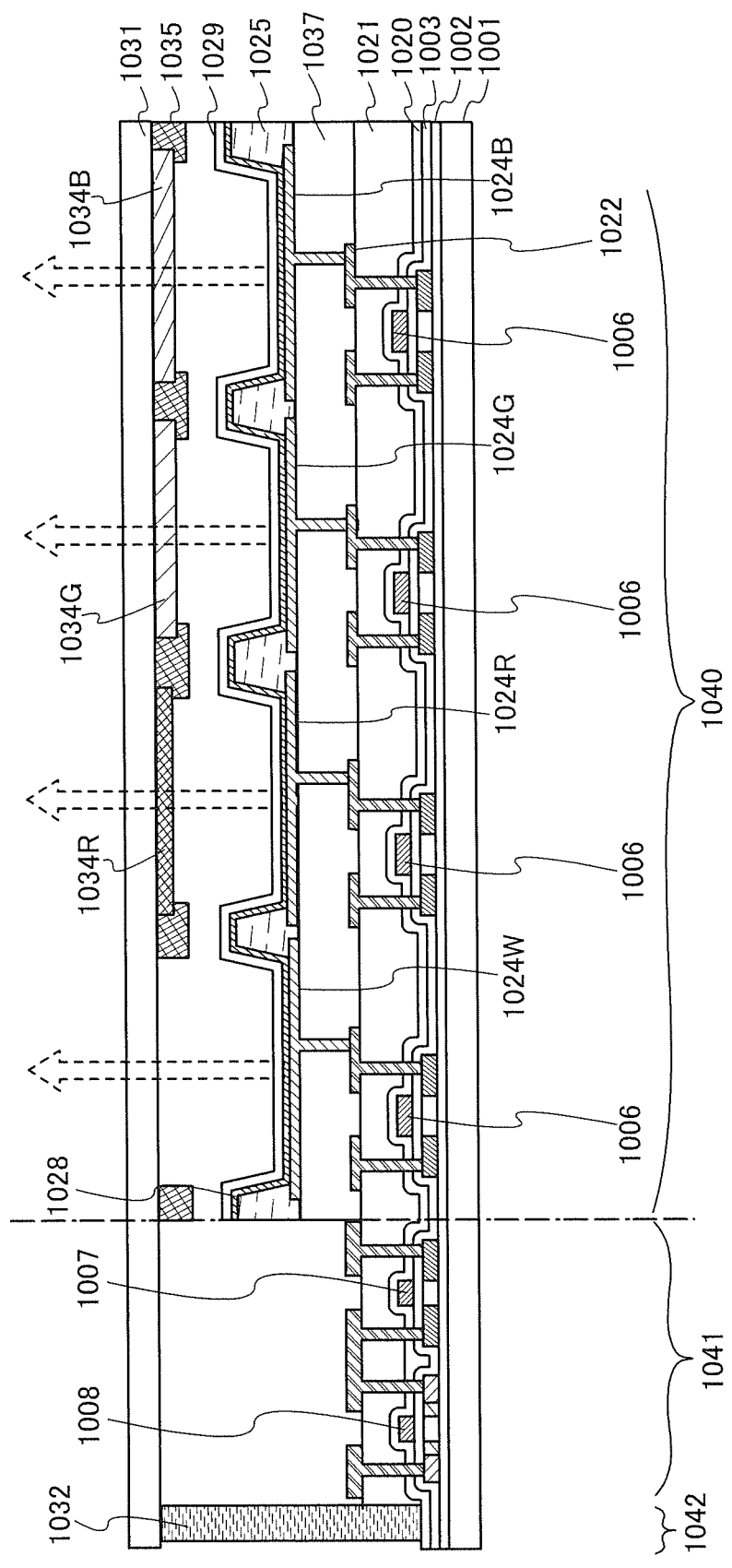
FIG. 4 is a conceptual diagram of an active matrix light-emitting device.

The above-described light-emitting device is a light-emitting device having a structure in which light is extracted from the substrate 1001 side where the TFTs are formed (a bottom emission structure), but may be a light-emitting device having a structure in which light is extracted from the sealing substrate 1031 side (a top emission structure). FIG. 4 is a cross-sectional view of a light-emitting device having a top emission structure. In this case, a substrate which does not transmit light can be used as the substrate 1001. The process up to the step of forming a connection electrode which connects the TFT and the anode of the light-emitting element is performed in a manner similar to that of the light-emitting device having a bottom emission structure. Then, a third interlayer insulating film 1037 is formed to cover an electrode 1022. This insulating film may have a planarization function. The third interlayer insulating film 1037 can be formed using a material similar to that of the second interlayer insulating film, and can alternatively be formed using any other known material.

The first electrodes 1024W, 1024R, 1024G, and 1024B of the light-emitting elements each function as an anode here, but may function as a cathode. Further, in the case of a light-emitting device having a top emission structure as illustrated in FIG. 4, the first electrodes are preferably reflective electrodes. The layer 1028 containing an organic compound is formed to have a structure similar to the structure of the layer 103 containing an organic compound, which is described in Embodiment 1, with which white light emission can be obtained.

In the case of a top emission structure as illustrated in FIG. 4, sealing can be performed with the sealing substrate 1031 on which the coloring layers (the red coloring layer 1034R, the green coloring layer 1034G and the blue coloring layer 1034B) are provided. The sealing substrate 1031 may be provided with the black layer (the black matrix) 1035 which is positioned between pixels. The coloring layers (the red coloring layer 1034R, the green coloring layer 1034G, and the blue coloring layer 1034B) and the black layer (the black matrix) 1035 may be covered with the overcoat layer as described in FIG. 3A. Note that a light-transmitting substrate is used as the sealing substrate 1031.

Further, although an example in which full color display is performed using four colors of red, green, blue, and white is shown here, there is no particular limitation and full color display using three colors of red, green, and blue may be performed.

The light-emitting device in this embodiment is manufactured using the light-emitting element described in Embodiment 1 and thus can have favorable characteristics. Specifically, since the light-emitting element described in Embodiment 1 has favorable emission efficiency, the light-emitting device can have reduced power consumption. In addition, light in desired wavelength ranges can be easily provided by the light-emitting element described in Embodiment 1, which makes it possible to provide a versatile light-emitting device.

Figure 5A:
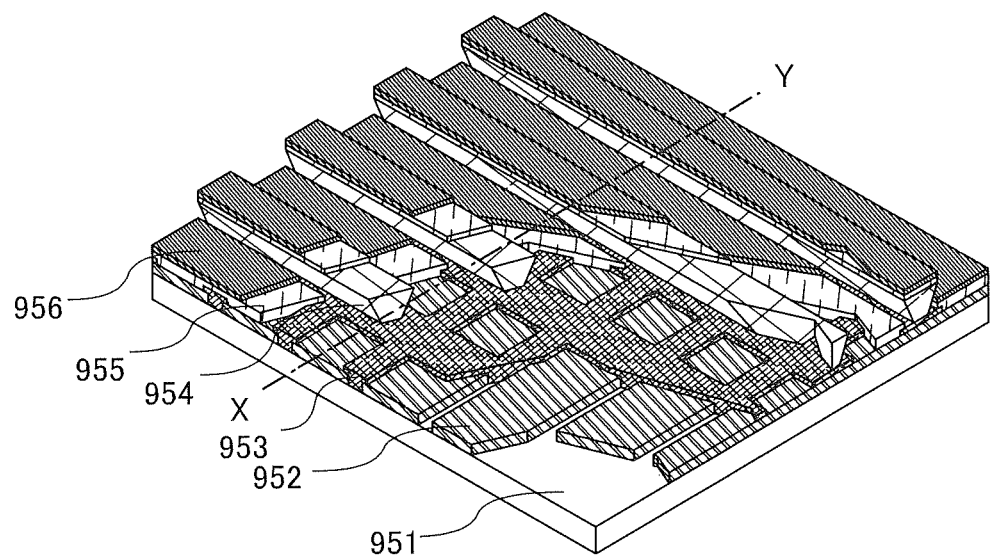
FIGS. 5A and 5B are conceptual diagrams of an active matrix light-emitting device.
Figure 5B:
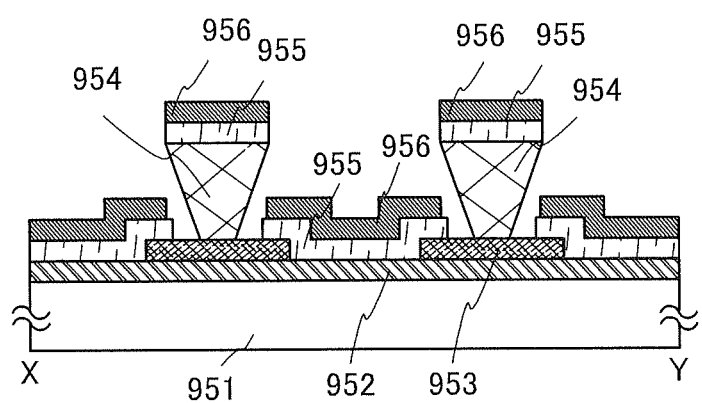

An active matrix light-emitting device is described above, whereas a passive matrix light-emitting device is described below. FIGS. 5A and 5B illustrate a passive matrix light-emitting device manufactured using the present invention. FIG. 5A is a perspective view of the light-emitting device, and FIG. 5B is a cross-sectional view of FIG. 5A taken along line X-Y. In FIGS. 5A and 5B, a layer 955 containing an organic compound is provided between an electrode 952 and an electrode 956 over a substrate 951. An end portion of the electrode 952 is covered with an insulating layer 953. A partition layer 954 is provided over the insulating layer 953. The sidewalls of the partition layer 954 slope such that the distance between both sidewalls is gradually narrowed toward the surface of the substrate. In other words, a cross section taken along the direction of the short side of the partition wall layer 954 is trapezoidal, and the lower side (a side which is in the same direction as a plane direction of the insulating layer 953 and in contact with the insulating layer 953) is shorter than the upper side (a side which is in the same direction as the plane direction of the insulating layer 953 and not in contact with the insulating layer 953. The partition layer 954 thus provided can prevent defects in the light-emitting element due to static electricity or the like. Furthermore, the passive matrix light-emitting device can also have lower power consumption by including the light-emitting element described in Embodiment 1, which has favorable emission efficiency. In addition, light in desired wavelength ranges can be easily provided by the light-emitting element described in Embodiment 1, which makes it possible to provide a versatile light-emitting device.

Since many minute light-emitting elements arranged in a matrix in the light-emitting device described above can each be controlled, the light-emitting device can be suitably used as a display device for displaying images.

This embodiment can be freely combined with any of other embodiments.

Embodiment 4

Figure 6A:
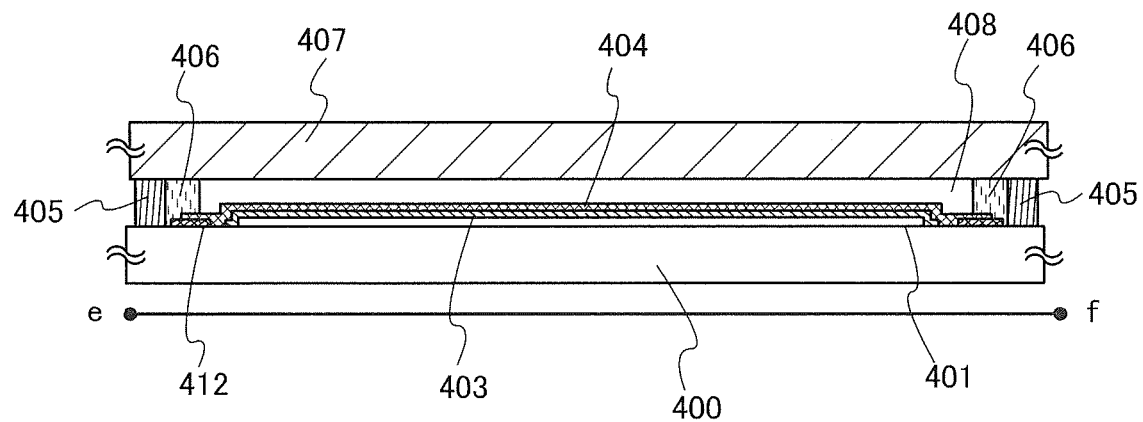
FIGS. 6A and 6B are conceptual diagrams of a lighting device.
Figure 6B:
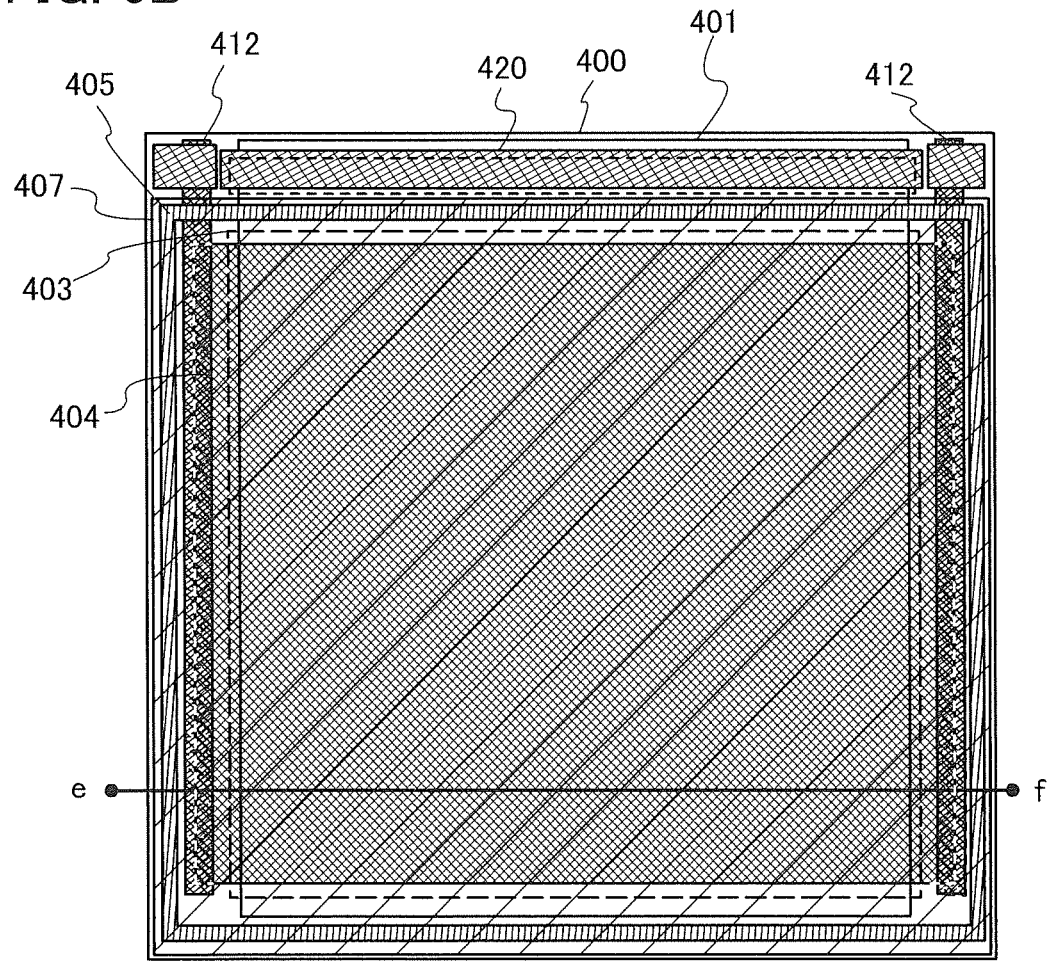

In this embodiment, an example in which the light-emitting element described in Embodiment 1 is used for a lighting device is described with reference to FIGS. 6A and 6B. FIG. 6B is a top view of the lighting device, and FIG. 6A is a cross-sectional view of FIG. 6B taken along line e-f.

In the lighting device in this embodiment, a first electrode 401 is formed over a substrate 400 which is a support and has a light-transmitting property. The first electrode 401 corresponds to the first electrode 101 in Embodiment 2. When light is extracted through the first electrode 401 side, the first electrode 401 is formed using a material having a light-transmitting property.

A pad 412 for applying voltage to a second electrode 404 is provided over the substrate 400.

A layer 403 containing an organic compound is formed over the first electrode 401. The structure of the layer 403 containing an organic compound corresponds to, for example, the structure of the layer 103 containing an organic compound in Embodiment 2, or the structure in which the light-emitting units 511 and 512 and the charge-generation layer 513 are combined. For these structures, the description in Embodiment 2 can be referred to.

The second electrode 404 is formed to cover the layer 403 containing an organic compound. The second electrode 404 corresponds to the second electrode 102 in Embodiment 2. The second electrode 404 is formed using a material having high reflectance when light is extracted through the first electrode 401 side. The second electrode 404 is connected to the pad 412, whereby voltage is applied thereto.

As described above, the lighting device described in this embodiment includes a light-emitting element including the first electrode 401, the layer 403 containing an organic compound, and the second electrode 404. Since the light-emitting element has high emission efficiency, the lighting device in this embodiment can have high emission efficiency.

The light-emitting element having the above structure is fixed to a sealing substrate 407 with sealing materials 405 and 406 and sealing is performed, whereby the lighting device is completed. It is possible to use only either the sealing material 405 or the sealing material 406. In addition, the inner sealing material 406 (not shown in FIG. 6B) can be mixed with a desiccant that enables moisture to be adsorbed, increasing reliability. Moreover, a space 408 between the sealing material and the substrate is filled with a high refractive index material such as a resin or a liquid crystal material, in which case the light extraction efficiency can be improved.

When parts of the pad 412 and the first electrode 401 are extended to the outside of the sealing materials 405 and 406, the extended parts can serve as external input terminals. An IC chip 420 mounted with a converter or the like may be provided over the external input terminals.

As described above, since the lighting device described in this embodiment includes the light-emitting element described in Embodiment 1 as an EL element, the lighting device can have high emission efficiency.

Embodiment 5

In this embodiment, examples of electronic devices each including the light-emitting element described in Embodiment 1 are described. The light-emitting element described in Embodiment 1 has high emission efficiency and accordingly, the electronic devices in this embodiment each of which includes the light-emitting element can have low power consumption.

Examples of the electronic device to which the above light-emitting element is applied include television devices (also referred to as TV or television receivers), monitors for computers and the like, cameras such as digital cameras and digital video cameras, digital photo frames, mobile phones (also referred to as cell phones or mobile phone devices), portable game machines, portable information terminals, audio playback devices, large game machines such as pachinko machines, and the like. Specific examples of these electronic devices are described below.

FIG. 7A illustrates an example of a television device. In the television device, a display portion 7103 is incorporated in a housing 7101. Here, the housing 7101 is supported by a stand 7105. Images can be displayed on the display portion 7103, and in the display portion 7103, the light-emitting elements described in Embodiment 1 are arranged in a matrix. The light-emitting elements can have high emission efficiency. Therefore, the television device including the display portion 7103 which is formed using the light-emitting element can have low power consumption.

The television device can be operated with an operation switch of the housing 7101 or a separate remote controller 7110. With operation keys 7109 of the remote controller 7110, channels and volume can be controlled and images displayed on the display portion 7103 can be controlled. Further, the remote controller 7110 may be provided with a display portion 7107 for displaying data output from the remote controller 7110.

Note that the television device is provided with a receiver, a modem, and the like. With the use of the receiver, general television broadcasting can be received. Moreover, when the television device is connected to a communication network with or without wires via the modem, one-way (from a sender to a receiver) or two-way (between a sender and a receiver or between receivers) information communication can be performed.

FIG. 7B1 illustrates a computer, which includes a main body 7201, a housing 7202, a display portion 7203, a keyboard 7204, an external connection port 7205, a pointing device 7206, and the like. Note that this computer is manufactured using light-emitting elements arranged in a matrix in the display portion 7203, which are the same as that described in Embodiment 1. The computer illustrated in FIG. 7B1 may have a structure illustrated in FIG. 7B2. The computer illustrated in FIG. 7B2 is provided with a second display portion 7210 instead of the keyboard 7204 and the pointing device 7206. The second display portion 7210 is a touchscreen, and input can be performed by operation of display for input on the second display portion 7210 with a finger or a dedicated pen. The second display portion 7210 can also display images other than the display for input. The display portion 7203 may also be a touchscreen. Connecting the two screens with a hinge can prevent troubles; for example, the screens can be prevented from being cracked or broken while the computer is being stored or carried. Note that this computer is manufactured using light-emitting elements arranged in a matrix in the display portion 7203, which are the same as that described in Embodiment 1. Therefore, this computer having the display portion 7203 which is formed using the light-emitting elements consumes less power.

FIG. 7C illustrates a portable game machine, which includes two housings, a housing 7301 and a housing 7302, which are connected with a joint portion 7303 so that the portable game machine can be opened or folded. The housing 7301 incorporates a display portion 7304 including the light-emitting elements each of which is described in Embodiment 1 and which are arranged in a matrix, and the housing 7302 incorporates a display portion 7305. In addition, the portable game machine illustrated in FIG. 7C includes a speaker portion 7306, a recording medium insertion portion 7307, an LED lamp 7308, an input unit (an operation key 7309, a connection terminal 7310, a sensor 7311 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), and a microphone 7312), and the like. Needless to say, the structure of the portable game machine is not limited to the above as long as the display portion including the light-emitting elements each of which is described in Embodiment 1 and which are arranged in a matrix is used as at least either the display portion 7304 or the display portion 7305, or both, and the structure can include other accessories as appropriate. The portable game machine illustrated in FIG. 7C has a function of reading out a program or data stored in a storage medium to display it on the display portion, and a function of sharing information with another portable game machine by wireless communication. The portable game machine illustrated in FIG. 7C can have a variety of functions without limitation to the above. The portable game machine having the display portion 7304 can have low power consumption because the light-emitting element described in Embodiment 1 is used in the display portion 7304.

FIG. 7D illustrates an example of a mobile phone. A mobile phone is provided with a display portion 7402 incorporated in a housing 7401, operation buttons 7403, an external connection port 7404, a speaker 7405, a microphone 7406, and the like. Note that the mobile phone has the display portion 7402 including the light-emitting elements each of which is described in Embodiment 1 and which are arranged in a matrix. Accordingly, the mobile phone can have low power consumption.

When the display portion 7402 of the mobile phone illustrated in FIG. 7D is touched with a finger or the like, data can be input into the mobile phone. In this case, operations such as making a call and creating e-mail can be performed by touch on the display portion 7402 with a finger or the like.

There are mainly three screen modes of the display portion 7402. The first mode is a display mode mainly for displaying images. The second mode is an input mode mainly for inputting data such as text. The third mode is a display-and-input mode in which two modes of the display mode and the input mode are combined.

For example, in the case of making a call or composing e-mail, a text input mode mainly for inputting text is selected for the display portion 7402 so that text displayed on a screen can be inputted. In this case, it is preferable to display a keyboard or number buttons on the screen of the display portion 7402.

When a detection device which includes a sensor for detecting inclination, such as a gyroscope or an acceleration sensor, is provided inside the mobile phone, the direction of the mobile phone (whether the mobile phone is placed horizontally or vertically for a landscape mode or a portrait mode) is determined so that display on the screen of the display portion 7402 can be automatically switched.

The screen modes are switched by touching the display portion 7402 or operating the operation buttons 7403 of the housing 7401. Alternatively, the screen modes can be switched depending on the kinds of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed within a specified period while a signal detected by an optical sensor in the display portion 7402 is detected, the screen mode may be controlled so as to be switched from the input mode to the display mode.

The display portion 7402 may function as an image sensor. For example, an image of a palm print, a fingerprint, or the like is taken by touch on the display portion 7402 with the palm or the finger, whereby personal authentication can be performed. Further, by providing a backlight or a sensing light source which emits a near-infrared light in the display portion, an image of a finger vein, a palm vein, or the like can be taken.

Note that the structure described in this embodiment can be combined with any of the structures described in Embodiments 1 to 4 as appropriate.

As described above, the application range of the light-emitting device including the light-emitting element described in Embodiment 1 is extremely wide; therefore, the light-emitting device can be applied to electronic devices of a variety of fields. By using the light-emitting element described in Embodiment 1, an electronic device having low power consumption can be obtained.

Figure 8:
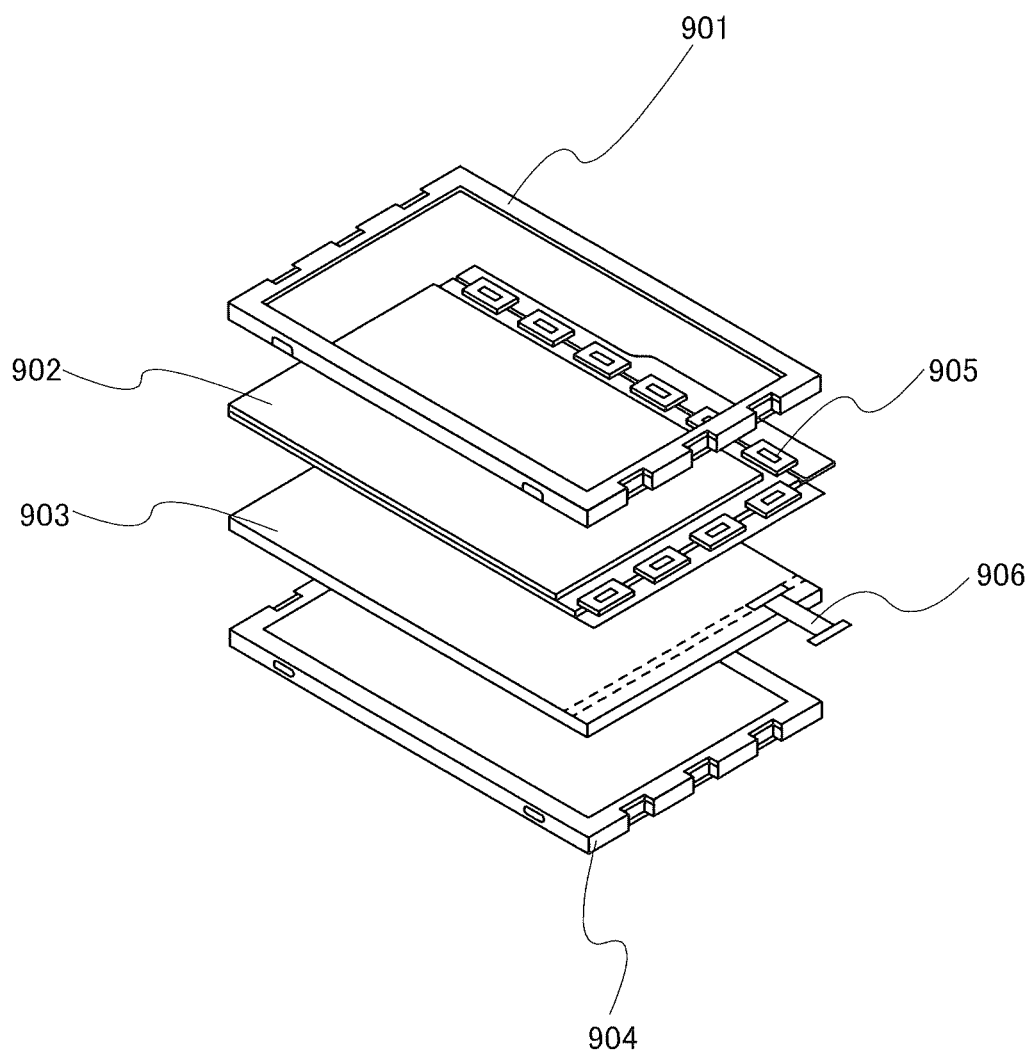
FIG. 8 illustrates an electronic device.

FIG. 8 illustrates an example of a liquid crystal display device using the light-emitting element described in Embodiment 1 for a backlight. The liquid crystal display device shown in FIG. 8 includes a housing 901, a liquid crystal layer 902, a backlight unit 903, and a housing 904. The liquid crystal layer 902 is connected to a, driver IC 905. The light-emitting element described in Embodiment 1 is used for the backlight unit 903, to which current is supplied through a terminal 906.

The light-emitting element described in Embodiment 1 is used for the backlight of the liquid crystal display device; thus, the backlight can have reduced power consumption. In addition, the use of the light-emitting element described in Embodiment 1 enables manufacture of a planar-emission lighting device and further a larger-area planar-emission lighting device; therefore, the backlight can be a larger-area backlight, and the liquid crystal display device can also be a larger-area device. Furthermore, the light-emitting device using the light-emitting element described in Embodiment 1 can be thinner than a conventional one; accordingly, the display device can also be thinner.

Figure 9:
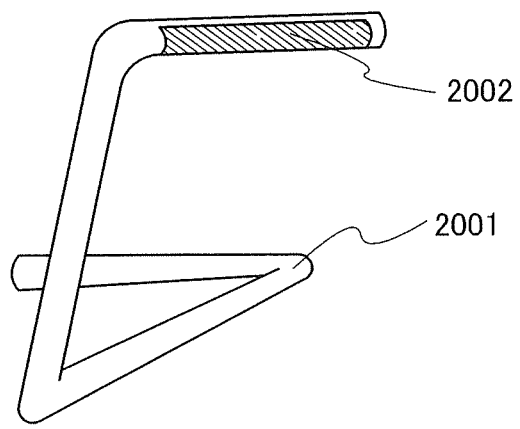
FIG. 9 illustrates a lighting device.

FIG. 9 illustrates an example in which the light-emitting element described in Embodiment 1 is used for a table lamp which is a lighting device. The table lamp illustrated in FIG. 9 includes a housing 2001 and a light source 2002, and the lighting device described in Embodiment 4 is used for the light source 2002.

Figure 10:
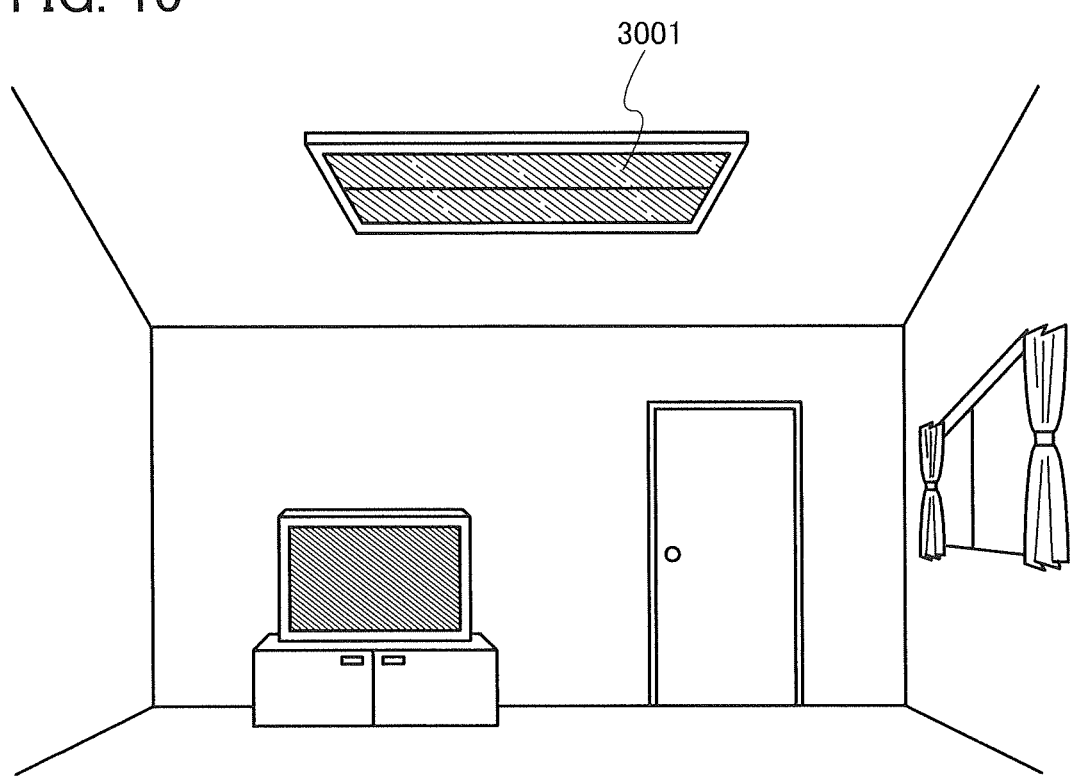
FIG. 10 illustrates a lighting device.

FIG. 10 illustrates an example in which the light-emitting element described in Embodiment 1 is used for an indoor lighting device 3001. Since the light-emitting element described in Embodiment 1 has low power consumption, a lighting device having low power consumption can be obtained. Further, since the light-emitting element described in Embodiment 1 can have a large area, the light-emitting element can be used for a large-area lighting device. Furthermore, since the light-emitting element described in Embodiment 1 is thin, the light-emitting element can be used for a lighting device having a reduced thickness.

Figure 11:
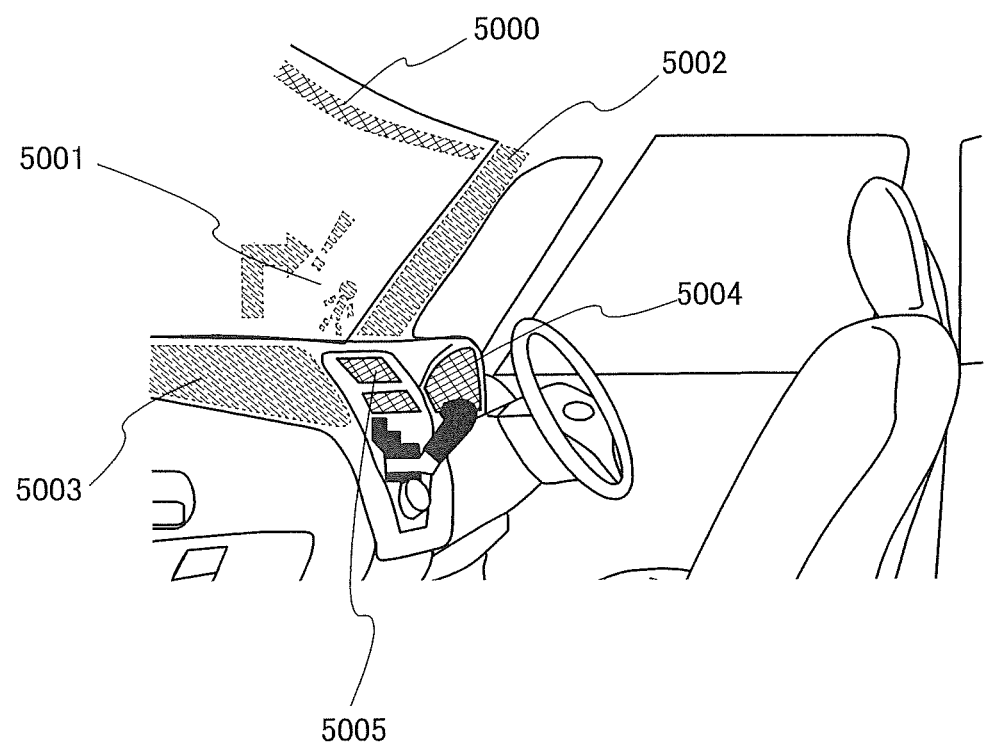
FIG. 11 illustrates in-vehicle display devices and lighting devices.

The light-emitting element described in Embodiment 1 can also be used for an automobile windshield or an automobile dashboard. FIG. 11 illustrates one mode in which the light-emitting element described in Embodiment 1 is used for an automobile windshield and an automobile dashboard. Display regions 5000 to 5005 each include the light-emitting element described in Embodiment 1.

The display regions 5000 and the display region 5001 display devices which are provided in the automobile windshield and in which the light-emitting element described in Embodiment 1 is incorporated. The light-emitting element described in Embodiment 1 can be formed into what is called a see-through display device, through which the opposite side can be seen, by including a first electrode and a second electrode formed of electrodes having light-transmitting properties. Such see-through display devices can be provided even in the automobile windshield, without hindering the vision. Note that in the case where a transistor for driving or the like is provided, a transistor having a light-transmitting property, such as an organic transistor using an organic semiconductor material or a transistor using an oxide semiconductor, is preferably used.

A display device incorporating the light-emitting element described in Embodiment 1 is provided in the display region 5002 in a pillar portion. The display region 5002 can compensate for the view hindered by the pillar portion by showing an image taken by an imaging unit provided in the car body. Similarly, the display region 5003 provided in the dashboard can compensate for the view hindered by the car body by showing an image taken by an imaging unit provided in the outside of the car body, which leads to elimination of blind areas and enhancement of safety. Showing an image so as to compensate for the area which a driver cannot see makes it possible for the driver to confirm safety easily and comfortably.

The display region 5004 and the display region 5005 can provide a variety of kinds of information such as navigation data, a speedometer, a tachometer, a mileage, a fuel meter, a gearshift indicator, and air-condition setting. The content or layout of the display can be changed freely by a user as appropriate. Further, such information can also be shown by the display regions 5000 to 5003. Note that the display regions 5000 to 5005 can also be used as lighting devices.

The light-emitting element described in Embodiment 1 can have low power consumption.

For that reason, load on a battery is small even when a number of large screens such as the display regions 5000 to 5005 are provided, which provides comfortable use. For that reason, the light-emitting device and the lighting device each of which includes the light-emitting element described in Embodiment 1 can be suitably used as an in-vehicle light-emitting device and an in-vehicle lighting device.

Figure 12A:
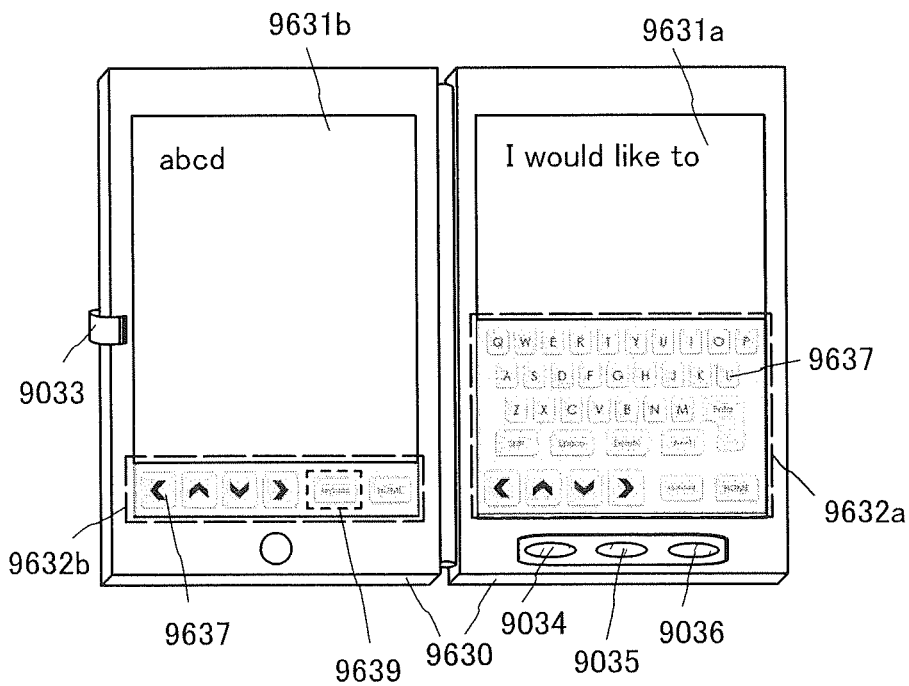
FIGS. 12A to 12C illustrate an electronic device.
Figure 12B:
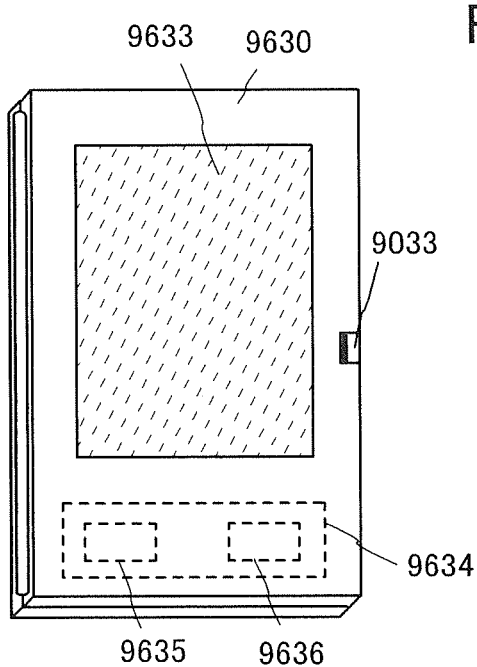

FIGS. 12A and 12B illustrate an example of a foldable tablet terminal. The tablet terminal is opened in FIG. 12A. The tablet terminal includes a housing 9630, a display portion 9631a, a display portion 9631b, a display mode switch 9034, a power switch 9035, a power saver switch 9036, and a clasp 9033. Note that in the tablet terminal, one or both of the display portion 9631a and the display portion 9631b is/are formed using a light-emitting device which includes the light-emitting element described in Embodiment 1.

Part of the display portion 9631a can be a touchscreen region 9632a and data can be input when a displayed operation key 9037 is touched. Although half of the display portion 9631a has only a display function and the other half has a touchscreen function, one embodiment of the present invention is not limited to the structure. The whole display portion 9631a may have a touchscreen function. For example, a keyboard can be displayed on the entire region of the display portion 9631a so that the display portion 9631a is used as a touchscreen, and the display portion 9631b can be used as a display screen.

Like the display portion 9631a, part of the display portion 9631b can be a touchscreen region 9632b. A switching button 9639 for showing/hiding a keyboard of the touchscreen is touched with a finger, a stylus, or the like, so that keyboard buttons can be displayed on the display portion 9631b.

Touch input can be performed in the touchscreen region 9632a and the touchscreen region 9632b at the same time.

The display mode switch 9034 can switch the display between portrait mode, landscape mode, and the like, and between monochrome display and color display, for example. With the power saver switch 9036, the luminance of display can be optimized in accordance with the amount of external light at the time when the tablet terminal is in use, which is detected with an optical sensor incorporated in the tablet terminal. The tablet terminal may include another detection device such as a sensor for detecting orientation (e.g., a gyroscope or an acceleration sensor) in addition to the optical sensor.

Although FIG. 12A illustrates an example in which the display portion 9631a and the display portion 9631b have the same display area, one embodiment of the present invention is not limited to the example. The display portion 9631a and the display portion 9631b may have different display areas and different display quality. For example, one of them may be a display panel that can display higher-definition images than the other.

The tablet terminal is folded in FIG. 12B. The tablet terminal includes the housing 9630, a solar cell 9633, a charge and discharge control circuit 9634, a battery 9635, and a DC-to-DC converter 9636. Note that FIG. 12B illustrates an example in which the charge and discharge control circuit 9634 includes the battery 9635 and the DC-to-DC converter 9636.

Since the tablet terminal can be folded, the housing 9630 can be closed when not in use. Thus, the display portions 9631a and 9631b can be protected, thereby providing a tablet terminal with high endurance and high reliability for long-term use.

In addition, the tablet terminal illustrated in FIGS. 12A and 12B can have a function of displaying various kinds of information (e.g., a still image, a moving image, and a text image) on the display portion, a function of displaying a calendar, the date, the time, or the like on the display portion, a touch input function of operating or editing information displayed on the display portion by touch input, a function of controlling processing by various kinds of software (programs), and the like.

The solar cell 9633, which is attached on the surface of the tablet terminal, supplies electric power to a touchscreen, a display portion, an image signal processor, and the like. Note that the solar cell 9633 is preferably provided on one or two surfaces of the housing 9630, in which case the battery 9635 can be charged efficiently.

Figure 12C:
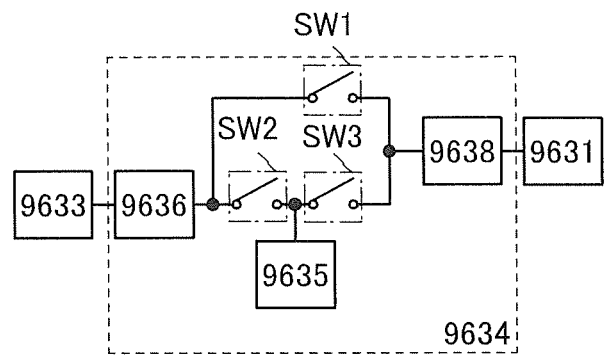

The structure and operation of the charge and discharge control circuit 9634 illustrated in FIG. 12B are described with reference to a block diagram of FIG. 12C. FIG. 12C shows the solar cell 9633, the battery 9635, the DC-to-DC converter 9636, a converter 9638, switches SW1 to SW3, and the display portion 9631. The battery 9635, the DC-to-DC converter 9636, the converter 9638, and the switches SW1 to SW3 correspond to the charge and discharge control circuit 9634 in FIG. 12B.

First, an example of operation in the case where power is generated by the solar cell 9633 using external light is described. The voltage of power generated by the solar cell is raised or lowered by the DC-to-DC converter 9636 so that the power has voltage for charging the battery 9635. Then, when power supplied from the battery 9635 charged by the solar cell 9633 is used for the operation of the display portion 9631, the switch SW1 is turned on and the voltage of the power is raised or lowered by the converter 9638 so as to be voltage needed for the display portion 9631. In addition, when display on the display portion 9631 is not performed, the switch SW1 is turned off and a switch SW2 is turned on so that charge of the battery 9635 may be performed.

Although the solar cell 9633 is described as an example of a power generation unit, the power generation unit is not particularly limited, and the battery 9635 may be charged by another power generation unit such as a piezoelectric element or a thermoelectric conversion element (Peltier element). The battery 9635 may be charged by a non-contact power transmission module which is capable of charging by transmitting and receiving power by wireless (without contact), or any of the other charge unit used in combination, and the power generation unit is not necessarily provided.

One embodiment of the present invention is not limited to the tablet terminal having the shape illustrated in FIGS. 12A to 12C as long as the display portion 9631 is included.

Example 1

In this example, a light-emitting element of one embodiment of the present invention (a light-emitting element 1) and a comparative light-emitting element 1 will be described. In the light-emitting layer 113 of the light-emitting element 1, N-(1,1'-biphenyl-4-yl)-9,9-dimethyl-N-[4-(9-phenyl-9H-carbazol-3-yl)phenyl]-9H-fluor en-2-amine (abbreviation: PCBBiF), which is an arylamine that includes both a group including a p-biphenyl skeleton and a fluoren-2-yl skeleton, is used as the second organic compound, and 5,6,11,12-tetraphenylnaphthacene (trivial name: rubrene) is used as a light-emitting substance. The light-emitting layer 113 of the comparative light-emitting element 1 does not use the second organic compound, and includes only the first organic compound and rubrene serving as a light-emitting substance. In each of the light-emitting element 1 and the comparative light-emitting element 1, 4,6mCzP2Pm is used as the first organic compound. Chemical formulae of materials used in this example are shown below.

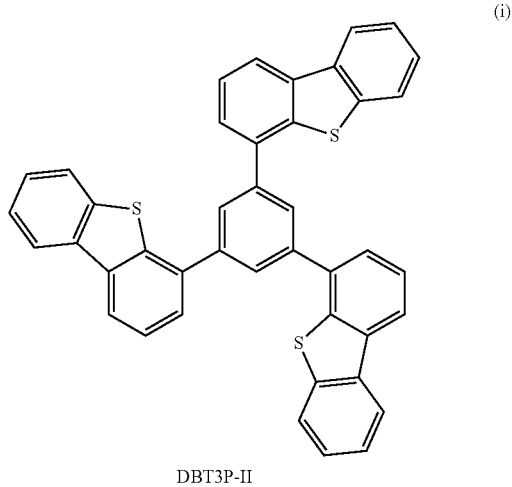

(i)

DBT3P-II

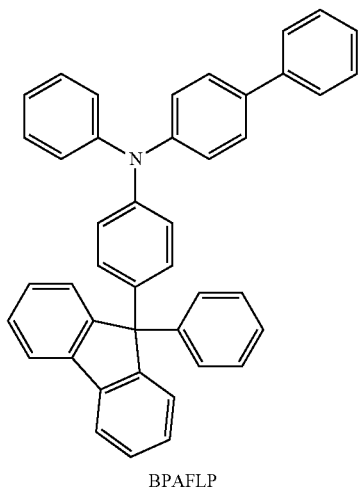

BPAFLP

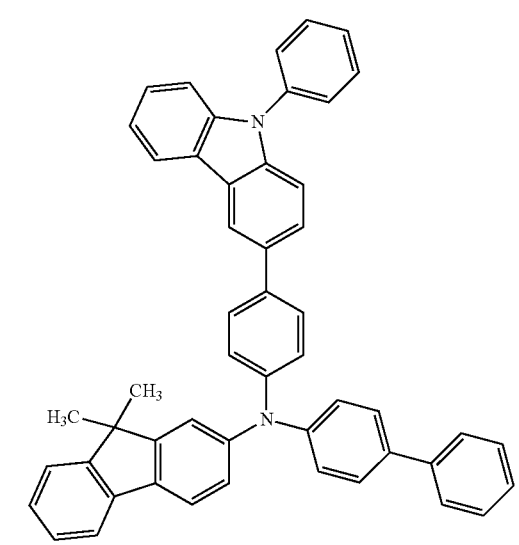

PCBBiF

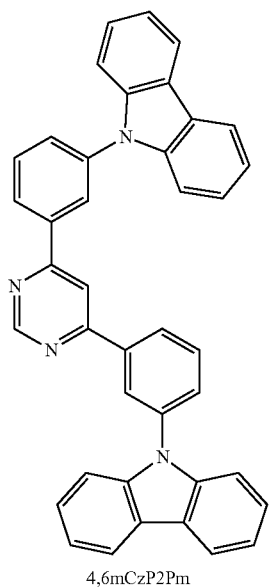

4,6mCzP2Pm

Ruburene

BPhen

Methods for fabricating the light-emitting element 1 and the comparative light-emitting element 1 will be described below.

(Method for Fabricating Light-Emitting Element 1)

First, a film of indium tin oxide containing silicon oxide (ITSO) was formed over a glass substrate by a sputtering method, so that the first electrode 101 was formed. The thickness thereof was 110 nm and the electrode area was 2 mm×2 mm. Here, the first electrode 101 is an electrode that functions as an anode of the light-emitting element.

Next, as pretreatment for forming the light-emitting element over the substrate, UV ozone treatment was performed for 370 seconds after washing of a surface of the substrate with water and baking that was performed at 200° C. for 1 hour.

After that, the substrate was transferred into a vacuum evaporation apparatus where the pressure had been reduced to approximately $10^{-4}$ Pa, and was subjected to vacuum baking at 170° C. for 30 minutes in a heating chamber of the vacuum evaporation apparatus, and then the substrate was cooled down for approximately 30 minutes.

Then, the substrate over which the first electrode 101 was formed was fixed to a substrate holder provided in the vacuum evaporation apparatus so that the surface on which the first electrode 101 was formed faced downward. The pressure in the vacuum evaporation apparatus was reduced to approximately $10^{-4}$ Pa. After that, over the first electrode 101, 4,4',4''-(benzene-1,3,5-triyl)tri(dibenzothiophene) (abbreviation: DBT3P-II) represented by Structural Formula (i) and molybdenum(VI) oxide were deposited by co-evaporation by an evaporation method using resistance heating, so that the hole-injection layer 111 was formed. The thickness of the hole-injection layer 111 was set to 20 nm, and the weight ratio of DBT3P-II to molybdenum oxide was adjusted to 4:2. Note that the co-evaporation method refers to an evaporation method in which evaporation is carried out from a plurality of evaporation sources at the same time in one treatment chamber.

Next, a film of 4-phenyl-4'-(9-phenylfluoren-9-yl)triphenylamine (abbreviation: BPAFLP) which is represented by Structural Formula (ii) was formed to a thickness of 20 nm over the hole-injection layer 111 to form the hole-transport layer 112.

Then, 4,6mCzP2Pm represented by Structural Formula (iii), PCBBiF represented by Structural Formula (iv), and rubrene represented by Structural Formula (v) were co-evaporated to a thickness of 40 nm over the hole-transport layer 112 to form the light-emitting layer 113. The weight ratio was 0.8:0.2:0.0075 (=4,6mCzP2Pm: PCBBiF: rubrene).

Then, the electron-transport layer 114 was formed over the light-emitting layer 113 in such a way that a 10 nm thick film of 4,6mCzP2Pm was formed and a 15 nm thick film of bathophenanthroline (abbreviation: BPhen) represented by Structural Formula (vi) was formed.

After the formation of the electron-transport layer 114, lithium fluoride (LiF) was deposited by evaporation to a thickness of 1 nm, so that the electron-injection layer 115 was formed. Lastly, aluminum was deposited by evaporation to a thickness of 200 nm to form the second electrode 102 functioning as a cathode. Thus, the light-emitting element 1 in this example was fabricated.

Note that in all the above evaporation steps, evaporation was performed by a resistance-heating method.

(Method for Fabricating Comparative Light-Emitting Element 1)

The light-emitting layer 113 of the comparative light-emitting element 1 was formed in such a way that 4,6mCzP2Pm and rubrene were co-evaporated to a thickness of 40 nm with a weight ratio of 1:0.005 (=4,6mCzP2Pm: rubrene). Materials and structures of the other components are the same as those of the light-emitting element 1. That is, the comparative light-emitting element 1 can be regarded as the light-emitting element 1 that does not use the second organic compound.

The light-emitting element 1 and the comparative light-emitting element 1 were each sealed using a glass substrate in a glove box containing a nitrogen atmosphere so as not to be exposed to the air (specifically, a sealing material was applied onto an outer edge of the element, and at the time of sealing, first, UV treatment was performed and then heat treatment was performed at 80° C. for 1 hour). Then, initial characteristics of these light-emitting elements were measured. Note that the measurements were carried out at room temperature (in an atmosphere kept at 25° C.).

Figure 13:
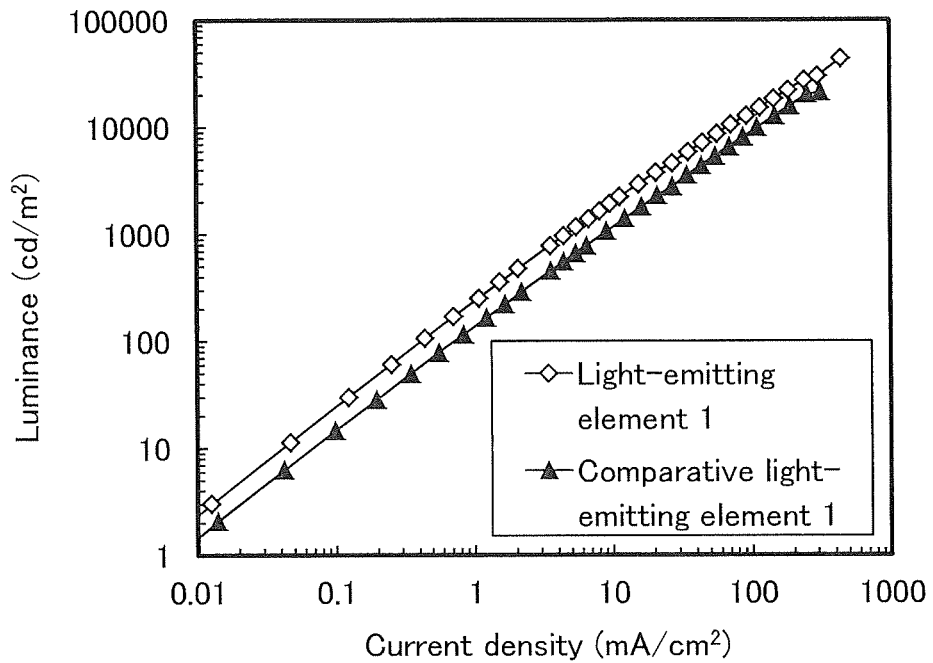
FIG. 13 shows luminance-current density characteristics of a light-emitting element 1 and a comparative light-emitting element 1.
Figure 14:
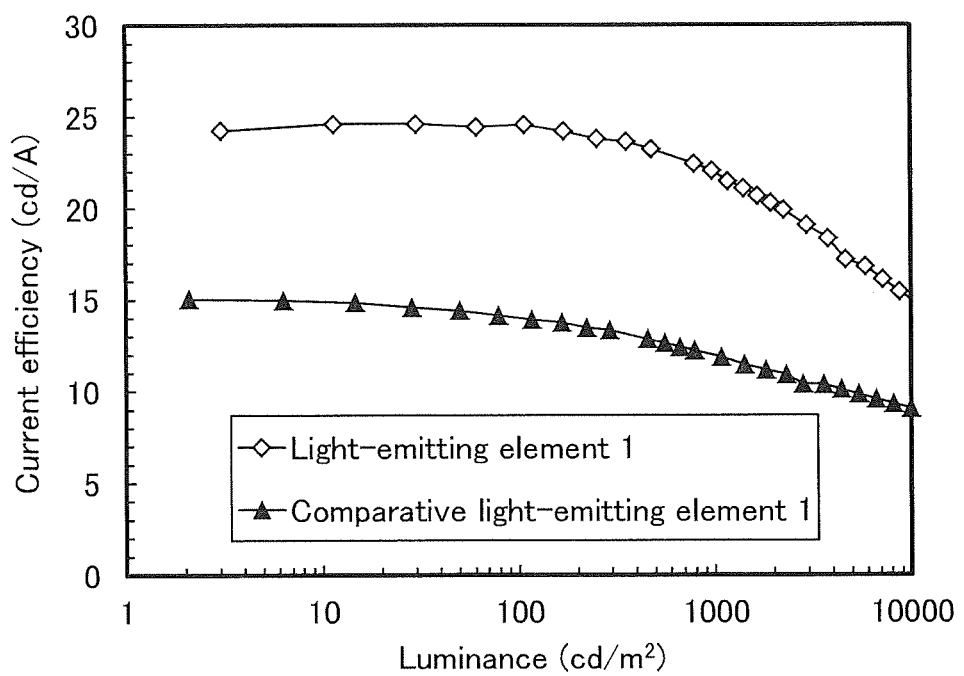
FIG. 14 shows current efficiency-luminance characteristics of the light-emitting element 1 and the comparative light-emitting element 1.
Figure 15:
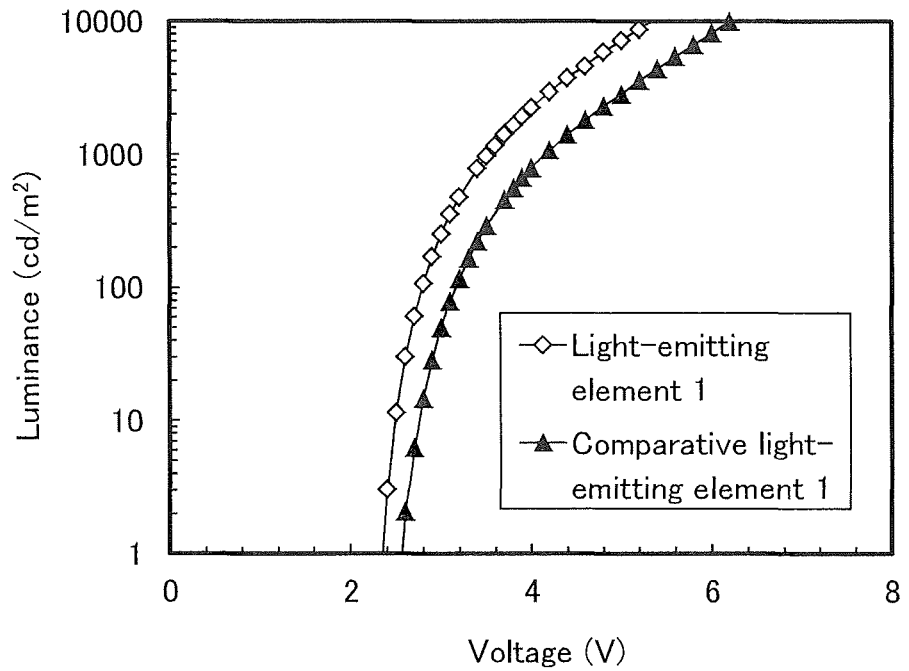
FIG. 15 shows luminance-voltage characteristics of the light-emitting element 1 and the comparative light-emitting element 1.
Figure 16:
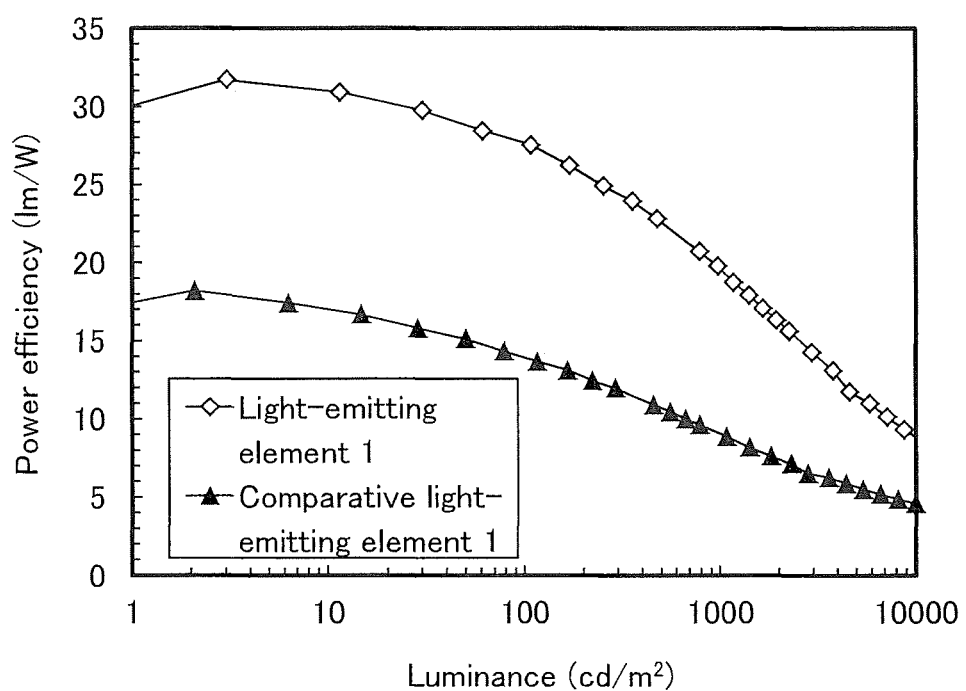
FIG. 16 shows power efficiency-luminance characteristics of the light-emitting element 1 and the comparative light-emitting element 1.
Figure 17:
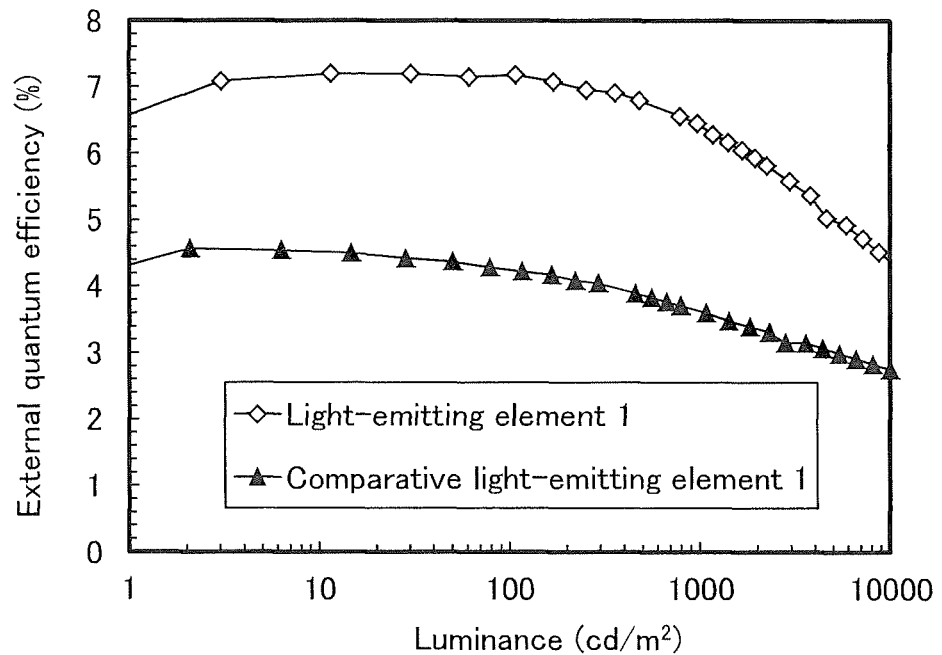
FIG. 17 shows external quantum efficiency-luminance characteristics of the light-emitting element 1 and the comparative light-emitting element 1.
Figure 18:
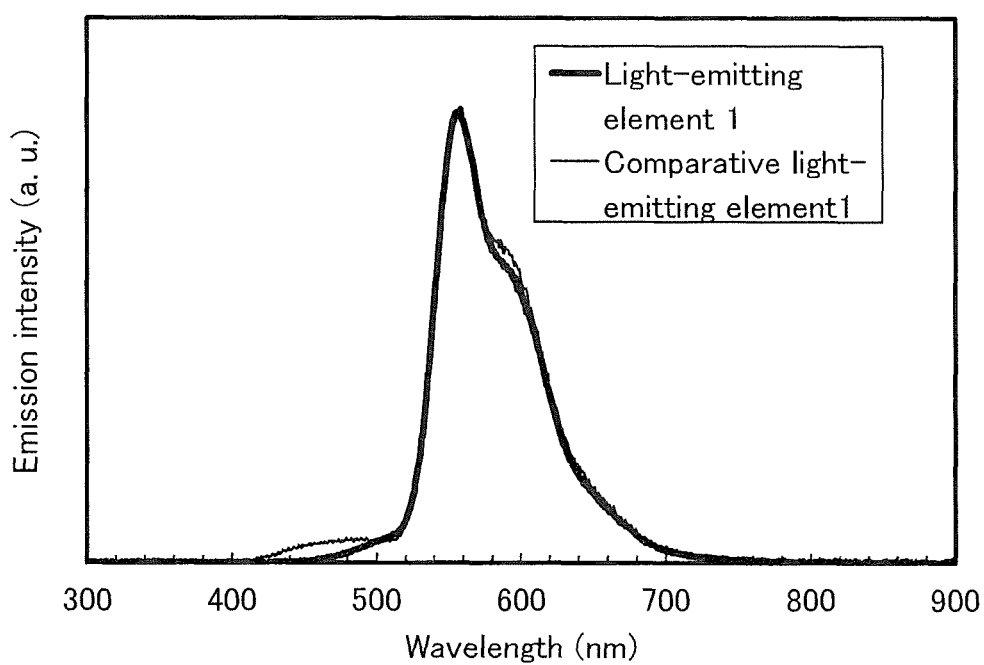
FIG. 18 shows emission spectra of the light-emitting element 1 and the comparative light-emitting element 1.

FIG. 13 shows current density-luminance characteristics of the light-emitting element 1 and the comparative light-emitting element 1; FIG. 14 shows luminance-current efficiency characteristics thereof; FIG. 15 shows voltage-luminance characteristics thereof; FIG. 16 shows luminance-power efficiency characteristics thereof; FIG. 17 shows luminance-external quantum efficiency characteristics thereof; and FIG. 18 shows emission spectra thereof.

Table 1 shows values of major characteristics of the light-emitting element 1 and the comparative light-emitting element 1 at approximately 1000 cd/m².

TABLE 1

| | Voltage (V) | Current (mA) | Current density (mA/cm²) | Chromaticity x | Chromaticity y | Current efficiency (cd/A) | Power efficiency (lm/W) | External quantum efficiency (%) |
|---|---|---|---|---|---|---|---|---|
| Light-emitting element 1 | 3.5 | 0.18 | 4.4 | 0.47 | 0.52 | 22.1 | 19.8 | 6.5 |
| Comparative light-emitting element 1 | 4.2 | 0.36 | 9.1 | 0.47 | 0.50 | 11.9 | 8.9 | 3.6 |

The above results show that the light-emitting element 1 that uses PCBBiF, which is an arylamine that includes both a group including a p-biphenyl skeleton and a fluoren-2-yl skeleton, as the second organic compound has more favorable characteristics than the comparative light-emitting element 1 that does not contain the second organic compound. Specifically, in the light-emitting element 1, the current efficiency, power efficiency, and external quantum efficiency were improved and the driving voltage was decreased.

FIG. 17 shows that the external quantum efficiency of the light-emitting element 1 exceeds 7%. The reason for this extremely favorable characteristic is because the first and second organic compounds form an exciplex and energy of the exciplex transfers to rubrene efficiently. In addition, the high emission efficiency of 7% or higher indicates that reverse intersystem crossing of triplet excitation energy from a triplet excited level to a singlet excited level occurs in the exciplex and singlet excitation energy generated at this time contributes to light emission of rubrene.

Figure 19:
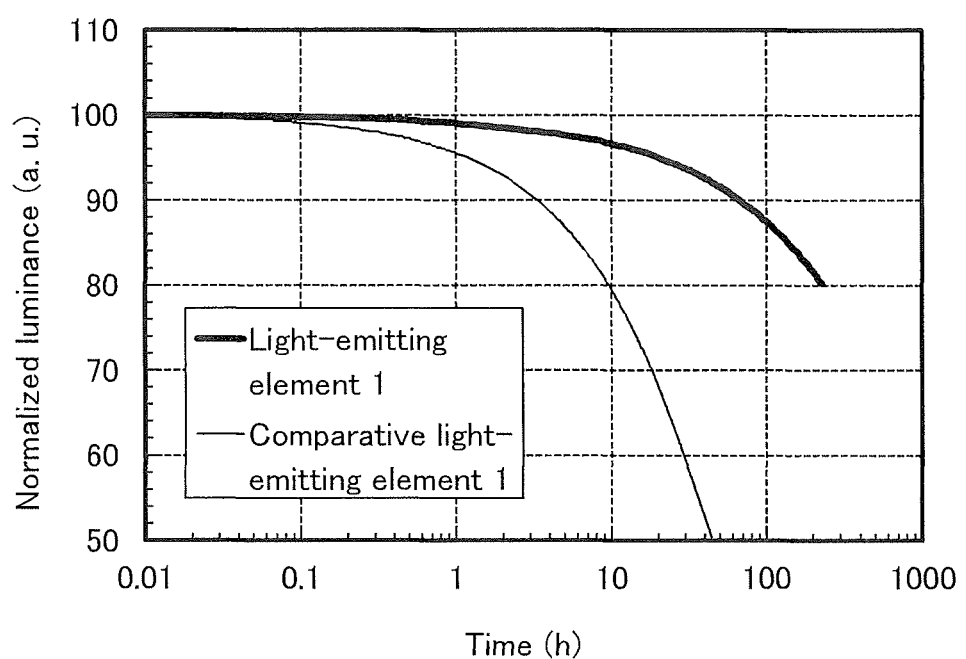
FIG. 19 shows time dependences of normalized luminances of the light-emitting element 1 and the comparative light-emitting element 1.

FIG. 19 shows the results of a reliability test in which each of the light-emitting element 1 and the comparative light-emitting element 1 was driven under conditions that the initial luminance was 1000 cd/m² and the current density was constant. FIG. 19 shows a change in normalized luminance from an initial luminance of 1. The results show that a decrease in luminance over driving time of the light-emitting element 1 is smaller than that of the comparative light-emitting element 1, and thus the light-emitting element 1 has favorable reliability.

Example 2

In this example, a light-emitting element of one embodiment of the present invention (a light-emitting element 2) and a comparative light-emitting element 2 will be described. In the light-emitting layer 113 of the light-emitting element 2, N-(1,1'-biphenyl-4-yl)-9,9-dimethyl-N-[4-(9-phenyl-9H-carbazol-3-yl)phenyl]-9H-fluoren-2-amine (abbreviation: PCBBiF), which is an arylamine that includes both a group including a p-biphenyl skeleton and a fluoren-2-yl skeleton, is used as the second organic compound, and 3-(benzothiazol-2-yl)-7-diethylaminocoumarin (trivial name: coumarin 6) is used as a light-emitting substance. The light-emitting layer 113 of the comparative light-emitting element 2 does not use the second organic compound, and includes only the first organic compound and coumarin 6 serving as a light-emitting substance. In each of the light-emitting element 2 and the comparative light-emitting element 2, 4,6mCzP2Pm is used as the first organic compound. Chemical formulae of materials used in this example are shown below.

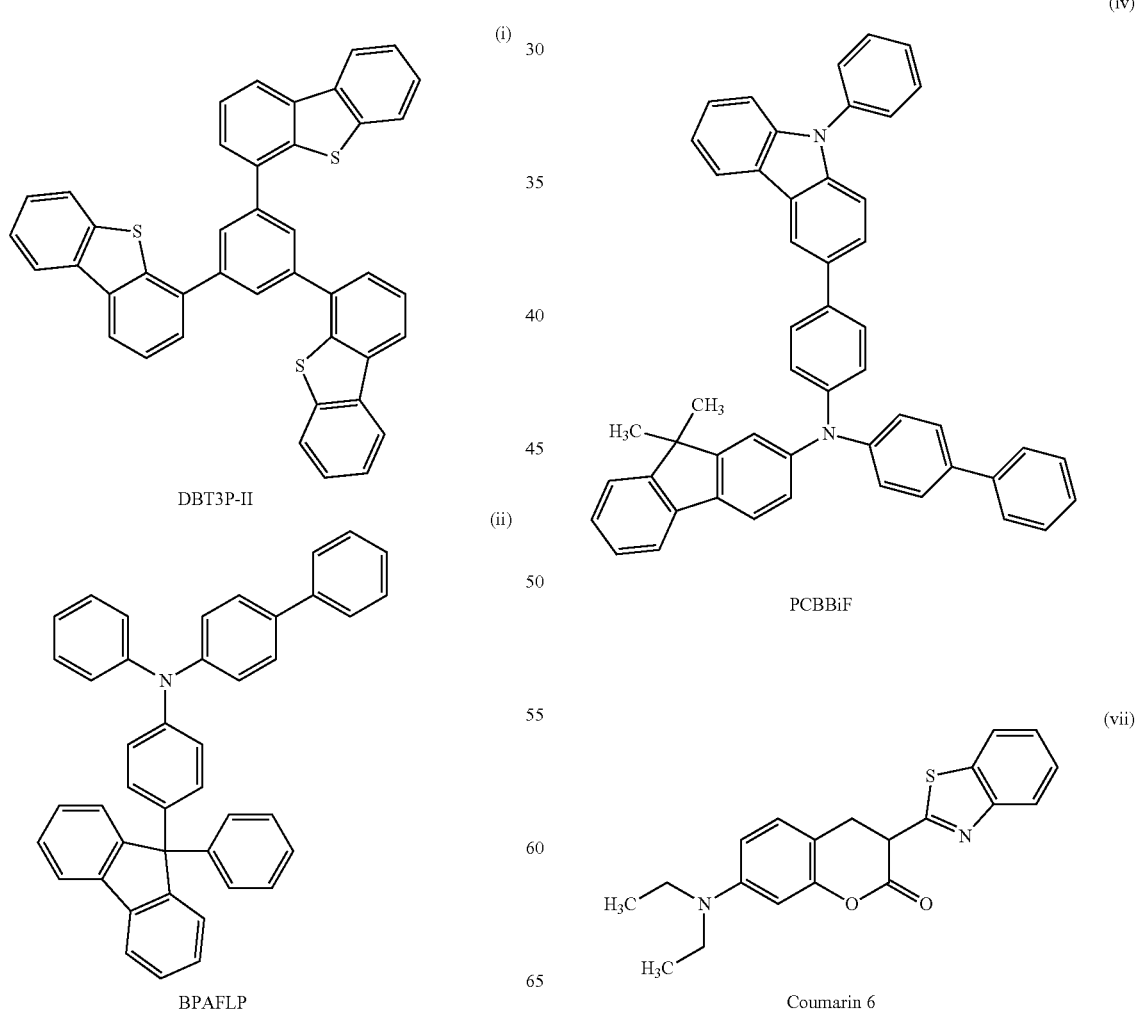

-continued

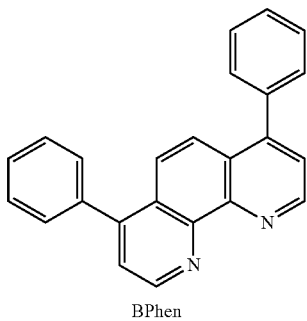

BPhen
(vi)

Methods for fabricating the light-emitting element 2 and the comparative light-emitting element 2 will be described below.

(Method for Fabricating Light-emitting Element 2)

First, a film of indium tin oxide containing silicon oxide (ITSO) was formed over a glass substrate by a sputtering method, so that the first electrode 101 was formed. The thickness thereof was 110 nm and the electrode area was 2 mm×2 mm. Here, the first electrode 101 is an electrode that functions as an anode of the light-emitting element.

Next, as pretreatment for forming the light-emitting element over the substrate, UV ozone treatment was performed for 370 seconds after washing of a surface of the substrate with water and baking that was performed at 200° C. for 1 hour.

After that, the substrate was transferred into a vacuum evaporation apparatus where the pressure had been reduced to approximately $10^{-4}$ Pa, and was subjected to vacuum baking at 170° C. for 30 minutes in a heating chamber of the vacuum evaporation apparatus, and then the substrate was cooled down for approximately 30 minutes.

Then, the substrate over which the first electrode 101 was formed was fixed to a substrate holder provided in the vacuum evaporation apparatus so that the surface on which the first electrode 101 was formed faced downward. The pressure in the vacuum evaporation apparatus was reduced to approximately $10^{-4}$ Pa. After that, over the first electrode 101, 4,4',4''-(benzene-1,3,5-triyl)tri(dibenzothiophene) (abbreviation: DBT3P-II) represented by Structural Formula (i) and molybdenum(VI) oxide were deposited by co-evaporation by an evaporation method using resistance heating, so that the hole-injection layer 111 was formed. The thickness of the hole-injection layer 111 was set to 20 nm, and the weight ratio of DBT3P-II to molybdenum oxide was adjusted to 4:2. Note that the co-evaporation method refers to an evaporation method in which evaporation is carried out from a plurality of evaporation sources at the same time in one treatment chamber.

Next, a film of 4-phenyl-4'-(9-phenylfluoren-9-yl)triphenylamine (abbreviation: BPAFLP) which is represented by Structural Formula (ii) was formed to a thickness of 20 nm over the hole-injection layer 111 to form the hole-transport layer 112.

Then, 4,6mCzP2Pm represented by Structural Formula (iii), PCBBiF represented by Structural Formula (iv), and 3-(benzothiazol-2-yl)-7-diethylaminocoumarin, (trivial name: coumarin 6) represented by Structural Formula (vii) were co-evaporated to a thickness of 40 nm over the hole-transport layer 112 to form the light-emitting layer 113. The weight ratio was 0.8:0.2:0.0075 (=4,6mCzP2Pm:PCBBiF:coumarin 6).

Then, the electron-transport layer 114 was formed over the light-emitting layer 113 in such a way that a 10 nm thick film of 4,6mCzP2Pm was formed and a 15 nm thick film of bathophenanthroline (abbreviation: BPhen) represented by Structural Formula (vi) was formed.

After the formation of the electron-transport layer 114, lithium fluoride (LiF) was deposited by evaporation to a thickness of 1 nm, so that the electron-injection layer 115 was formed. Lastly, aluminum was deposited by evaporation to a thickness of 200 nm to form the second electrode 102 functioning as a cathode. Thus, the light-emitting element 2 in this example was fabricated.

Note that in all the above evaporation steps, evaporation was performed by a resistance-heating method.

(Method for Fabricating Comparative Light-Emitting Element 2)

The light-emitting layer 113 of the comparative light-emitting element 2 was formed in such a way that 4,6mCzP2Pm and coumarin 6 were co-evaporated to a thickness of 40 nm with a weight ratio of 1:0.005 (=4,6mCzP2Pm: coumarin 6). Materials and structures of the other components are the same as those of the light-emitting element 2. That is, the comparative light-emitting element 2 can be regarded as the light-emitting element 2 that does not use the second organic compound.

Each of the light-emitting element 2 and the comparative light-emitting element 2 was sealed using a glass substrate in a glove box containing a nitrogen atmosphere so as not to be exposed to the air (specifically, a sealing material was applied onto an outer edge of the element, and at the time of sealing, first, UV treatment was performed and then heat treatment was performed at 80° C. for 1 hour). Then, initial characteristics of these light-emitting elements were measured. Note that the measurement was carried out at room temperature (in an atmosphere kept at 25° C.).

Figure 20:
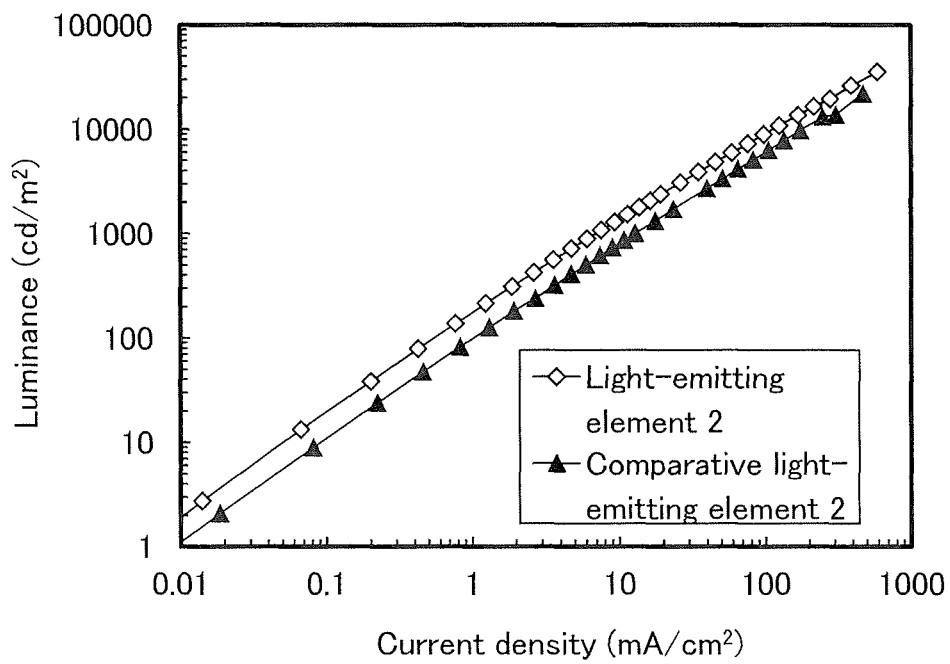
FIG. 20 shows luminance-current density characteristics of a light-emitting element 2 and a comparative light-emitting element 2.
Figure 21:
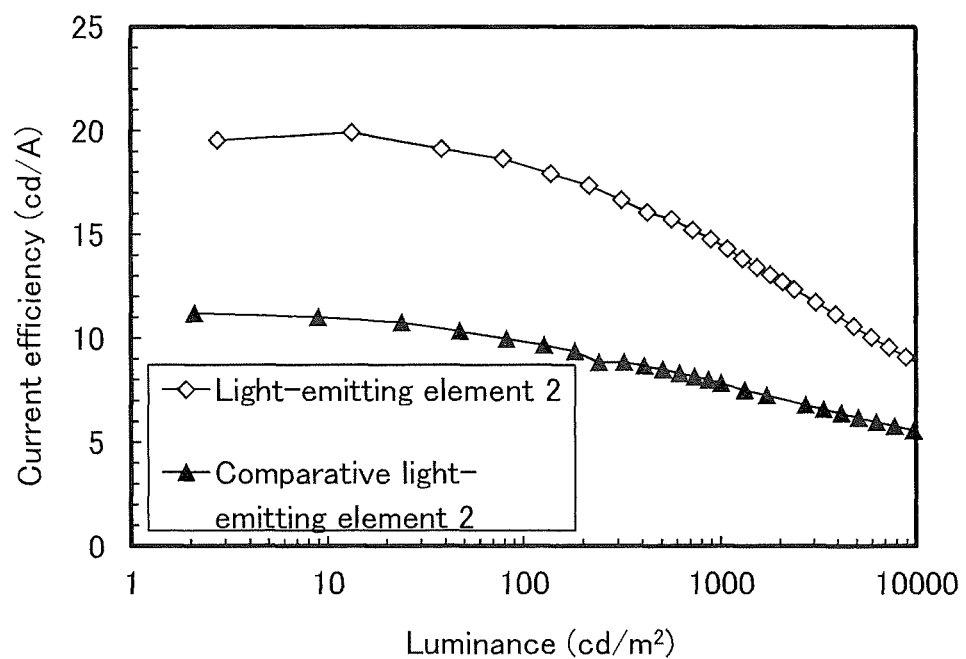
FIG. 21 shows current efficiency-luminance characteristics of the light-emitting element 2 and the comparative light-emitting element 2.
Figure 22:
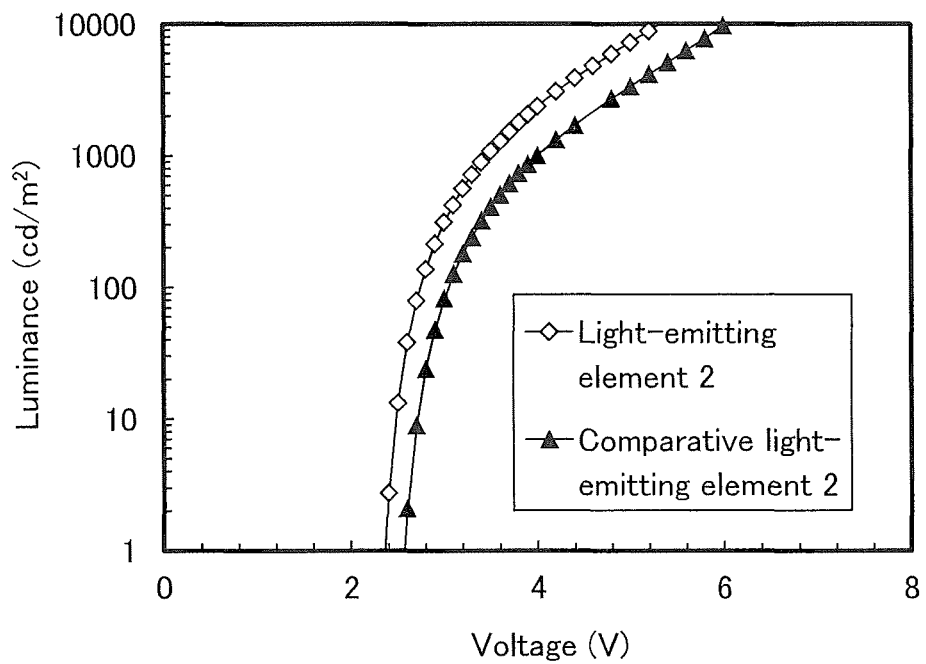
FIG. 22 shows luminance-voltage characteristics of the light-emitting element 2 and the comparative light-emitting element 2.
Figure 23:
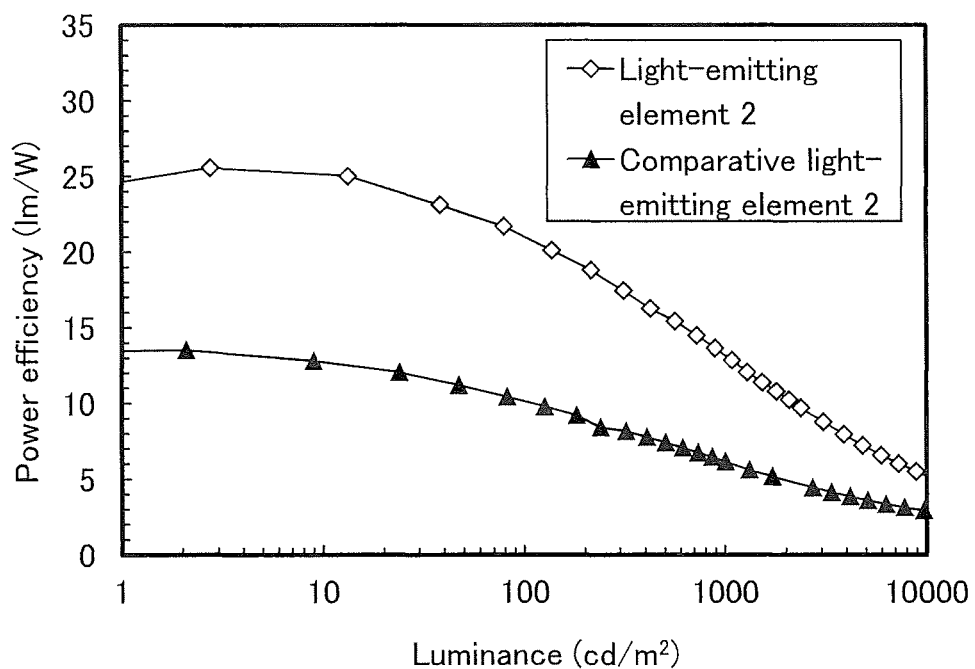
FIG. 23 shows power efficiency-luminance characteristics of the light-emitting element 2 and the comparative light-emitting element 2.
Figure 24:
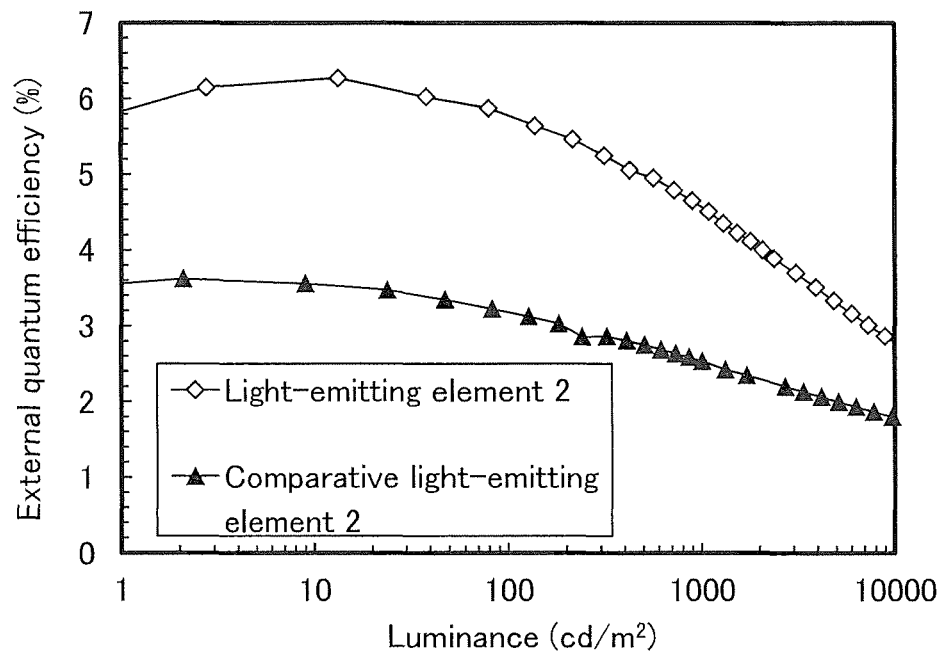
FIG. 24 shows external quantum efficiency-luminance characteristics of the light-emitting element 2 and the comparative light-emitting element 2.
Figure 25:
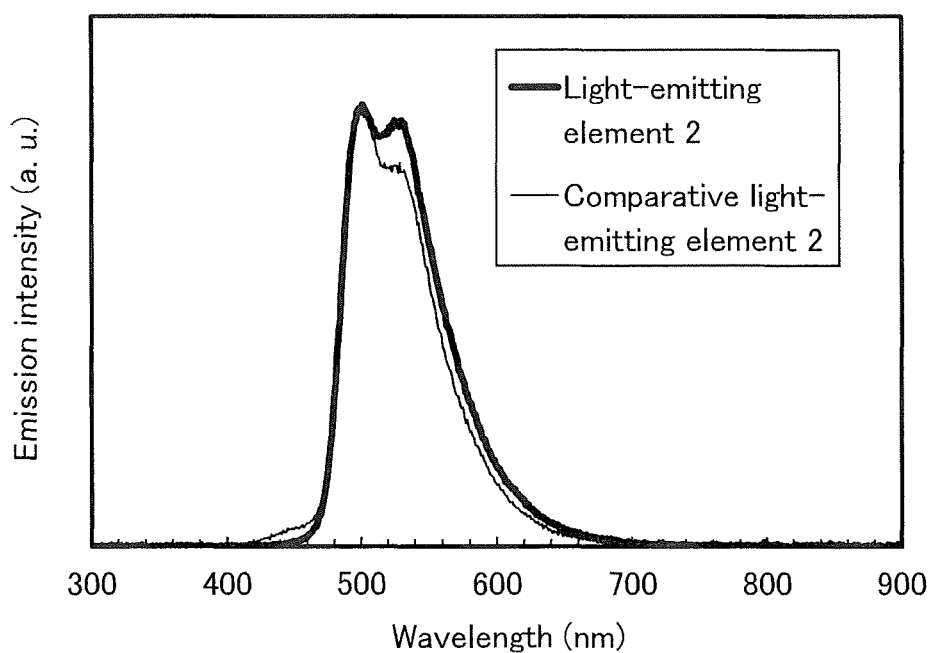
FIG. 25 shows emission spectra of the light-emitting element 2 and the comparative light-emitting element 2.

FIG. 20 shows current density-luminance characteristics of the light-emitting element 2 and the comparative light-emitting element 2; FIG. 21 shows luminance-current efficiency characteristics thereof; FIG. 22 shows voltage-luminance characteristics thereof; FIG. 23 shows luminance-power efficiency characteristics thereof; FIG. 24 shows luminance-external quantum efficiency characteristics thereof; and FIG. 25 shows an emission spectrum thereof.

Table 2 shows values of major characteristics of the light-emitting element 2 and the comparative light-emitting element 2 at approximately 1000 cd/m².

TABLE 2

| | Voltage (V) | Current (mA) | Current density (mA/cm²) | Chromaticity x | Chromaticity y | Current efficiency (cd/A) | Power efficiency (lm/W) | External quantum efficiency (%) |
|---|---|---|---|---|---|---|---|---|
| Light-emitting element 2 | 3.5 | 0.30 | 7.6 | 0.28 | 0.60 | 14.3 | 12.9 | 4.5 |

TABLE 2-continued

|  | Voltage (V) | Current (mA) | Current density (mA/cm$^2$) | Chromaticity x | Chromaticity y | Current efficiency (cd/A) | Power efficiency (lm/W) | External quantum efficiency (%) |
|---|---|---|---|---|---|---|---|---|
| Comparative light-emitting element 2 | 3.9 | 0.43 | 10.8 | 0.26 | 0.58 | 8.0 | 6.4 | 2.6 |

The above results show that the light-emitting element 2 that uses PCBBiF, which is an arylamine that includes both a group including a p-biphenyl skeleton and a fluoren-2-yl skeleton, as the second organic compound has more favorable characteristics than the comparative light-emitting element 2 that does not contain the second organic compound. Specifically, in the light-emitting element 2, the current efficiency, power efficiency, and external quantum efficiency were improved and the driving voltage was decreased.

FIG. 24 shows that the external quantum efficiency of the light-emitting element 2 exceeds 6%. The reason for this extremely favorable characteristic is because the first and second organic compounds form an exciplex and energy of the exciplex transfers to coumarin 6 efficiently. In addition, the high emission efficiency of 6% or higher indicates that reverse intersystem crossing of triplet excitation energy from a triplet excited level to a singlet excited level occurs in the exciplex and singlet excitation energy generated at this time contributes to light emission of coumarin 6.

Figure 26:
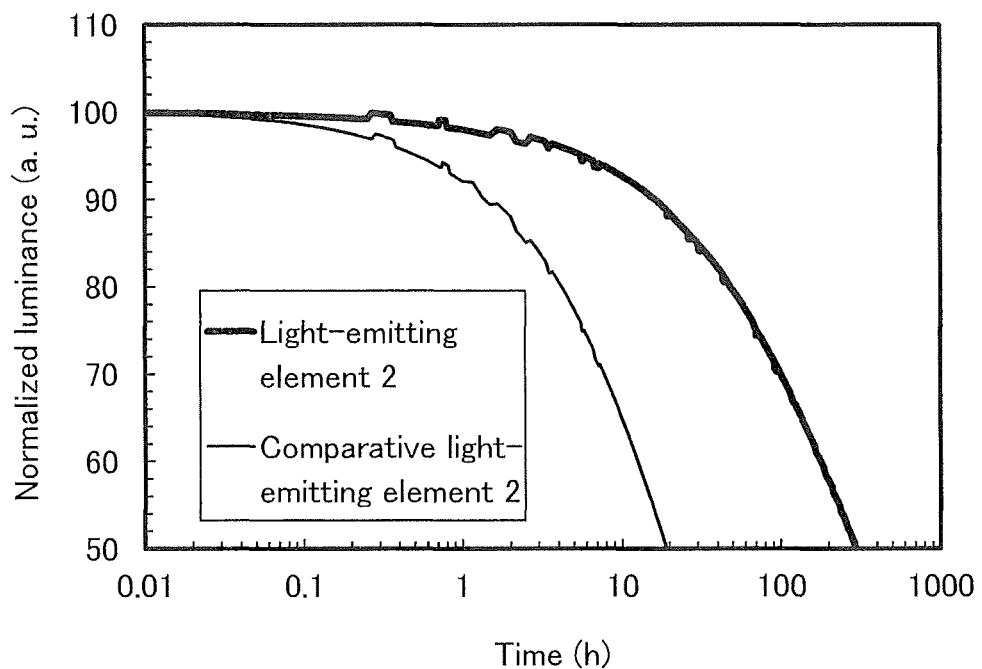
FIG. 26 shows time dependences of normalized luminances of the light-emitting element 2 and the comparative light-emitting element 2.

A reliability test was carried out, and the results thereof are shown in FIG. 26. In the reliability test, each of the light-emitting element 2 and the comparative light-emitting element 2 was driven under the conditions where the initial luminance was set to 1000 cd/m$^2$ and the current density was constant. FIG. 26 shows a change in normalized luminance where the initial luminance is 1. The results show that a decrease in luminance over driving time of the light-emitting element 2 is small as compared with the comparative light-emitting element 2, and thus the light-emitting element 2 has favorable reliability.

Example 3

In this example, a light-emitting element of one embodiment of the present invention (a light-emitting element 3) and a comparative light-emitting element 3 will be described. In the light-emitting layer 113 of the light-emitting element 3, N-(1,1'-biphenyl-4-yl)-9,9-dimethyl-N-[4-(9-phenyl-9H-carbazol-3-yl)phenyl]-9H-fluor en-2-amine (abbreviation: PCBBiF), which is an arylamine that includes both a group including a p-biphenyl skeleton and a fluoren-2-yl skeleton, is used as the second organic compound, and {2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (trivial name: DCJTB) is used as a light-emitting substance. The light-emitting layer 113 of the comparative light-emitting element 3 does not use the second organic compound, and includes only the first organic compound and DCJTB serving as a light-emitting substance. In each of the light-emitting element 3 and the comparative light-emitting element 3, 4,6mCzP2Pm is used as the first organic compound. Chemical formulae of materials used in this example are shown below.

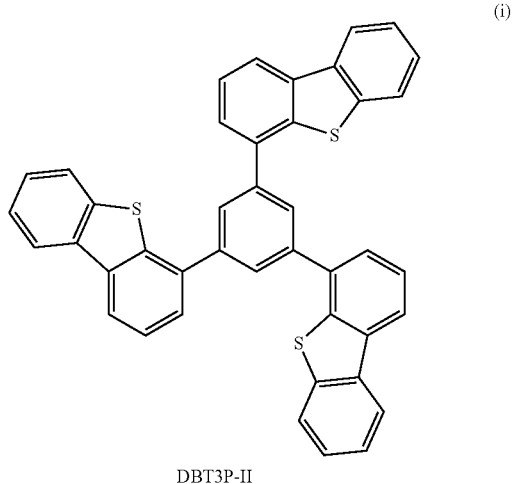

DBT3P-II (i)

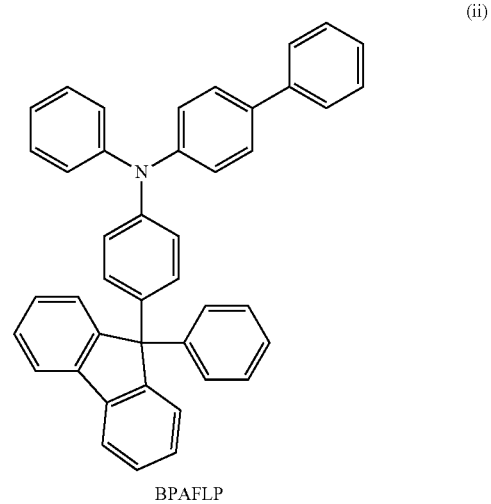

BPAFLP (ii)

(iii)

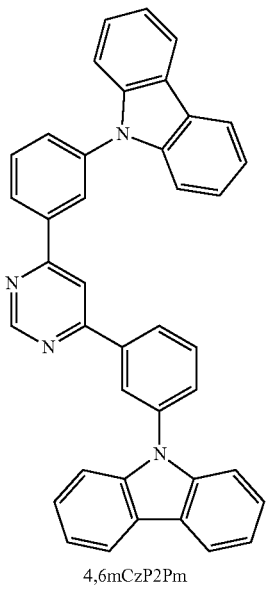

4,6mCzP2Pm (iv)

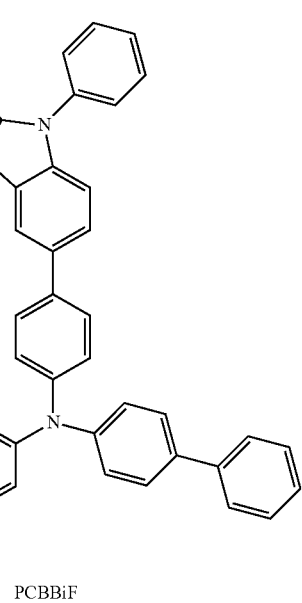

PCBBiF (viii)

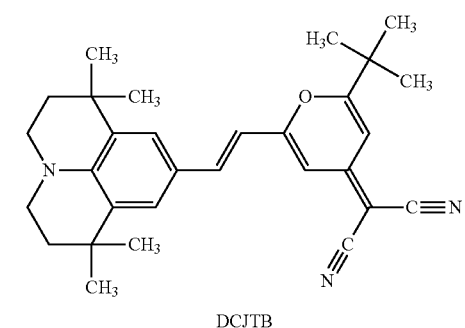

DCJTB (vi)

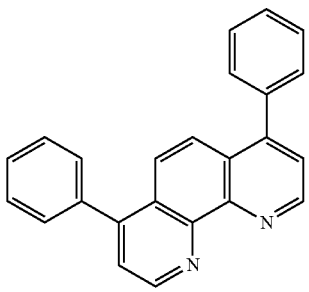

BPhen

Methods for fabricating the light-emitting element 3 and the comparative light-emitting element 3 will be described below.

(Method for Fabricating Light-Emitting Element 3)

First, a film of indium tin oxide containing silicon oxide (ITSO) was formed over a glass substrate by a sputtering method, so that the first electrode 101 was formed. The thickness thereof was 110 nm and the electrode area was 2 mm×2 mm. Here, the first electrode 101 is an electrode that functions as an anode of the light-emitting element.

Next, as pretreatment for forming the light-emitting element over the substrate, UV ozone treatment was performed for 370 seconds after washing of a surface of the substrate with water and baking that was performed at 200° C. for 1 hour.

After that, the substrate was transferred into a vacuum evaporation apparatus where the pressure had been reduced to approximately $10^{-4}$ Pa, and was subjected to vacuum baking at 170° C. for 30 minutes in a heating chamber of the vacuum evaporation apparatus, and then the substrate was cooled down for approximately 30 minutes.

Then, the substrate over which the first electrode 101 was formed was fixed to a substrate holder provided in the vacuum evaporation apparatus so that the surface on which the first electrode 101 was formed faced downward. The pressure in the vacuum evaporation apparatus was reduced to approximately $10^{-4}$ Pa. After that, over the first electrode 101, 4,4',4"-(benzene-1,3,5-triyl)tri(dibenzothiophene) (abbreviation: DBT3P-II) represented by Structural Formula (i) and molybdenum(VI) oxide were deposited by co-evaporation by an evaporation method using resistance heating, so that the hole-injection layer 111 was formed. The thickness of the hole-injection layer 111 was set to 20 nm, and the weight ratio of DBT3P-II to molybdenum oxide was adjusted to 4:2. Note that the co-evaporation method refers to an evaporation method in which evaporation is carried out from a plurality of evaporation sources at the same time in one treatment chamber.

Next, a film of 4-phenyl-4'-(9-phenylfluoren-9-yl)triphenylamine (abbreviation: BPAFLP) which is represented by Structural Formula (ii) was formed to a thickness of 20 nm over the hole-injection layer 111 to form the hole-transport layer 112.

Then, 4,6mCzP2Pm represented by Structural Formula (iii), PCBBiF represented by Structural Formula (iv), and {2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (trivial name: DCJTB) by Structural Formula (viii) were co-evaporated to a thickness of 40 nm over the hole-transport layer 112 to form the light-emitting layer 113. The weight ratio was 0.8:0.2:0.005 (=4,6mCzP2Pm:PCBBiF:DCJTB).

Then, the electron-transport layer 114 was formed over the light-emitting layer 113 in such a way that a 10 nm thick film of 4,6mCzP2Pm was formed and a 15 nm thick film of bathophenanthroline (abbreviation: BPhen) represented by Structural Formula (vi) was formed.

After the formation of the electron-transport layer 114, lithium fluoride (LiF) was deposited by evaporation to a thickness of 1 nm, so that the electron-injection layer 115 was formed. Lastly, aluminum was deposited by evaporation to a thickness of 200 nm to form the second electrode 102 functioning as a cathode. Thus, the light-emitting element 3 in this example was fabricated.

Note that in all the above evaporation steps, evaporation was performed by a resistance-heating method.

(Method for Fabricating Comparative Light-emitting Element 3)

The light-emitting layer 113 of the comparative light-emitting element 3 was formed in such a way that 4,6mCzP2Pm and DCJTB were co-evaporated to a thickness of 40 nm with a weight ratio of 1:0.005 (=4,6mCzP2Pm: DCJTB). Materials and structures of the other components are the same as those of the light-emitting element 3. That is, the comparative light-emitting element 3 can be regarded as the light-emitting element 3 that does not use the second organic compound.

Each of the light-emitting element 3 and the comparative light-emitting element 3 was sealed using a glass substrate in a glove box containing a nitrogen atmosphere so as not to be exposed to the air (specifically, a sealing material was applied onto an outer edge of the element, and at the time of sealing, first, UV treatment was performed and then heat treatment was performed at 80° C. for 1 hour). Then, initial characteristics of these light-emitting elements were measured. Note that the measurement was carried out at room temperature (in an atmosphere kept at 25° C.).

Figure 27:
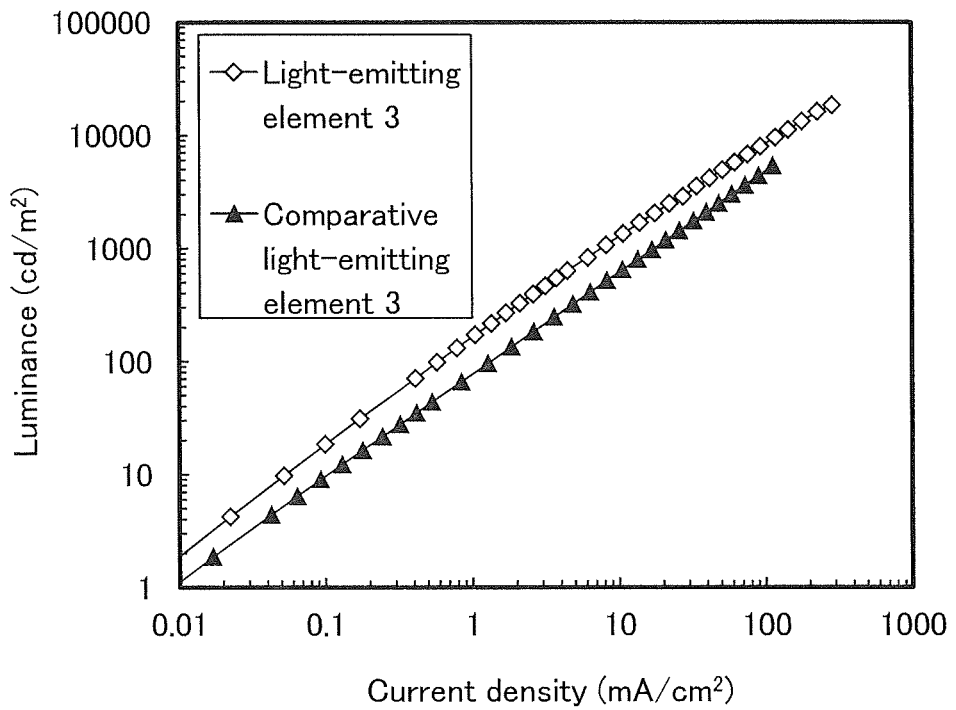
FIG. 27 shows luminance-current density characteristics of a light-emitting element 3 and a comparative light-emitting element 3.
Figure 28:
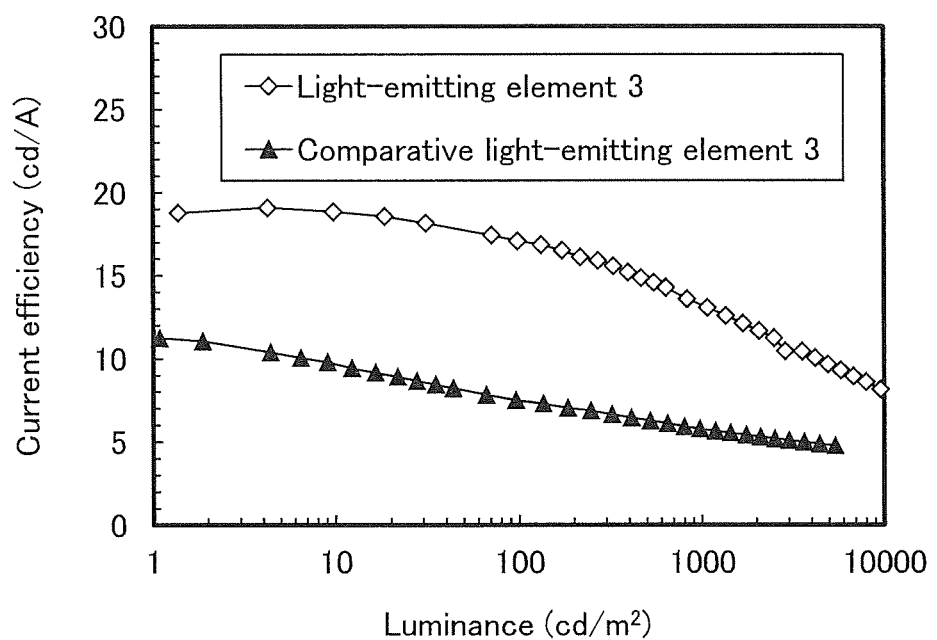
FIG. 28 shows current efficiency-luminance characteristics of the light-emitting element 3 and the comparative light-emitting element 3.
Figure 29:
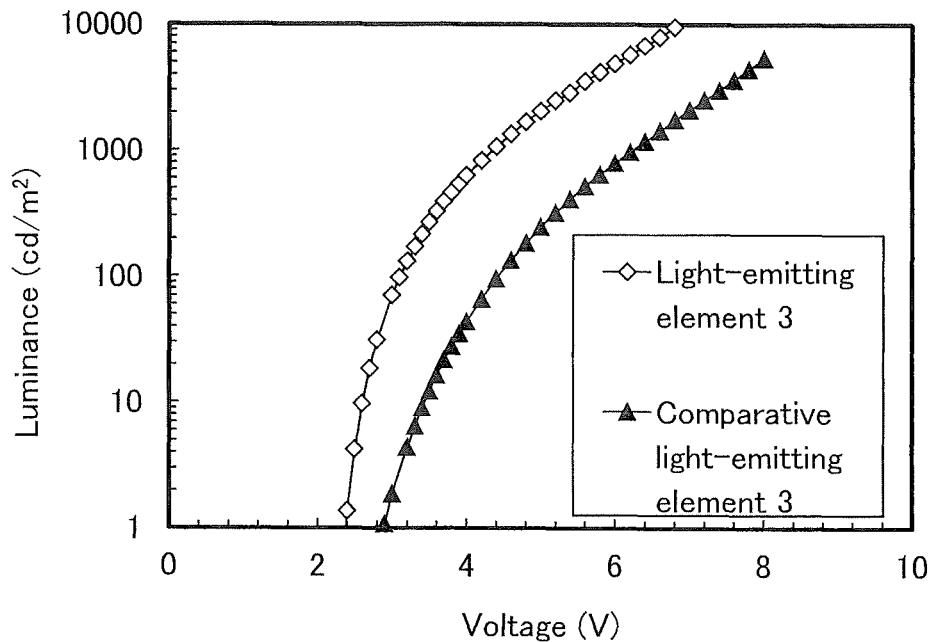
FIG. 29 shows luminance-voltage characteristics of the light-emitting element 3 and the comparative light-emitting element 3.
Figure 30:
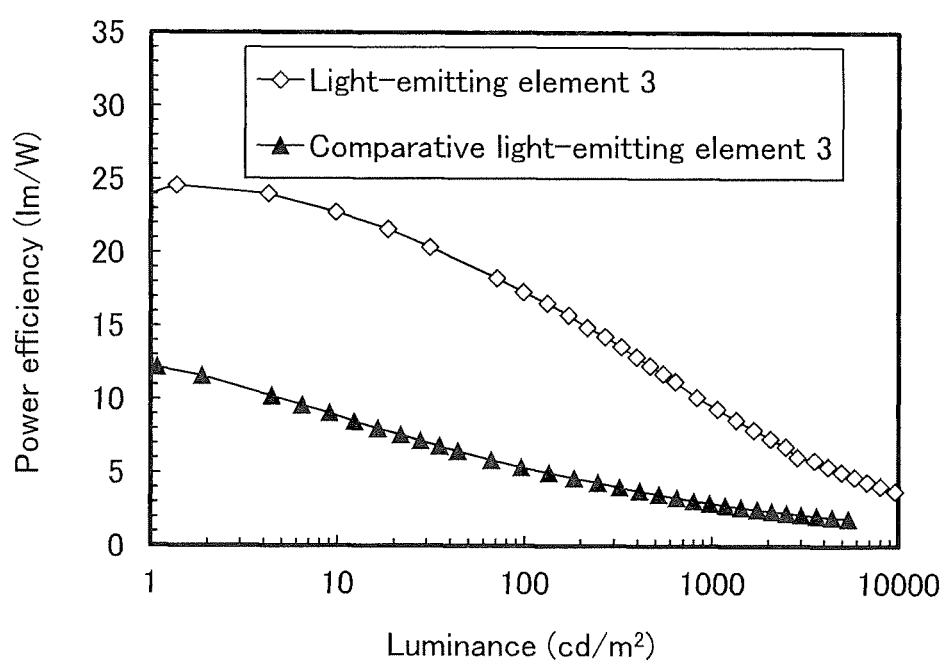
FIG. 30 shows power efficiency-luminance characteristics of the light-emitting element 3 and the comparative light-emitting element 3.
Figure 31:
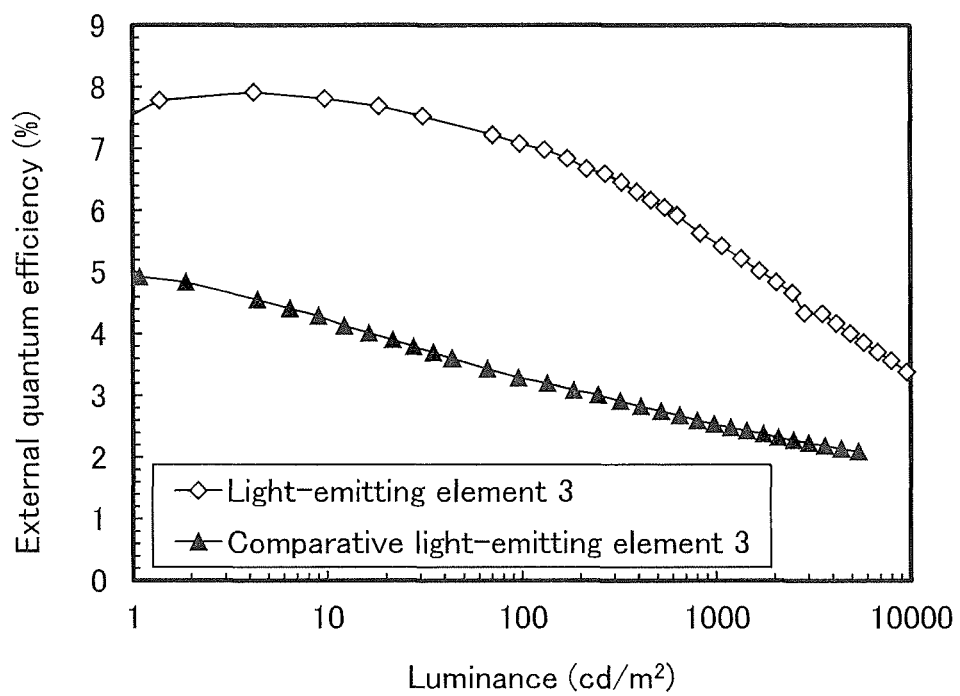
FIG. 31 shows external quantum efficiency-luminance characteristics of the light-emitting element 3 and the comparative light-emitting element 3.
Figure 32:
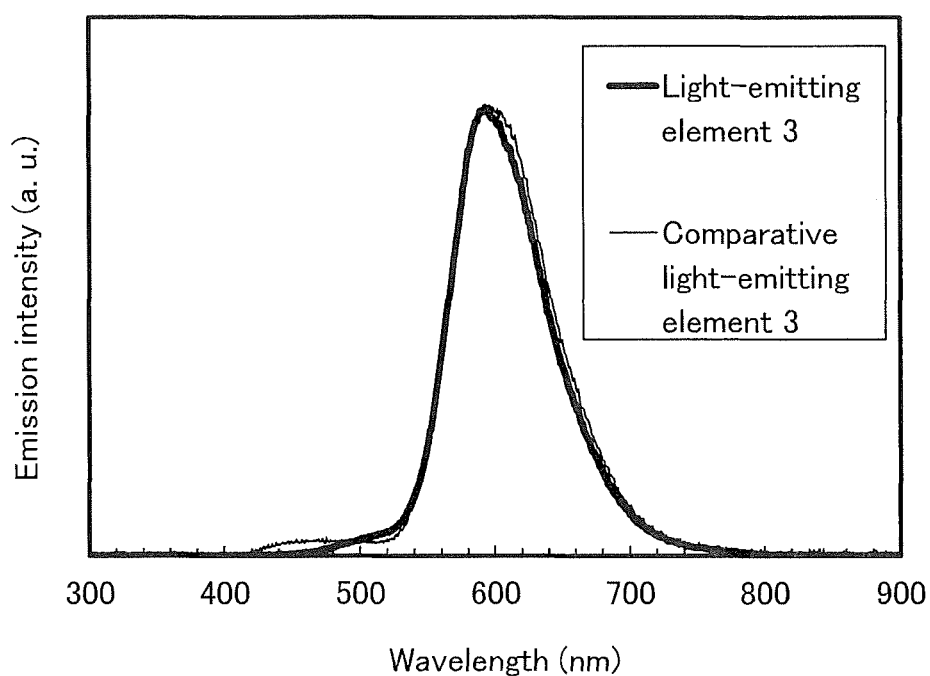
FIG. 32 shows emission spectra of the light-emitting element 3 and the comparative light-emitting element 3.

FIG. 27 shows current density-luminance characteristics of the light-emitting element 3 and the comparative light-emitting element 3; FIG. 28 shows luminance-current efficiency characteristics thereof; FIG. 29 shows voltage-luminance characteristics thereof; FIG. 30 shows luminance-power efficiency characteristics thereof; FIG. 31 shows luminance-external quantum efficiency characteristics thereof; and FIG. 32 shows emission spectra thereof.

Table 3 shows values of major characteristics of the light-emitting element 3 and the comparative light-emitting element 3 at approximately 1000 cd/m$^2$.

FIG. 31 shows that the external quantum efficiency of the light-emitting element 3 is close to 8%. The reason for this extremely favorable characteristic is because the first and second organic compounds form an exciplex and energy of the exciplex transfers to DCJTB efficiently. In addition, the high emission efficiency close to 8% indicates that reverse intersystem crossing of triplet excitation energy from a triplet excited level to a singlet excited level occurs in the exciplex and singlet excitation energy generated at this time contributes to light emission of DCJTB.

Figure 33:
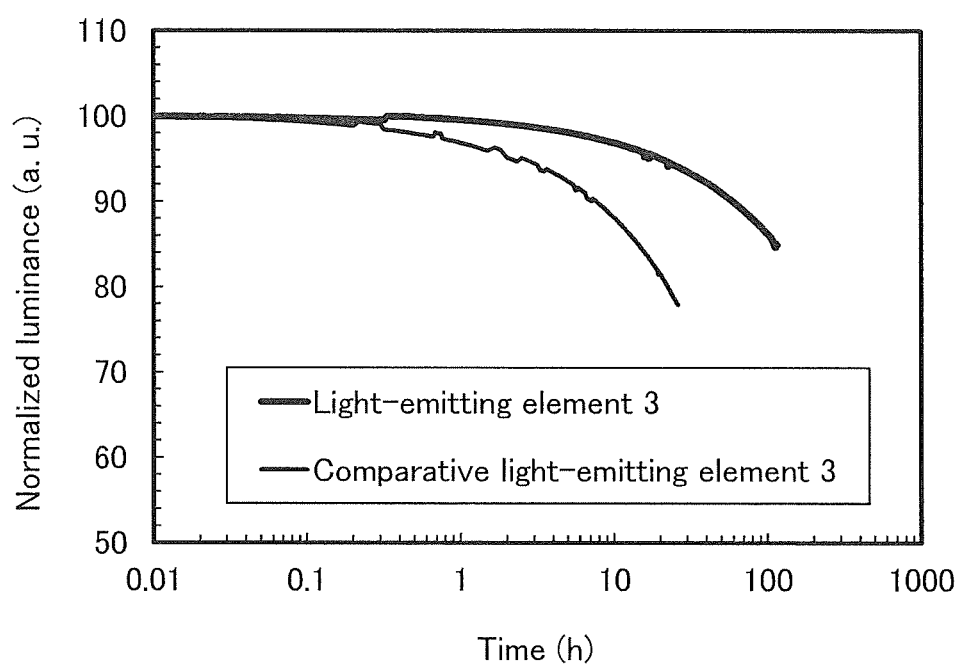
FIG. 33 shows time dependences of normalized luminances of the light-emitting element 3 and the comparative light-emitting element 3.

A reliability test was carried out, and the results thereof are shown in FIG. 33. In the reliability test, each of the light-emitting element 3 and the comparative light-emitting element 3 was driven under the conditions where the initial luminance was set to 1000 cd/m$^2$ and the current density was constant. FIG. 33 shows a change in normalized luminance where the initial luminance is 1. The results show that a decrease in luminance over driving time of the light-emitting element 3 is small as compared with the comparative light-emitting element 3, and thus the light-emitting element 3 has favorable reliability.

Reference Example 1

In this reference example, a method for synthesizing N-(1,1'-biphenyl-4-yl)-9,9-dimethyl-N-[4-(9-phenyl-9H-carbazol-3-yl)phenyl]-9H-fluor en-2-amine (abbreviation: PCBBiF) used in Examples will be described.

Step 1: Synthesis of N-(1,1'-Biphenyl-4-yl)-9,9-dimethyl-N-phenyl-9H-fluoren-2-amine Into a 1-L three-neck flask were put 45 g (0.13 mol) of N-(1,1'-biphenyl-4-yl)-9,9-dimethyl-9H-fluoren-2-amine, 36 g (0.38 mol) of sodium tert-butoxide, 21 g (0.13 mol) of bromobenzene, and 500 mL of toluene. This mixture was degassed by being stirred under reduced pressure. After the degassing, the atmosphere in the flask was replaced with nitrogen. After that, 0.8 g (1.4 mmol) of bis(dibenzylideneacetone)palladium(0) and 12 mL (5.9 mmol) of tri(tert-butyl)phosphine (a 10 wt % hexane solution) were added thereto. The synthesis scheme of Step 1 is shown below.

TABLE 3

| | Voltage (V) | Current (mA) | Current density (mA/cm$^2$) | Chromaticity x | Chromaticity y | Current efficiency (cd/A) | Power efficiency (lm/W) | External quantum efficiency (%) |
|---|---|---|---|---|---|---|---|---|
| Light-emitting element 3 | 4.4 | 0.33 | 8.2 | 0.57 | 0.43 | 13.1 | 9.3 | 5.4 |
| Comparative light-emitting element 3 | 6.2 | 0.67 | 16.8 | 0.56 | 0.41 | 5.8 | 2.9 | 2.5 |

The above results show that the light-emitting element 3 that uses PCBBiF, which is an arylamine that includes both a group including a p-biphenyl skeleton and a fluoren-2-yl skeleton, as the second organic compound has more favorable characteristics than the comparative light-emitting element 3 that does not contain the second organic compound. Specifically, in the light-emitting element 3, the current efficiency, power efficiency, and external quantum efficiency were improved and the driving voltage was decreased.

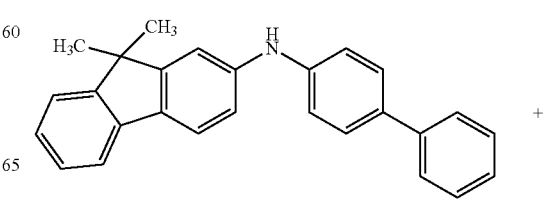

-continued

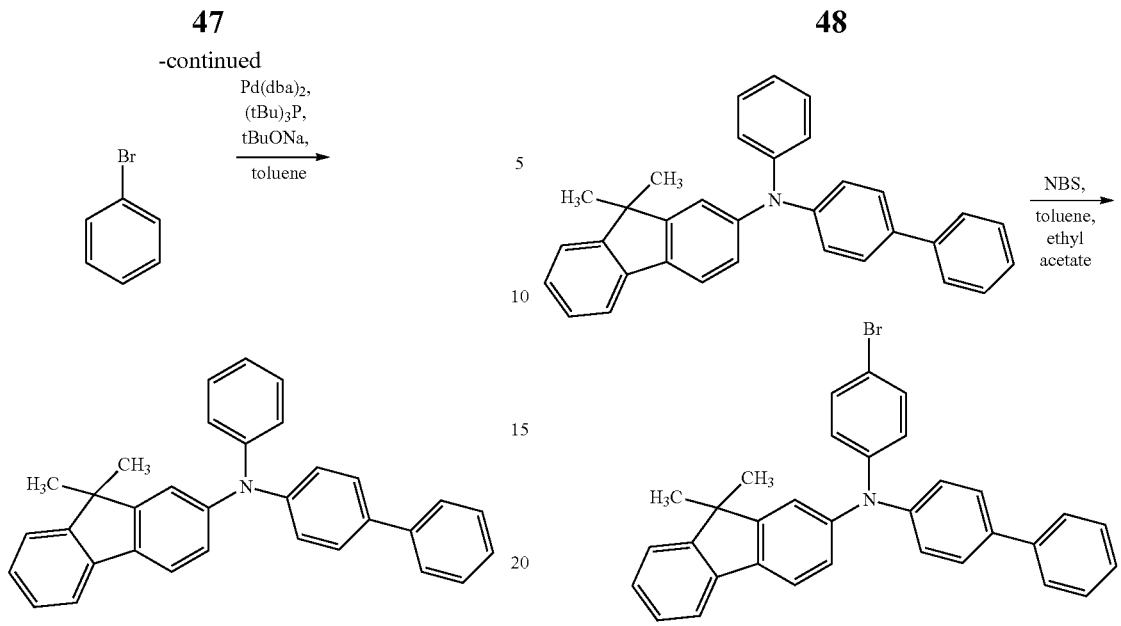

This mixture was stirred under a nitrogen stream at 90° C. for two hours. The mixture was cooled to room temperature, and a solid was separated by suction filtration. The obtained filtrate was concentrated to give approximately 200 mL of a brown solution. The brown solution was mixed with toluene, and the resulting solution was purified using Celite (manufactured by Wako Pure Chemical Industries, Ltd., Catalog No. 531-16855 (the same applies to Celite in the following description and the description is not repeated)), alumina, Florisil (manufactured by Wako Pure Chemical Industries, Ltd., Catalog No. 540-00135 (the same applies to Florisil in the following description and the description is not repeated)). The obtained filtrate was concentrated to give a light yellow solution. The light yellow solution was recrystallized from hexane to give 52 g of target light yellow powder in a yield of 95%.

Step 2: Synthesis of N-(1,1'-Biphenyl-4-yl)-N-(4-bromophenyl)-9,9-dimethyl-9H-fluoren-2-amine In a 1-L Erlenmeyer flask was placed 45 g (0.10 mol) of N-(1,1'-biphenyl-4-yl)-9,9-dimethyl-N-phenyl-9H-fluoren-2-amine, which was dissolved in 225 mL of toluene by stirring while being heated. After the solution was naturally cooled to room temperature, 225 mL of ethyl acetate and 18 g (0.10 mol) of N-bromosuccinimide (abbreviation: NBS) were added, and the mixture was stirred at room temperature for 2.5 hours. After the stirring, the mixture was washed three times with a saturated aqueous solution of sodium hydrogen carbonate and once with a saturated aqueous solution of sodium chloride. Magnesium sulfate was added to the resulting organic layer, and the mixture was left still for 2 hours for drying. The mixture was subjected to gravity filtration to remove magnesium sulfate, and the resulting filtrate was concentrated to give a yellow solution. The yellow solution was mixed with toluene, and the solution was purified using Celite, alumina, and Florisil. The resulting solution was concentrated to give a light yellow solid. The light yellow solid was recrystallized from toluene/ethanol to give 47 g of target white powder in a yield of 89%. A synthesis scheme of Step 2 is shown below.

Step 3: Synthesis of PCBBiF

In a 1-L three-neck flask were placed 41 g (80 mmol) of N-(1,1'-biphenyl-4-yl)-N-(4-bromophenyl)-9,9-dimethyl-9H-fluoren-2-amine and 25 g (88 mmol) of 9-phenyl-9H-carbazol-3-ylboronic acid, to which 240 mL of toluene, 80 mL of ethanol, and 120 mL of an aqueous solution of potassium carbonate (2.0 mol/L) were added. The mixture was degassed by being stirred while the pressure was being reduced, and after the degassing, the atmosphere in the flask was replaced with nitrogen. Further, 27 mg (0.12 mmol) of palladium(II) acetate and 154 mg (0.5 mmol) of tri(ortho-tolyl)phosphine were added. The mixture was degassed again by being stirred while the pressure was being reduced, and after the degassing, the atmosphere in the flask was replaced with nitrogen. The mixture was stirred at 110° C. under a nitrogen stream for 1.5 hours. A synthesis scheme of Step 3 is shown below.

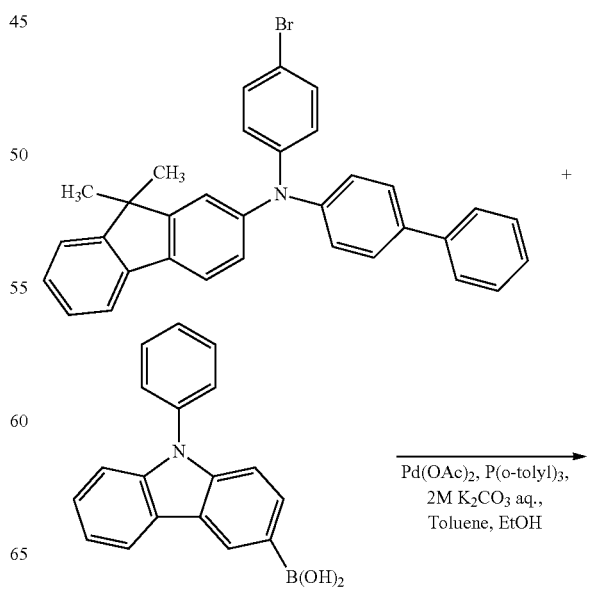

-continued

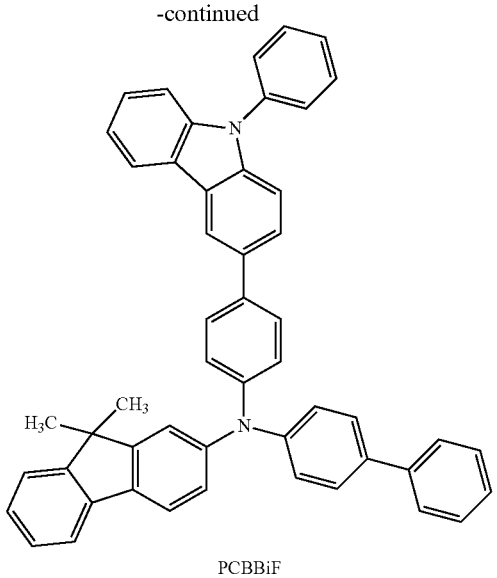

PCBBiF

After the mixture was naturally cooled to room temperature while being stirred, the aqueous layer of the mixture was extracted twice with toluene. The resulting solution of the extract and the organic layer were combined and washed twice with water and twice with a saturated aqueous solution of sodium chloride. Magnesium sulfate was added to the solution, and the mixture was left still for drying. The mixture was subjected to gravity filtration to remove magnesium sulfate, and the resulting filtrate was concentrated to give a brown solution. The brown solution was mixed with toluene, and the resulting solution was purified using Celite, alumina, and Florisil. The resulting filtrate was concentrated to give a light yellow solid. The light yellow solid was recrystallized from ethyl acetate/ethanol to give 46 g of target light yellow powder in a yield of 88%.

By a train sublimation method, 38 g of the obtained light yellow powder was purified by sublimation. In the sublimation purification, the light yellow powder was heated at 345° C. under a pressure of 3.7 Pa with an argon flow rate of 15 mL/min. After the sublimation purification, 31 g of a target light yellow solid was obtained at a collection rate of 83%.

This compound was identified as N-(1,1'-biphenyl-4-yl)-9,9-dimethyl-N-[4-(9-phenyl-9H-carbazol-3-yl)phenyl]-9H-fluoren-2-amine (abbreviation: PCBBiF), which was the target of the synthesis, by nuclear magnetic resonance (NMR) spectroscopy.

$^1$H NMR data of the obtained light yellow solid are shown below.

$^1$H NMR (CDCl$_3$, 500 MHz): δ=1.45 (s, 6H), 7.18 (d, J=8.0 Hz, 1H), 7.27-7.32 (m, 8H), 7.40-7.50 (m, 7H), 7.52-7.53 (m, 2H), 7.59-7.68 (m, 12H), 8.19 (d, J=8.0 Hz, 1H), 8.36 (d, J=1.1 Hz, 1H).

This application is based on Japanese Patent Application serial no. 2013-093322 filed with Japan Patent Office on Apr. 26, 2013, the entire contents of which are hereby incorporated by reference.

What is claimed is:

1. A light-emitting device comprising:
a light-emitting layer between a pair of electrodes, the light-emitting layer comprising a fluorescent substance, a first organic compound, and a second organic compound,
wherein:
a HOMO level and LUMO level of the first organic compound are deeper than a HOMO level and LUMO level of the second organic compound,
the second organic compound is represented by formula (G1):

(G1)

Ar$^1$ represents any one of a substituted or unsubstituted p-biphenyl group, a substituted or unsubstituted fluorenyl group, and a substituted or unsubstituted 4-(9-phenyl-9H-carbazol-3-yl)phenyl group;
Ar$^2$ and Ar$^3$ each independently represent an aryl group having 6 to 50 carbon atoms or a heteroaryl group having 1 to 50 carbon atoms; and
light emission emitted from the light-emitting device includes a delayed fluorescence.

2. The light-emitting device according to claim 1, wherein the substituted or unsubstituted fluorenyl group is a substituted or unsubstituted fluoren-2-yl group.

3. The light-emitting device according to claim 1, wherein the second organic compound does not comprise a naphthalene skeleton.

4. The light-emitting device according to claim 1, wherein:
the first organic compound and the second organic compound form an exciplex; and
an emission spectrum of the exciplex formed by the first organic compound and the second organic compound overlaps with an absorption band on the longest wavelength side of the fluorescent substance.

5. An electronic device comprising the light-emitting device according to claim 1.

6. A lighting device comprising the light-emitting device according to claim 1.

7. A light-emitting device comprising:
a light-emitting layer between a pair of electrodes, the light-emitting layer comprising a fluorescent substance, a first organic compound, and a second organic compound,
wherein:
a HOMO level and LUMO level of the first organic compound are deeper than a HOMO level and LUMO level of the second organic compound,
the second organic compound is represented by formula (G1):

(G1)

Ar$^1$ and Ar$^2$ each independently represent any one of a substituted or unsubstituted p-biphenyl group, a substituted or unsubstituted fluorenyl group, a substituted or unsubstituted spirofluorenyl group, and a substituted or unsubstituted 4-(9-phenyl-9H-carbazol-3-yl)phenyl group;
Ar$^3$ represents an aryl group having 6 to 50 carbon atoms or a heteroaryl group having 1 to 50 carbon atoms; and light emission emitted from the light-emitting device includes a delayed fluorescence.

8. The light-emitting device according to claim 7, wherein the substituted or unsubstituted fluorenyl group is a substituted or unsubstituted fluoren-2-yl group.

9. The light-emitting device according to claim 7, wherein the second organic compound does not comprise a naphthalene skeleton.

10. The light-emitting device according to claim 7, wherein:

the first organic compound and the second organic compound form an exciplex; and an emission spectrum of the exciplex formed by the first organic compound and the second organic compound overlaps with an absorption band on the longest wavelength side of the fluorescent substance.

11. An electronic device comprising the light-emitting device according to claim 7.

12. A lighting device comprising the light-emitting device according to claim 7.

13. A light-emitting device comprising:

a light-emitting layer between a pair of electrodes, the light-emitting layer comprising a fluorescent substance, a first organic compound, and a second organic compound, wherein:

a HOMO level and LUMO level of the first organic compound are deeper than a HOMO level and LUMO level of the second organic compound, the second organic compound is represented by formula (100);

(100)

and light emission emitted from the light-emitting device includes a delayed fluorescence.

14. The light-emitting device according to claim 13, wherein the first organic compound and the second organic compound form an exciplex.

15. An electronic device comprising the light-emitting device according to claim 13.

16. A lighting device comprising the light-emitting device according to claim 13.

\* \* \* \* \*